(12) United States Patent
Nagasaka

(10) Patent No.: US 9,910,369 B2
(45) Date of Patent: Mar. 6, 2018

(54) EXPOSURE APPARATUS, EXPOSURE METHOD, AND DEVICE PRODUCING METHOD

(71) Applicant: NIKON CORPORATION, Tokyo (JP)

(72) Inventor: Hiroyuki Nagasaka, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/450,611

(22) Filed: Mar. 6, 2017

(65) Prior Publication Data

US 2017/0176874 A1 Jun. 22, 2017

Related U.S. Application Data

(62) Division of application No. 13/317,170, filed on Oct. 12, 2011, now Pat. No. 9,588,436, which is a division
(Continued)

(30) Foreign Application Priority Data

Jan. 5, 2004 (JP) .................................. 2004-000236

(51) Int. Cl.
*G03B 27/42* (2006.01)
*G03F 7/20* (2006.01)

(52) U.S. Cl.
CPC ...... *G03F 7/70866* (2013.01); *G03F 7/70341* (2013.01)

(58) Field of Classification Search
CPC ............... G03F 7/2041; G03F 7/70341; G03F 7/70725; G03F 7/70866
(Continued)

(56) References Cited

U.S. PATENT DOCUMENTS 32,795 A 7/1861 Soule
4,346,164 A 8/1982 Tabarelli et al.
(Continued)

FOREIGN PATENT DOCUMENTS

DE 221 563 A1 4/1985
DE 224 448 A1 7/1985
(Continued)

OTHER PUBLICATIONS

Feb. 17, 2017 Office Action issued in Taiwanese Patient Application No. 105112403.
(Continued)

*Primary Examiner* — Peter B Kim
(74) *Attorney, Agent, or Firm* — Oliff PLC

(57) ABSTRACT

A liquid immersion exposure apparatus includes a liquid-immersion-area-forming-member having an opening through which an exposure light is projected, the-liquid-immersion-area-forming-member having a first liquid supply inlet facing downward, a second liquid supply inlet provided opposite to an outer surface of the final optical element, and a first removal outlet facing downward. A liquid immersion area is formed on a portion of an upper surface of a substrate while performing a liquid supply via the first liquid supply inlet to a gap between the liquid-immersion-area-forming-member and the upper surface of the substrate, a liquid supply via the second liquid supply inlet to a gap between the liquid-immersion-area-forming-member and a final optical element of a projection system and a liquid removal via the first removal outlet from the gap between the liquid-immersion-area-forming-member and the upper surface of the substrate.

38 Claims, 16 Drawing Sheets

Related U.S. Application Data of application No. 10/584,950, filed as application No. PCT/JP2004/019813 on Dec. 27, 2004, now Pat. No. 8,064,044.

(58) Field of Classification Search
USPC .................................................. 355/53, 30
See application file for complete search history.

(56) References Cited

U.S. PATENT DOCUMENTS

| | | |
|---|---|---|
| 4,480,910 A | 11/1984 | Takanashi et al. |
| 5,260,580 A | 11/1993 | Itoh et al. |
| 5,493,403 A | 2/1996 | Nishi |
| 5,528,118 A | 6/1996 | Lee |
| 5,610,683 A | 3/1997 | Takahashi |
| 5,623,853 A | 4/1997 | Novak et al. |
| 5,646,413 A | 7/1997 | Nishi |
| 5,699,145 A | 12/1997 | Makinouchi et al. |
| 5,715,039 A | 2/1998 | Fukuda et al. |
| 5,825,043 A | 10/1998 | Suwa |
| 5,874,820 A | 2/1999 | Lee |
| 5,969,441 A | 10/1999 | Loopstra et al. |
| 6,118,515 A | 9/2000 | Wakamoto et al. |
| 6,195,154 B1 | 2/2001 | Imai |
| 6,208,407 B1 | 3/2001 | Loopstra |
| 6,341,007 B1 | 1/2002 | Nishi et al. |
| 6,400,441 B1 | 6/2002 | Nishi et al. |
| 6,549,269 B1 | 4/2003 | Nishi et al. |
| 6,590,634 B1 | 7/2003 | Nishi et al. |
| 6,969,441 B2 | 11/2005 | Welch et al. |
| 7,495,744 B2 | 2/2009 | Nagaksaka |
| 7,515,246 B2 | 4/2009 | Nagasaka et al. |
| 8,064,044 B2 | 11/2011 | Nagasaka |
| 8,289,497 B2 | 10/2012 | Poon et al. |
| 8,934,080 B2 | 1/2015 | Poon et al. |
| 9,588,436 B2 | 3/2017 | Nagasaka |
| 2002/0041377 A1 | 4/2002 | Hagiwara et al. |
| 2002/0061469 A1 | 5/2002 | Tanaka |
| 2002/0061496 A1 | 5/2002 | Walker |
| 2002/0096196 A1 | 7/2002 | Toshima et al. |
| 2004/0114117 A1 | 6/2004 | Bleeker |
| 2004/0160582 A1* | 8/2004 | Lof ............... G03F 7/70341 355/30 |
| 2004/0165159 A1 | 8/2004 | Lof et al. |
| 2004/0207824 A1 | 10/2004 | Lof et al. |
| 2004/0257544 A1 | 12/2004 | Vogel et al. |
| 2005/0018155 A1 | 1/2005 | Cox et al. |
| 2005/0018156 A1 | 1/2005 | Mulkens et al. |
| 2005/0030498 A1 | 2/2005 | Mulkens |
| 2005/0174550 A1 | 8/2005 | Streefkerk et al. |
| 2005/0179877 A1 | 8/2005 | Mulkens et al. |
| 2005/0219481 A1 | 10/2005 | Cox et al. |
| 2005/0259233 A1 | 11/2005 | Streefkerk et al. |
| 2005/0259234 A1 | 11/2005 | Hirukawa et al. |
| 2005/0263068 A1* | 12/2005 | Hoogendam ....... G03F 7/70341 118/668 |
| 2005/0270506 A1 | 12/2005 | Streefkerk et al. |
| 2005/0286032 A1* | 12/2005 | Lof ............... G03F 7/70341 355/53 |
| 2006/0038968 A1* | 2/2006 | Kemper ............ G03F 7/70341 355/18 |
| 2006/0114445 A1 | 6/2006 | Ebihara |
| 2006/0126045 A1 | 6/2006 | Ono et al. |
| 2006/0139613 A1 | 6/2006 | Houkes et al. |
| 2006/0209278 A1 | 9/2006 | Kiuchi et al. |
| 2007/0081136 A1 | 4/2007 | Hara |

FOREIGN PATENT DOCUMENTS

| | | |
|---|---|---|
| EP | 0 605 103 A1 | 7/1994 |
| EP | 1498778 A1 | 1/2005 |
| EP | 1 524 558 A1 | 4/2005 |
| EP | 1 528 433 A2 | 5/2005 |
| EP | 1 571 697 A1 | 9/2005 |
| EP | 1679738 A1 | 7/2006 |
| EP | 1 703 548 A1 | 9/2006 |
| JP | S57-117238 A | 7/1982 |
| JP | S58-202448 A | 11/1983 |
| JP | S59-019912 A | 2/1984 |
| JP | S62-65326 A | 3/1987 |
| JP | S63-157419 A | 6/1988 |
| JP | H04-65603 A | 3/1992 |
| JP | H04-305915 A | 10/1992 |
| JP | H04-305917 A | 10/1992 |
| JP | H05-062877 A | 3/1993 |
| JP | H06-53120 A | 2/1994 |
| JP | H06-124873 A | 5/1994 |
| JP | H06-168866 A | 6/1994 |
| JP | H06-188169 A | 7/1994 |
| JP | H07-176468 A | 7/1995 |
| JP | H07-220990 A | 8/1995 |
| JP | H08-37149 A | 2/1996 |
| JP | H08-166475 A | 6/1996 |
| JP | H08-316125 A | 11/1996 |
| JP | H08-330224 A | 12/1996 |
| JP | H09-102453 A | 4/1997 |
| JP | H10-154659 A | 6/1998 |
| JP | H10-163099 A | 6/1998 |
| JP | H10-214783 A | 8/1998 |
| JP | H10-303114 A | 11/1998 |
| JP | H10-340846 A | 12/1998 |
| JP | H11-16816 A | 1/1999 |
| JP | H11-135400 A | 5/1999 |
| JP | H11-176727 A | 7/1999 |
| JP | H11-204390 A | 7/1999 |
| JP | 2000-058436 A | 2/2000 |
| JP | 2000-505958 A | 5/2000 |
| JP | 2002-014005 A | 1/2002 |
| JP | 2002-343759 A | 11/2002 |
| JP | 2003-197506 A | 7/2003 |
| JP | 2003-338448 A | 11/2003 |
| JP | 2003-347196 A | 12/2003 |
| JP | 2004-289126 A | 10/2004 |
| JP | 2005-045223 A | 2/2005 |
| JP | 2005-057278 A | 3/2005 |
| JP | 2005-085789 A | 3/2005 |
| JP | 2005-167211 A | 6/2005 |
| TW | 559895 B | 11/2003 |
| WO | 99/49504 A1 | 9/1999 |
| WO | 2004/019128 A2 | 3/2004 |
| WO | 2004/053955 A1 | 6/2004 |
| WO | 2004/055803 A1 | 7/2004 |
| WO | 2004/090634 A2 | 10/2004 |
| WO | 2004/093160 A2 | 10/2004 |
| WO | 2004/114380 A1 | 12/2004 |
| WO | 2005/006416 A1 | 1/2005 |
| WO | 2005/006417 A1 | 1/2005 |
| WO | 2005/067013 A1 | 7/2005 |
| WO | 2005/093791 A1 | 10/2005 |

OTHER PUBLICATIONS

Mar. 30, 2015 Office Action issued in European Patent Application No. 10003902.3.
Apr. 10, 2009 Office Action issued in U.S. Appl. No. 10/584,950.
Aug. 19, 2009 Office Action issued in U.S. Appl. No. 10/584,950.
Jun. 10, 2010 Office Action issued in U.S. Appl. No. 10/584,950.
Dec. 28, 2010 Notice of Allowance issued in U.S. Appl. No. 10/584,950.
Apr. 15, 2011 Notice of Allowance issued in U.S. Appl. No. 10/584,950.
Jul. 12, 2011 Notice of Allowance issued in U.S. Appl. No. 10/584,950.
International Preliminary Report on Patentability dated Aug. 22, 2006 in International Patent Application No. PCT/JP2004/019813.
Jun. 16, 2015 Office Action issued in Japanese Application No. 2014-217182.
Oct. 26, 2015 Office Action issued in Taiwanese Patent Application No. 101148294.
Jun. 14, 2016 Office Action issued in Japanese Patent Application No. 2015-159807.

(56) References Cited

OTHER PUBLICATIONS

Aug. 1, 2016 Office Action issued in U.S. Appl. No. 13/317,170.
Owa et al., "Immersion Lithography; its potential performance and issues", Proceedings of SPIE, Feb. 28, 2003, pp. 724-733, vol. 5040, No. 1, Bellingham, VA.
Jun. 22, 2010 Notice of Reasons for Rejection issued in Japanese Patent Application No. 2004-375494.
Apr. 19, 2005 International Search Report issued in International Patent Application No. PCT/JP2004/019813.
Feb. 24, 2009 Office Action issued in European Patent Application No. 04 808 163.2.
Apr. 22, 2011 Office Action issued in Korean Patent Application No. 2006-7008813.
Jun. 19, 2012 Office Action issued in Taiwan Patent Application No. 094100209.
Oct. 23, 2012 Search Report issued in European Patent Application No. 10 00 3902.3.
Dec. 4, 2012 Office Action issued in Japanese Patent Application No. 2010-246602.
Nov. 26, 2012 Office Action issued in Korean Patent Application No. 2012-7025529.
Oct. 8, 2013 Office Action issued in Japanese Patent Application No. 2010-246602.
Oct. 28, 2014 Notice of Grounds for Rejection issued in Korean Patent Application No. 2011-7025142.
Oct. 2, 2014 Restriction Requirement issued in U.S. Appl. No. 13/317,170.
Jan. 15, 2015 Office Action issued in U.S. Appl. No. 13/317,170.
May 22, 2015 Office Action issued in U.S. Appl. No. 13/317,170.
Nov. 9, 2015 Office Action issued in U.S. Appl. No. 13/317,170.
Mar. 28, 2016 Notice of Allowance issued in U.S. Appl. No. 13/317,170.
Nov. 4, 2016 Notice of Allowance issued in U.S. Appl. No. 13/317,170.

* cited by examiner

EXPOSURE APPARATUS, EXPOSURE METHOD, AND DEVICE PRODUCING METHOD

This is a Division of application Ser. No. 13/317,170 filed Oct. 12, 2011 (now U.S. Pat. No. 9,588,436), which in turn is a Division of application Ser. No. 10/584,950 filed Jul. 5, 2006 (now U.S. Pat. No. 8,064,044), which in turn is a National Phase of PCT/JP2004/019813 filed Dec. 27, 2004, which claims the benefit of Japanese Patent Application No. 2004-000236 filed Jan. 5, 2004. The disclosures of the prior applications are hereby incorporated by reference herein in their entirety.

TECHNICAL FIELD

The present invention relates to an exposure apparatus, an exposure method, and a method for producing a device, in which an exposure light beam is radiated onto a substrate via a projection optical system and a liquid to expose the substrate.

BACKGROUND ART

Semiconductor devices and liquid crystal display devices are produced by means of the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot \lambda / NA^2 \quad (2)$$

In the expressions, X represents the exposure wavelength, NA represents the numerical aperture of the projection optical system, and $k_1$ and $k_2$ represent the process coefficients. According to the expressions (1) and (2), the following fact is appreciated. That is, when the exposure wavelength λ is shortened and the numerical aperture NA is increased in order to enhance the resolution R, then the depth of focus δ is narrowed.

If the depth of focus δ is too narrowed, it is difficult to match the substrate surface with respect to the image plane of the projection optical system. It is feared that the margin is insufficient during the exposure operation. In view of the above, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent to form a liquid immersion area so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases).

In order to satisfactorily perform the liquid immersion exposure process and various types of optical measuring processes through the liquid, it is important that the liquid immersion area of the liquid is formed in a desired state. For example, there is such a possibility that the substrate and/or the substrate stage may be slightly deformed due to the fluctuation of the pressure of the liquid in the liquid immersion area, and the exposure accuracy and the measurement accuracy may be deteriorated by the deformation. In another situation, when the pressure fluctuation of the liquid arises, a part of the projection optical system (for example, the optical element disposed on the side most closely to the image plane), which makes contact with the liquid, may be displaced and/or vibrated. As a result, the image of the pattern to be projected onto the substrate is deteriorated, and/or the measurement accuracy is deteriorated via the projection optical system and the liquid.

Further, when the liquid is supplied in order to form the liquid immersion area, there is such a high possibility that any gas portion such as the bubble may be formed in the liquid of the liquid immersion area. If the gas portion is formed in the liquid of the liquid immersion area, for example, the following phenomenon arises. That is, the exposure light beam, which is radiated to form the image of the pattern on the substrate, does not arrive at the surface of the substrate. In another situation, the exposure light beam, which is radiated to form the image of the pattern on the substrate, does not arrive at a desired position on the substrate. In still another situation, the measuring light beam does not arrive at the measuring unit. In still another situation, the measuring light beam does not arrive at a desired position. As a result, the exposure accuracy and the measurement accuracy are deteriorated.

On the other hand, when the liquid immersion area of the liquid is formed on the substrate by supplying and recovering the liquid by using the liquid supply mechanism and the liquid recovery mechanism, there is such a possibility that the following inconvenience may arise as well. That is, the liquid immersion area is not formed in a desired state due to the occurrence of any abnormality in the exposure apparatus, for example, such that the liquid supply mechanism and/or the liquid recovery mechanism malfunctions. For example, if the liquid immersion area is increased to be larger than a predetermined size, there is such a high possibility that the liquid may outflow to the outside of the substrate. Further, there is such a possibility that the following situation may arise. That is, the liquid cannot be retained satisfactorily on the image plane side of the projection optical system depending on the condition of the movement of the substrate stage. This also causes the inconvenience such that the gas portion is formed in the liquid immersion area, and/or the liquid outflows to the outside of the substrate. If the liquid outflows, the following inconvenience arises due to the outflow liquid as well. That is, for example, any mechanical part, which is disposed around the substrate stage for supporting the substrate, is rusted, and/or the electric leakage occurs, for example, in the stage-driving system. Further, if the liquid outflows, for example, the environment (temperature, humidity), in which the substrate is placed, is varied due to the vaporization of the outflow liquid. As a result, the substrate and/or the substrate stage is thermally deformed. In another situation, the vaporization of the liquid causes any fluctuation in the gas (air) on the optical paths for the various types of measuring light beams for measuring, for example, the position information about the substrate. As a result, the exposure accuracy and/or the measurement accuracy is deteriorated. Further, if any natural disaster such as the thunder and the earthquake and/or any unexpected accident arises, the outflow of the liquid occurs as described above due to the malfunction of the liquid recovery unit caused by the power failure of the power source of the exposure apparatus.

DISCLOSURE OF THE INVENTION

The present invention has been made taking the foregoing circumstances into consideration, an object of which is to provide an exposure apparatus, an exposure method, and a method for producing a device based on the same, wherein a liquid immersion area can be satisfactorily formed to successfully obtain a high exposure accuracy and a high measurement accuracy.

In order to achieve the object as described above, the present invention adopts the following constructions as illustrated in embodiments.

According to a first aspect of the present invention, there is provided an exposure apparatus which exposes a substrate by radiating an exposure light beam onto the substrate through a liquid; the exposure apparatus comprising a liquid supply mechanism which supplies the liquid onto the substrate; a projection optical system; and a pressure adjustment mechanism which adjusts a pressure of the liquid supplied from the liquid supply mechanism.

According to the present invention, the pressure of the liquid supplied from the liquid supply mechanism is adjusted or regulated by using the pressure adjustment mechanism. Accordingly, it is possible to avoid, for example, the occurrence of the deformation of the substrate and/or the substrate stage caused by the pressure fluctuation of the liquid as well as the occurrence of the vibration and the displacement of the projection optical system. Therefore, it is possible to obtain the high exposure accuracy and the high measurement accuracy.

According to a second aspect of the present invention, there is provided an exposure apparatus which exposes a substrate by radiating an exposure light beam onto the substrate through a liquid; the exposure apparatus comprising a projection optical system; a liquid supply mechanism which supplies the liquid; and a gas discharge mechanism which discharges a gas present on an image plane side of the projection optical system; wherein a gas discharge port of the gas discharge mechanism is arranged nearer to a projection area defined by the projection optical system than a liquid supply port of the liquid supply mechanism, and supply of the liquid by the liquid supply mechanism is started while discharging the gas by the gas discharge mechanism.

According to the present invention, the supply of the liquid by the liquid supply mechanism is started, while the gas is discharged on the image plane side of the projection optical system via the gas discharge port arranged in the vicinity of the projection area of the projection optical system.

Accordingly, a region, which is in the vicinity of the gas discharge port, is allowed to have a negative pressure. Accordingly, the supplied liquid is smoothly arranged in the region allowed to have the negative pressure. Therefore, it is possible to avoid the inconvenience which would be otherwise caused such that any gas portion is formed in the liquid immersion area formed on the image plane side of the projection optical system. It is possible to obtain the high exposure accuracy and the high measurement accuracy.

According to a third aspect of the present invention, there is provided an exposure apparatus which exposes a substrate by radiating an exposure light beam onto the substrate through a liquid; the exposure apparatus comprising a projection optical system; a liquid supply mechanism which supplies the liquid; a first liquid recovery mechanism which has a liquid recovery port disposed outside a liquid supply port of the liquid supply mechanism with respect to a projection area of the projection optical system; and a second liquid recovery mechanism which has a driving source which is different from that for the first liquid recovery mechanism and which has a liquid recovery port disposed outside the liquid recovery port of the first liquid recovery mechanism with respect to the projection area of the projection optical system.

According to the present invention, the liquid, which is unsuccessfully recovered by the liquid recovery port of the first liquid recovery mechanism, is recovered via the liquid recovery port of the second liquid recovery mechanism. Therefore, it is possible to avoid the outflow of the liquid. Even when any abnormality or trouble arises in the driving source for driving the first liquid recovery mechanism, the liquid can be satisfactorily recovered by the second liquid recovery mechanism, because the second liquid recovery mechanism is driven by the distinct (another) driving source. It is possible to avoid the outflow of the liquid. Therefore, it is possible to avoid the deterioration of the exposure accuracy and the measurement accuracy which would be otherwise caused by the outflow of the liquid.

According to a fourth aspect of the present invention, there is provided an exposure apparatus which exposes a substrate by radiating an exposure light beam onto the substrate through a liquid; the exposure apparatus comprising a projection optical system; a liquid supply mechanism which supplies the liquid; a liquid recovery mechanism which recovers the liquid; and a substrate stage which holds the substrate; wherein a velocity of movement of the substrate stage differs depending on a distance between a first position and a second position when the substrate stage is moved substantially linearly from the first position to the second position in a state in which a liquid immersion area is locally formed on the substrate stage by the liquid supply mechanism and the liquid recovery mechanism.

According to the present invention, for example, it is possible to deal with the following situation. That is, for example, when the distance between the first position and the second position is long, and the substrate stage is moved over a long distance, then the liquid may outflow and/or any gas portion may be formed, for example, due to the exfoliation and/or the depletion of the liquid. As a result, there is such a possibility that it is difficult to satisfactorily retain the liquid on the image plane side of the projection optical system. However, in such a situation, the liquid can be satisfactorily retained on the image plane side of the projection optical system by slowing the velocity of movement of the substrate stage. Therefore, it is possible to avoid the outflow of the liquid and the formation of the gas portion in the liquid immersion area, and it is possible to avoid the deterioration of the exposure accuracy and the measurement accuracy which would be otherwise caused, for example, by the outflow of the liquid and the formation of the gas portion. On the other hand, when the distance between the first position and the second position is short, and the substrate stage is not moved over a long distance, then it is possible to improve the throughput by quickening the velocity of movement of the substrate stage.

In this application, the term "liquid immersion area on the substrate stage" also includes the "liquid immersion area on the substrate held by the substrate stage".

According to a fifth aspect of the present invention, there is provided an exposure apparatus which exposes a substrate by radiating an exposure light beam onto the substrate through a liquid; the exposure apparatus comprising a projection optical system; a liquid supply mechanism which supplies the liquid; a liquid recovery mechanism which recovers the liquid; and a substrate stage which holds the substrate; wherein a velocity of movement of the substrate stage differs depending on a direction of movement of the substrate stage from a first position to a second position when the substrate stage is moved substantially linearly from the first position to the second position in a state in which a liquid immersion area is locally formed on the substrate stage by the liquid supply mechanism and the liquid recovery mechanism.

According to the present invention, the following situation is assumed. That is, for example, there is such a possibility that any inconvenience arises, for example, such that any gas portion is formed by the exfoliation and/or the depletion of the liquid of the liquid immersion area and/or the outflow of the liquid, because the liquid cannot be retained satisfactorily on the image plane side of the projection optical system depending on the direction of movement of the substrate stage due to the size and/or the arrangement of the supply port and the recovery port for the liquid. However, when the velocity of movement of the substrate stage is allowed to differ depending on the direction of movement of the substrate stage, then it is possible to avoid the occurrence of the inconvenience such as the formation of the gas portion and the outflow of the liquid, and it is possible to avoid the deterioration of the exposure accuracy and the measurement accuracy. For example, when the substrate stage is moved in the direction in which the liquid recovery force is weak, the liquid can be satisfactorily retained on the image plane side of the projection optical system by slowing the velocity of movement of the substrate stage. On the other hand, for example, when the substrate stage is moved in the direction in which the liquid recovery force and/or the liquid supply force are strong, it is possible to improve the throughput by quickening the velocity of movement of the substrate stage.

According to a sixth aspect of the present invention, there is provided an exposure apparatus which exposes a substrate by radiating an exposure light beam onto the substrate through a liquid provided onto the substrate; the exposure apparatus comprising a flow passage-forming member which has a light-transmitting portion and which includes a flow passage for the liquid, the flow passage being formed in the light-transmitting section; and a liquid supply unit which supplies the liquid to a space between the substrate and the flow passage-forming member via the flow passage of the flow passage-forming member; wherein a pressure of the liquid supplied to the space between the substrate and the flow passage-forming member is adjusted depending on a flow rate of the liquid supplied via the flow passage. In the case of this exposure apparatus, the liquid is supplied to the space between the flow passage-forming member and the substrate. Therefore, the pressure, which is exerted on the substrate by the liquid on the substrate, can be adjusted by controlling the flow rate of the liquid supplied via the flow passage of the flow passage-forming member.

According to a seventh aspect of the present invention, there is provided an exposure method for exposing a substrate by radiating an exposure light beam onto the substrate through a liquid; the exposure method comprising supplying the liquid onto the substrate; adjusting a pressure of the liquid supplied onto the substrate; and exposing the substrate by radiating the exposure light beam onto the substrate through the liquid. According to the present invention, the occurrence of, for example, the deformation, the displacement, and the vibration of the substrate and/or the substrate stage, which would be otherwise caused, for example, by the pressure fluctuation of the liquid, can be avoided by regulating or adjusting the pressure of the supplied liquid.

According to an eighth aspect of the present invention, there is provided an exposure method for exposing a substrate by radiating an exposure light beam onto the substrate via a projection optical system and a liquid; the exposure method comprising supplying the liquid onto the substrate; discharging a gas at a position which is positioned in the vicinity of the projection optical system and which is positioned higher than a terminal end surface of the projection optical system in relation to a vertical direction; and exposing the substrate by radiating the exposure light beam onto the substrate through the liquid. According to this exposure method, it is possible to avoid the inconvenience which would be otherwise caused such that any gas portion such as the bubble is formed in the liquid for forming the liquid immersion area.

According to a ninth aspect of the present invention, there is provided an exposure method for exposing a substrate by radiating an exposure light beam onto the substrate through a liquid; the exposure method comprising: supplying the liquid onto the substrate; recovering the liquid disposed on the substrate by first and second liquid recovery mechanisms at positions farther than a position at which the liquid is supplied, with respect to a projection optical system; and exposing the substrate by radiating the exposure light beam onto the substrate through the liquid; wherein driving power sources of the first and second liquid recovery mechanisms are different from each other. According to the present invention, even when any abnormality or trouble arises in the driving source for driving the first liquid recovery mechanism, the second liquid recovery mechanism is driven by the distinct (different) driving source. Therefore, it is possible to satisfactorily recover the liquid by the second liquid recovery mechanism, and it is possible to avoid the outflow of the liquid.

According to a tenth aspect of the present invention, there is provided an exposure method for exposing a substrate by radiating an exposure light beam onto the substrate through a liquid; the exposure method comprising: exposing the substrate by radiating the exposure light beam onto the substrate through the liquid; moving the substrate from a first position to a second position while retaining the liquid on the substrate when the substrate is unexposed; and adjusting a velocity of movement of the substrate from the first position to the second position depending on a positional relationship between the first position and the second position. According to the present invention, for example, when the substrate is moved from the first position to the second position by using the substrate stage, the velocity of movement is adjusted depending on the distance of movement and/or the direction of movement. Accordingly, it is possible to satisfactorily retain the liquid on the substrate.

According to an eleventh aspect of the present invention, there is provided a method for producing a device, comprising using the exposure apparatus as defined in any one of the first to sixth aspects. According to a twelfth aspect of the present invention, there is provided a method for producing a device, comprising using the exposure method as defined in any one of the seventh to tenth aspects.

According to the present invention, the liquid immersion area can be satisfactorily formed to obtain the high exposure accuracy and the high measurement accuracy. Therefore, it is possible to produce the device having the desired performance.

BEST MODE FOR CARRYING OUT THE INVENTION

An explanation will be made below with reference to the drawings about the exposure method and the exposure apparatus according to the present invention. However, the present invention is not limited thereto.

Figure 1:
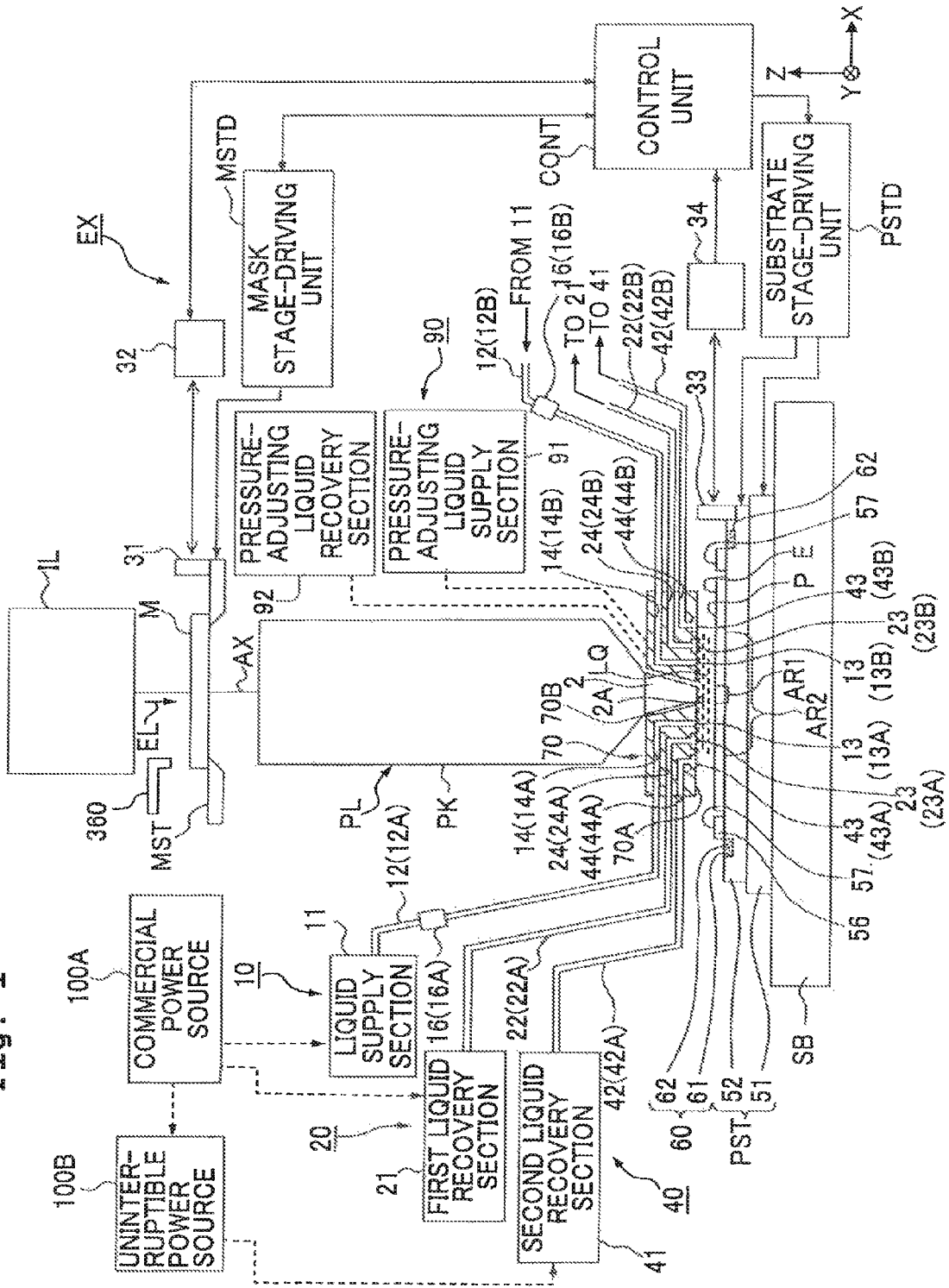
FIG. 1 shows a schematic arrangement illustrating an embodiment of an exposure apparatus of the present invention.

FIG. 1 shows a schematic arrangement illustrating an embodiment of an exposure apparatus of the present invention. With reference to FIG. 1, the exposure apparatus EX includes a mask stage MST which supports a mask M, a substrate stage PST which supports a substrate P, an illumination optical system IL which illuminates, with an exposure light beam EL, the mask M supported by the mask stage MST, a projection optical system PL which performs projection exposure for the substrate P supported by the substrate stage PST with an image of a pattern of the mask M illuminated with the exposure light beam EL, and a control unit CONT which integrally controls the overall operation of the exposure apparatus EX. The entire exposure apparatus EX is driven by the electric power fed from a commercial power source 100A supplied from an electric power company.

The exposure apparatus EX of the embodiment of the present invention is the liquid immersion exposure apparatus to which the liquid immersion method is applied in order that the exposure wavelength is substantially shortened to improve the resolution and substantially widen the depth of focus. The exposure apparatus EX includes a liquid supply mechanism 10 which supplies the liquid LQ onto the substrate P, and a first liquid recovery mechanism 20 and a second liquid recovery mechanism 40 which recover the liquid LQ from the surface of the substrate P. The exposure apparatus EX locally forms a liquid immersion area AR2 which is larger than a projection area AR1 and which is smaller than the substrate P on a part of the substrate P including the projection area AR1 of the projection optical system PL by the liquid LQ supplied from the liquid supply mechanism 10 at least during the period in which the image of the pattern of the mask M is transferred onto the substrate P. Specifically, the exposure apparatus EX adopts the local liquid immersion system in which the space between the surface of the substrate P arranged on the image plane side and the optical element 2 disposed at the terminal end on the image plane side of the projection optical system PL is filled with the liquid LQ. The substrate P is subjected to the projection exposure with the pattern of the mask M by radiating, onto the substrate P, the exposure light beam EL allowed to pass through the mask M by the aid of (via) the projection optical system PL and the liquid LQ disposed between the projection optical system PL and the substrate P.

The exposure apparatus EX further includes a pressure adjustment mechanism 90 which adjusts or regulates the pressure of the liquid LQ supplied from the liquid supply mechanism 10 as described in detail later on. The pressure adjustment mechanism 90 includes a pressure-adjusting liquid supply section 91 which is capable of further adding the liquid LQ to the liquid LQ supplied from the liquid supply mechanism 10, and a pressure-adjusting liquid recovery section 92 which is capable of recovering a part of the liquid LQ. The operation of the pressure adjustment mechanism 90 is controlled by the control unit CONT.

The embodiment of the present invention will be explained as exemplified by a case using the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. In the following explanation, the Z axis direction is the direction which is coincident with the optical axis AX of the projection optical system PL, the X axis direction is the synchronous movement direction (scanning direction) for the mask M and the substrate P in the plane perpendicular to the Z axis direction, and the Y axis direction (non-scanning direction) is the direction which is perpendicular to the Z axis direction and the X axis direction. The directions of rotation (inclination) about the X axis, the Y axis, and the Z axis are designated as θX, θY, and θZ directions respectively.

The illumination optical system IL is provided so that the mask M, which is supported on the mask stage MST, is illuminated with the exposure light beam EL. The illumination optical system IL includes, for example, an exposure light source, an optical integrator which uniformizes the illuminance of the light flux radiated from the exposure light source, a condenser lens which collects the exposure light beam EL emitted from the optical integrator, a relay lens system, and a variable field diaphragm which sets the illumination area on the mask M illuminated with the exposure light beam EL to be slit-shaped. The predetermined illumination area on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

In this embodiment, pure water is used as the liquid LQ. Those transmissive through pure water include not only the ArF excimer laser beam but also the emission line (g-ray, h-ray, f-ray) radiated, for example, from a mercury lamp and the far ultraviolet light beam (DUV light beam) such as the KrF excimer laser beam (wavelength: 248 nm).

The mask stage MST is movable while holding the mask M. The mask M is fixed, for example, by the vacuum attraction (or the electrostatic attraction). The mask stage MST is two-dimensionally movable in the plane perpendicular to the optical axis AX of the projection optical system PL, i.e., in the XY plane, and it is finely rotatable in the θZ direction by a mask stage-driving unit MSTD including, for example, a linear motor. The mask stage MST is movable at a designated scanning velocity in the X axis direction. The mask stage MST has a movement stroke in the X axis direction to such an extent that the entire surface of the mask M can traverse at least the optical axis AX of the projection optical system PL.

A movement mirror 31, which is movable together with the mask stage, is provided on the mask stage MST. A laser interferometer 32 is provided at a position opposed to the movement mirror 31. The position in the two-dimensional direction and the angle of rotation (including the angles of rotation in the θX, θY directions in some cases as well) of the mask M on the mask stage MST are measured in real-time by the laser interferometer 32. The result of the measurement is outputted to the control unit CONT. The control unit CONT drives the mask stage-driving unit MSTD on the basis of the result of the measurement performed by the laser interferometer 32 to thereby control the position of the mask M supported on the mask stage MST.

The projection optical system PL projects the pattern on the mask M onto the substrate P at a predetermined projection magnification β to perform the exposure. The projection optical system PL includes a plurality of optical elements including the optical element (lens) 2 provided at the end portion on the side of the substrate P. The optical elements 2 are supported by a barrel PK. In this embodiment, the projection optical system PL is based on the reduction system having the projection magnification β which is, for example, ¼ or ⅕. The projection optical system PL may be any one of the 1× magnification system and the magnifying system.

The optical element 2, which is disposed at the end portion of the projection optical system PL of this embodiment, is exposed from the barrel PK, with which the liquid LQ in the liquid immersion area AR2 makes contact. The optical element 2 is formed of calcium fluoride. Alternatively, for example, $MgF_2$, $Al_2O_3$, and/or $SiO_2$ may be adhered to the calcium fluoride surface. Calcium fluoride or $MgF_2$, $Al_2O_3$, $SiO_2$ or the like has the high affinity for water. Therefore, the liquid LQ is successfully allowed to make tight contact with the substantially entire surface of the liquid contact surface 2A of the optical element 2. That is, in this embodiment, the liquid (water) LQ, which has the high affinity for the liquid contact surface 2A of the optical element 2, is supplied. Therefore, the highly tight contact is effected between the liquid LQ and the liquid contact surface 2A of the optical element 2. The optical path, which is disposed between the optical element 2 and the substrate P, can be reliably filled with the liquid LQ. The optical element 2 may be silica glass having a high affinity for water as well. A water-attracting (lyophilic or liquid-attracting) treatment may be performed to the liquid contact surface 2A of the optical element 2 to further enhance the affinity for the liquid LQ.

The substrate stage PST is movable while holding the substrate P. The substrate stage PST includes an XY stage 51, and a Z tilt stage 52 which is provided on the XY stage 51. The XY stage 51 is supported in a non-contact manner by the aid of an unillustrated gas bearing (air bearing) which is a non-contact bearing disposed over the upper surface of a stage base SB. The XY stage 51 (substrate stage PST) is finely rotatable in the θZ direction and two-dimensionally movable in the plane perpendicular to the optical axis AX of the projection optical system PL, i.e., in the XY plane by the aid of a substrate stage-driving unit PSTD including, for example, a linear motor, in a state in which the XY stage 51 (substrate stage PST) is supported in the non-contact manner with respect to the upper surface of the stage base SB. The Z tilt stage 52 is provided on the XY stage 51. The substrate P is held, for example, by the vacuum attraction by the aid of an unillustrated substrate holder on the Z tilt stage 52. The Z tilt stage 52 is provided movably in the Z axis direction, the θX direction, and the θY direction as well. The substrate stage-driving unit PSTD is controlled by the control unit CONT.

A movement mirrors 33, which is movable together with the substrate stage PST with respect to the projection optical system PL, is provided on the substrate stage PST (Z tilt stage 52). A laser interferometer 34 is provided at a position opposed to the movement mirror 33. The angle of rotation and the position in the two-dimensional direction of the substrate P on the substrate stage PST are measured in real-time by the laser interferometer 34. The result of the measurement is outputted to the control unit CONT. The control unit CONT drives the substrate stage-driving unit PSTD including the linear motor or the like on the basis of the result of the measurement performed by the laser interferometer 34 to thereby position the substrate P supported on the substrate stage PST.

The exposure apparatus EX further includes a focus/leveling-detecting system (80) which detects the position of the surface of the substrate P supported by the substrate stage PST as described later on. The light-receiving result of the focus/leveling-detecting system is outputted to the control unit CONT. The control unit CONT is capable of detecting the position information in the Z axis direction about the surface of the substrate P and the inclination information in the θX and θY directions about the substrate P on the basis of the detection result obtained by the focus/leveling-detecting system. The Z tilt stage 52 controls the focus position and the angle of inclination of the substrate P to adjust and match the surface of the substrate P with respect to the image plane of the projection optical system PL in the auto-focus manner and the auto-leveling manner. The XY stage 51 positions the substrate P in the X axis direction and the Y axis direction. It goes without saying that the Z tilt stage and the XY stage may be provided as an integrated body.

A substrate alignment system (not shown), which detects the alignment mark provided on the substrate P or the reference mark (described later on) provided on the substrate stage PST (Z tilt stage 52), is provided in the vicinity of the substrate stage PST. A mask alignment system 360, which detects the reference mark provided on the substrate stage PST (Z tilt stage 52) via the mask M and the projection optical system PL, is provided in the vicinity of the mask stage MST. The mask alignment system 360 constructs the alignment system based on the so-called TTM (through the mask) system (or referred to as the TTR (through the reticle) system as well). A system, which is disclosed, for example, in Japanese Patent Application Laid-open No. 4-65603, may be used for the substrate alignment system. A system, which is disclosed, for example, in Japanese Patent Application Laid-open No. 7-176468, may be used for the mask alignment system 360.

A plate member 56 is provided on the substrate stage PST (Z tilt stage 52) to surround the substrate P held by the substrate stage PST. The plate member 56 is an annular member, which is arranged outside the substrate P. The plate member 56 has a flat surface (flat portion) 57 which has approximately the same height as that of (is flush with) the surface of the substrate P held by the substrate stage PST. The flat surface 57 is arranged on the outer side around the substrate P held by the substrate stage PST.

The plate member 56 is formed of, for example, a liquid-repellent material such as polytetrafluoroethylene (Teflon (trade name)). Therefore, the flat surface 57 is liquid-repellent or lyophobic. Alternatively, for example, the plate member 56 may be formed of a predetermined metal or the like, and the flat surface 57 may be liquid-repellent by performing a liquid-repelling treatment to at least the flat surface 57 of the plate member 56 made of metal. The liquid-repelling treatment, which is to be performed for the plate member 56 (flat surface 57), includes, for example, the coating of a liquid-repellent material such as a fluorine-based resin material such as polytetrafluoroethylene, an acrylic resin material, and a silicon-based resin material, and the sticking of a thin film composed of the liquid-repellent material as described above. The film for the surface treatment may be either a single layer film or a film formed of a plurality of layers. A material, which is insoluble in the liquid LQ, is used as the liquid-repellent material to provide the liquid repellence. As for the application or coating area with the liquid-repellent material, the liquid-repellent material may be applied to the entire region of the surface of the plate member 56, or the liquid-repellent material may be applied to only a part of the region such as the flat surface 57 for which the liquid repellence is required.

The plate member 56, which has the flat surface 57 approximately flush with the surface of the substrate P, is provided around the substrate P. Accordingly, any level difference portion is substantially absent at the outside of the edge portion of the substrate P. Therefore, even when the edge area E of the substrate P is subjected to the liquid immersion exposure, the liquid LQ can be retained under the projection optical system PL, and the liquid immersion area AR2 can be satisfactorily formed on the image plane side of the projection optical system PL. When the flat surface 57 is liquid-repellent, then it is possible to suppress the outflow of the liquid LQ to the outside of the substrate P (outside the flat surface 57) during the liquid immersion exposure, and it is possible to smoothly recover the liquid LQ after the liquid immersion exposure as well. Thus, it is possible to avoid the remaining of the liquid LQ on the flat surface 57.

In this embodiment, the plate member 56 is formed only at the portion around the substrate P. However, the plate member 56 may be arranged over the substantially entire surface of the substrate stage PST (Z tilt stage 52). In this arrangement, the upper surface of the movement mirror 33 may be also substantially flush with the upper surface of the substrate stage PST. It is also allowable that a slight difference in level exists between the upper surface of the substrate stage PST and the surface of the substrate P held by the substrate stage PST provided that the liquid LQ can be satisfactorily retained in the optical path space disposed on the image plane side of the projection optical system PL.

The liquid supply mechanism 10 is provided to supply the predetermined liquid LQ to the image plane side of the projection optical system PL. The liquid supply mechanism 10 includes a liquid supply section 11 which is capable of feeding the liquid LQ, and supply tubes 12 (12A, 12B) which have first ends connected to the liquid supply section 11. The liquid supply section 11 is provided with, for example, a pressurizing pump and a tank for accommodating the liquid LQ. When the liquid immersion area AR2 is formed on the substrate P, the liquid supply mechanism 10 supplies the liquid LQ onto the substrate P. It is not necessarily indispensable that the exposure apparatus EX is provided with the tank and the pressurizing pump of the liquid supply section 11. The tank and the pressurizing pump may be replaced with the equipment of a factory or the like in which the exposure apparatus EX is installed.

The first liquid recovery mechanism 20 is provided to recover the liquid LQ on the image plane side of the projection optical system PL. The first liquid recovery mechanism 20 includes a first liquid recovery section 21 which is capable of recovering the liquid LQ, and recovery tubes 22 (22A, 22B) which have first ends connected to the first liquid recovery section 21. The first liquid recovery section 21 is provided with a vacuum system (suction unit) such as a vacuum pump, a gas/liquid separator for separating the recovered liquid LQ from the gas, a tank for accommodating the recovered liquid LQ and the like. As for the vacuum system, it is also possible to use a vacuum system of a factory in which the exposure apparatus EX is installed, instead of providing the vacuum pump for the exposure apparatus EX. In order to form the liquid immersion area AR2 on the substrate P, the first liquid recovery mechanism 20 recovers a predetermined amount of the liquid LQ disposed on the substrate P supplied from the liquid supply mechanism 10.

The second liquid recovery mechanism 40 is provided to recover the liquid LQ on the image plane side of the projection optical system PL. The second liquid recovery mechanism 40 includes a second liquid recovery section 41 which is capable of recovering the liquid LQ, and recovery tubes 42 (42A, 42B) which have first ends connected to the second liquid recovery section 41. The second liquid recovery section 41 is provided with a vacuum system (suction unit) such as a vacuum pump, a gas/liquid separator for separating the recovered liquid LQ from the gas, a tank for accommodating the recovered liquid LQ, and the like. As for the vacuum system, it is also possible to use a vacuum system of a factory in which the exposure apparatus EX is installed, instead of providing the vacuum pump for the exposure apparatus EX. The mechanism, with which the liquid immersion area AR2 is locally formed on the substrate P (substrate stage PST), is not limited to the mechanism as described above. It is also possible to adopt, for example, a mechanism disclosed in United States Patent Application Publication No. 2004/020782 and International Publication No. 2004/055803, contents of which are incorporated herein by reference within a range of permission of the domestic laws and ordinances of the state designated or selected in this international application.

The second liquid recovery mechanism 40 is provided with an uninterruptible power source 100B which is distinct (different) from the commercial power source 100A serving as the driving source for the entire exposure apparatus EX including the first liquid recovery mechanism 20. The uninterruptible power source 100B supplies the electric power (driving force) to the driving section of the second liquid recovery mechanism 40, for example, when the commercial power source 100A suffers the power failure.

It is desirable that the power source 100B, which supplies the electric power to the second liquid recovery mechanism 40, is the uninterruptible power source. However, the power source 100B may be the same type as the commercial power source 100A. In this arrangement, the liquid LQ for forming the liquid immersion area AR2 can be recovered by using the liquid recovery mechanism which is driven by the electric power supplied from the other power source, even when any one of the power sources 100A, 100B suffers any abnormality, on condition that the electric power supply from the electric power company is not stopped.

A liquid recovery port 61, which constructs a third liquid recovery mechanism 60 for recovering the liquid LQ allowed to outflow to the outside of the substrate P, is provided outside the plate member 56 included in the Z tilt stage 52. The liquid recovery port 61 is an annular groove which is formed to surround the plate member 56. A liquid-absorbing member 62, which is formed of, for example, a sponge-like member or a porous member, is arranged in the liquid recovery port 61. The liquid-absorbing member 62 is exchangeable. One end of a recovery flow passage formed in the substrate stage PST is connected to the liquid recovery port 61. The other end of the recovery tube is connected to a third liquid recovery section provided outside the substrate stage PST (these members are not shown). The third liquid recovery section is provided with a vacuum system (suction unit) such as a vacuum pump, a gas/liquid separator for separating the recovered liquid LQ from the gas, a tank for accommodating the recovered liquid LQ, and the like, in the same manner as the first and second liquid recovery sections. It is not necessarily indispensable that the exposure apparatus EX is provided with, for example, the vacuum system, the gas/liquid separator, and the tank of the third liquid recovery section. These members may be replaced with the equipment of a factory or the like in which the exposure apparatus EX is installed.

Owing to the provision of the third liquid recovery mechanism 60, even if the liquid LQ outflows to the outside of the substrate P and the plate member 56, the outflow liquid LQ can be recovered. It is possible to avoid the occurrence of any inconvenience such as the variation of the environment in which the substrate P is placed, which would be otherwise caused by the vaporization of the outflow liquid LQ. Alternatively, the following arrangement may also be adopted without providing the vacuum system for the third liquid recovery mechanism 60. That is, the liquid LQ, which is recovered by the liquid-absorbing member 62, is allowed to spontaneously flow to the outside of the substrate stage PST in accordance with the self-weight. Further, the following arrangement may also be adopted without providing the third liquid recovery section including the vacuum system. That is, only the liquid-absorbing member 62 is arranged on the substrate stage PST. The liquid-absorbing member 62, which has absorbed the liquid LQ, is exchanged periodically (for example, every time when 1 lot is processed). In this arrangement, the substrate stage PST undergoes the weight fluctuation depending on the liquid LQ. However, the stage positioning accuracy can be maintained by changing the stage control parameter depending on the weight of the liquid LQ recovered by the liquid-absorbing member 62.

A flow passage-forming member 70 is arranged in the vicinity of the optical element 2 disposed at the terminal end of the projection optical system PL. The flow passage-forming member 70 is an annular member which has an opening 70B (light-transmitting section) formed at the central portion. The optical element 2 is accommodated in the opening 70B. That is, the flow passage-forming member 70 is provided to surround the optical element 2 over the substrate P (substrate stage PST). The flow passage-forming member 70 can be formed of, for example, aluminum, titanium, stainless steel, duralumin, or any alloy containing the element as described above. Alternatively, the flow passage-forming member 70 may be formed with a transparent member (optical member) having transparency such as glass (silica glass).

The flow passage-forming member 70 is provided over the substrate P (substrate stage PST), and is provided with liquid supply ports 13 (13A, 13B) which are arranged opposite to the surface of the substrate P. In this embodiment, the flow passage-forming member 70 has the two liquid supply ports 13A, 13B. The liquid supply ports 13A, 13B are provided on the lower surface 70A of the flow passage-forming member 70.

The flow passage-forming member 70 further includes supply flow passages 14 (14A, 14B) which are formed therein while corresponding to the liquid supply ports 13 (13A, 13B). First ends of the supply flow passages 14A, 14B are connected to the supply section 11 via the supply tubes 12A, 12B respectively, and second ends are connected to the liquid supply ports 13A, 13B respectively.

Flow rate controllers 16A, 16B, which are called "mass flow controllers" and control the liquid supply amounts per unit time fed from the liquid supply section 11 with respect to the liquid supply ports 13A, 13B respectively, are provided at intermediate positions of the supply tubes 12A, 12B respectively. The control of the liquid supply amount by each of the flow rate controllers 16 (16A, 16B) is performed under the instruction signal fed from the control unit CONT.

The flow passage-forming member 70 further includes liquid recovery ports 23 which are provided over or above the substrate P (substrate stage PST) and which are arranged opposite to the surface of the substrate P. In this embodiment, the flow passage-forming member 70 has the two liquid recovery ports 23A, 23B. The liquid recovery ports 23A, 23B are provided on the lower surface 70A of the flow passage-forming member 70.

The flow passage-forming member 70 also includes recovery flow passages 24 (24A, 24B) which are provided therein while corresponding to the liquid recovery ports 23 (23A, 23B). First ends of the recovery flow passages 24A, 24B are connected to the first liquid recovery section 21 via the recovery tubes 22A, 22B respectively. Second ends are connected to the liquid recovery ports 23A, 23B respectively.

The flow passage-forming member 70 further includes auxiliary liquid recovery ports 43 which are provided over or above the substrate P (substrate stage PST) and which are arranged opposite to the surface of the substrate P. In this embodiment, the flow passage-forming member 70 has the two auxiliary liquid recovery ports 43A, 43B. The auxiliary liquid recovery ports 43A, 43B are provided on the lower surface 70A of the flow passage-forming member 70.

The flow passage-forming member 70 also includes recovery flow passages 44 (44A, 44B) which are provided therein while corresponding to the auxiliary liquid recovery ports 43 (43A, 43B). First ends of the recovery flow passages 44A, 44B are connected to the second liquid recovery section 41 via the recovery tubes 42A, 42B respectively. Second ends are connected to the auxiliary liquid recovery ports 43A, 43B respectively.

In this embodiment, the flow passage-forming member 70 constructs parts of the liquid supply mechanism 10, the first liquid recovery mechanism 20, and the second liquid recovery mechanism 40 respectively. The liquid supply ports 13A, 13B, which construct the liquid supply mechanism 10, are provided at positions, respectively, disposed on the both sides in the X axis direction with the projection area AR1 of the projection optical system PL intervening therebetween. The liquid recovery ports 23A, 23B, which construct the first liquid recovery mechanism 20, are provided outside the liquid supply ports 13A, 13B of the liquid supply mechanism 10 with respect to the projection area AR1 of the projection optical system PL. The auxiliary liquid recovery ports 43A, 43B, which construct the second liquid recovery mechanism 40, are provided outside the liquid recovery ports 23A, 23B of the first liquid recovery mechanism 20 with respect to the projection area AR1 of the projection optical system PL.

The operations of the liquid supply section 11 and the flow rate controllers 16 are controlled by the control unit CONT. When the liquid LQ is supplied onto the substrate P, then the control unit CONT feeds the liquid LQ from the liquid supply section 11, and the liquid LQ is supplied onto the substrate P from the liquid supply ports 13A, 13B provided over the substrate P, via the supply tubes 12A, 12B and the supply flow passages 14A, 14B. In this arrangement, the liquid supply ports 13A, 13B are arranged on the both sides of the projection area AR1 of the projection optical system PL. The liquid LQ can be supplied from the both sides of the projection area AR1 by the aid of the liquid supply ports 13A, 13B. The amounts of the liquid LQ per unit time, which are supplied onto the substrate P from the liquid supply ports 13A, 13B respectively, can be individually controlled by the flow rate controllers 16A, 16B provided for the supply tubes 12A, 12B respectively.

The liquid recovery operation of the first liquid recovery section 21 is controlled by the control unit CONT. The control unit CONT is capable of controlling the liquid recovery amount per unit time by the first liquid recovery section 21. The liquid LQ disposed on the substrate P, which is to be recovered by the liquid recovery ports 23A, 23B provided over the substrate P, is recovered by the first liquid recovery section 21 via the recovery tubes 22A, 22B and the recovery flow passages 24A, 24B of the flow passage-forming member 70.

The liquid recovery operation of the second liquid recovery section 41 is controlled by the control unit CONT. The control unit CONT is capable of controlling the liquid recovery amount per unit time by the second liquid recovery section 41. The liquid LQ disposed on the substrate P, which is to be recovered by the auxiliary liquid recovery ports 43A, 43B provided over the substrate P, is recovered by the second liquid recovery section 41 via the recovery tubes 42A, 42B and the recovery flow passages 44A, 44B of the flow passage-forming member 70. The second liquid recovery mechanism 40 is always driven by the uninterruptible power source 100B. For example, when the commercial power source 100A suffers the power failure, the liquid recovery operation of the first liquid recovery mechanism 20 is stopped. However, the second liquid recovery section 41 of the second liquid recovery mechanism 40 is driven by the electric power supplied from the uninterruptible power source 100B. In this case, the liquid recovery operation of the second liquid recovery mechanism 40 including the second liquid recovery section 41 is not controlled by the control unit CONT, but is controlled, for example, on the basis of the instruction signal supplied from another control unit built in the second liquid recovery mechanism 40. Alternatively, the uninterruptible power source 100B may also supply the electric power to the control unit CONT in addition to the second liquid recovery mechanism 40 when the commercial power source 100A suffers the power failure. In this case, the control unit CONT, which is driven by the power source supplied from the uninterruptible power source 100B, may control the liquid recovery operation of the second liquid recovery mechanism 40.

In this embodiment, the supply tubes 12A, 12B are connected to one liquid supply section 11. However, a plurality of (for example, two) liquid supply sections 11 may be provided corresponding to the number of the supply tubes, and the respective supply tubes 12A, 12B may be connected to the plurality of liquid supply sections 11 respectively.

Further, the recovery tubes 22A, 22B are connected to one liquid recovery section 21. However, a plurality of (for example, two) first liquid recovery sections 21 may be provided corresponding to the number of the recovery tubes, and the respective recovery tubes 22A, 22B may be connected to the plurality of first liquid recovery sections 21 respectively.

Similarly, the recovery tubes 42A, 42B are connected to one liquid recovery section 41. However, a plurality of (for example, two) second liquid recovery sections 41 may be provided corresponding to the number of the recovery tubes, and the respective recovery tubes 42A, 42B may be connected to the plurality of second liquid recovery sections 41 respectively.

The liquid contact surface 2A of the optical element 2 of the projection optical system PL and the lower surface (liquid contact surface) 70A of the flow passage-forming member 70 are lyophilic or liquid-attractive (hydrophilic). In this embodiment, the liquid-attracting treatment is performed to the liquid contact surfaces of the optical element 2 and the flow passage-forming member 70. The liquid contact surfaces of the optical element 2 and the flow passage-forming member 70 are liquid-attractive owing to the liquid-attracting treatment. In other words, at least the liquid contact surface of the surface of the member opposed to the exposure objective surface (surface) of the substrate P held by the substrate stage PST is liquid-attractive. In this embodiment, the liquid LQ is water having the large polarity. Therefore, for example, as for the liquid-attracting treatment (water-attracting treatment), a thin film is formed with a substance such as alcohol having the molecular structure with the large polarity. Accordingly, the water-attracting property or the hydrophilicity is given (imparted) to the liquid contact surfaces of the optical element 2 and the flow passage-forming member 70. That is, when water is used as the liquid LQ, it is desirable that the treatment is performed such that the substance, which has the group such as the OH group having the large polarity in the molecule, is provided on the liquid contact surface. Alternatively, for example, $MgF_2$, $Al_2O_3$, or $SiO_2$ may be provided on the liquid contact surface.

In this embodiment, the lower surface (surface directed toward the substrate P) of the flow passage-forming member 70 is the substantially flat surface. However, it is also allowable to provide a surface which is inclined with respect to the XY plane, specifically an inclined surface (trap surface) which has a predetermined length and which is inclined so that the surface is separated away from the surface of the substrate P (the surface is directed upwardly) in a direction toward the outer side with respect to the projection area AR1 (liquid immersion area AR2), the surface being provided in the area disposed outside the auxiliary liquid recovery ports 43 (43A, 43B) with respect to the projection optical system PL, of the lower surface 70A of the flow passage-forming member 70. Accordingly, even when the liquid LQ, which is disposed between the projection optical system PL and the substrate P, attempts to outflow to the outside of the lower surface 70A of the flow passage-forming member 70 in accompanying with the movement of the substrate P, the liquid LQ is captured by the trap surface. Therefore, it is possible to avoid the outflow of the liquid LQ. In this arrangement, when the liquid-attracting treatment is performed to the trap surface to provide the liquid-attracting property, the liquid LQ, which outflows to the outside of the auxiliary liquid recovery ports 43, is captured by the trap surface. When the film coated to the surface of the substrate P (for example, the photosensitive material film such as the photoresist, the antireflection film, and/or the film to protect the photosensitive material from the liquid) is liquid-repellent (water-repellent), the liquid LQ, which outflows to the outside of the auxiliary liquid recovery ports 43, can be captured by the trap surface more reliably.

Figure 2:
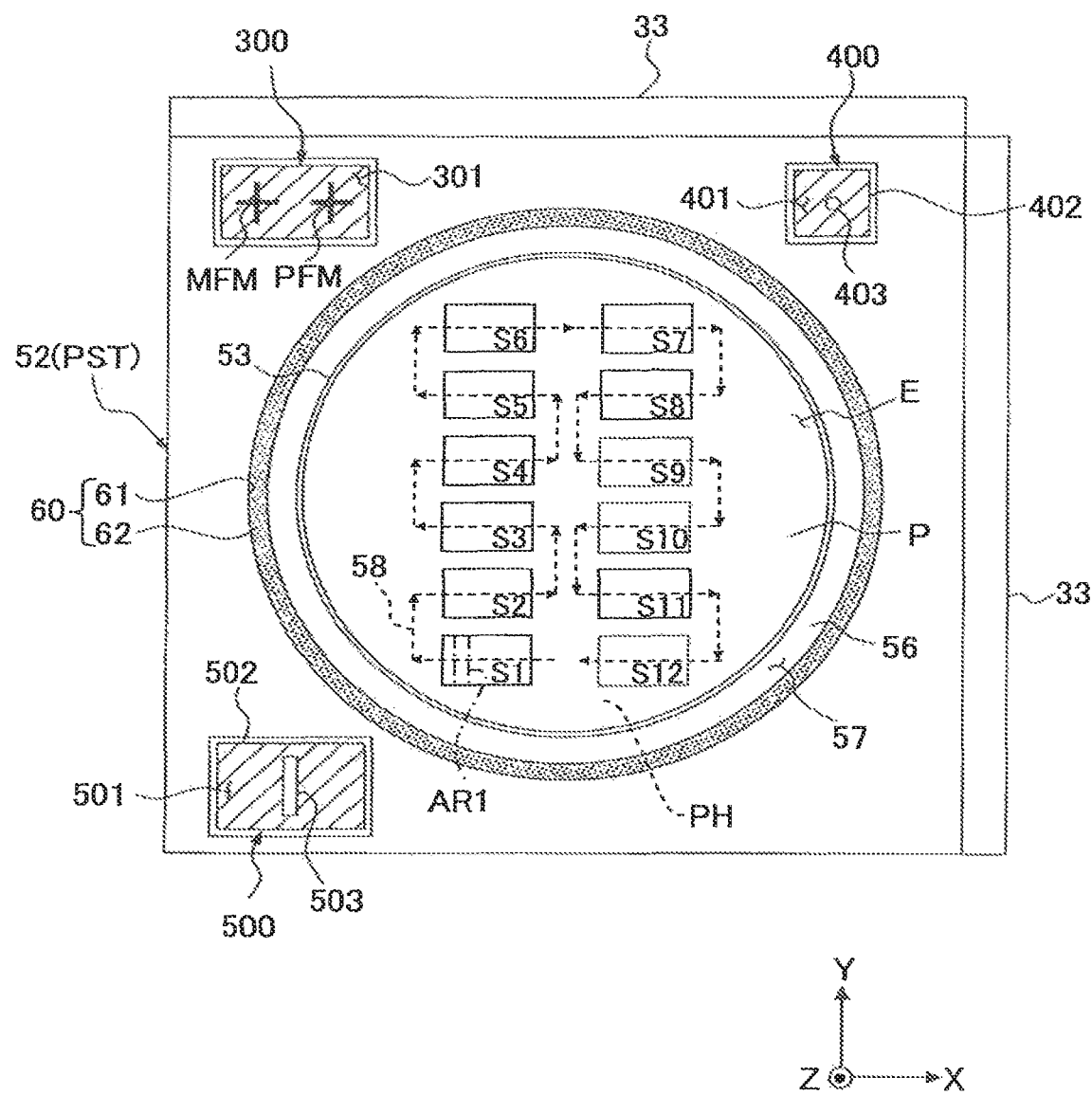
FIG. 2 shows a plan view illustrating a substrate stage.

FIG. 2 shows a plan view illustrating the substrate stage PST (Z tilt stage 52) as viewed from an upper position. As shown in FIG. 2, the movement mirrors 33 are provided at the two mutually perpendicular edges of the Z tilt stage 52 which is rectangular as viewed in a plan view. A substrate holder PH, which constructs a part of the Z tilt stage 52 for holding the substrate P, is arranged at an approximately central portion of the Z tilt stage 52. The plate member 56, which has the flat surface 57 having approximately the same height as that of (flush with) the surface of the substrate P, is provided around the substrate P. The plate member 56 is an annular member, which is arranged to surround the substrate P held by the substrate holder PH.

A reference member 300 is arranged at a predetermined position outside the plate member 56, on the Z tilt stage 52 (substrate stage PST). A reference mark PFM which is detected by the substrate alignment system and a reference mark MFM which is detected by the mask alignment system 360 are provided in a predetermined positional relationship on the reference member 300. The upper surface 301 of the reference member 300 is a substantially flat surface, and may be used as a reference surface for the focus/leveling-detecting system as well. The upper surface 301 of the reference member 300 is provided to have approximately the same height as those of (be flush with) the surface of the substrate P and the surface (flat surface) 57 of the plate member 56.

An uneven illuminance sensor 400, which is disclosed, for example, in Japanese Patent Application Laid-open No. 57-117238, is arranged as an optical sensor at a predetermined position outside the plate member 56 on the Z tilt stage 52 (substrate stage PST). The uneven illuminance sensor 400 is provided with an upper plate 402 which is rectangular as viewed in a plan view. The upper surface 401 of the upper plate 402 is a substantially flat surface, and is provided to have approximately the same height as those of (be flush with) the surface of the substrate P and the surface (flat surface) 57 of the plate member 56. A pinhole 403, through which the light is transmissive, is provided through the upper surface 401 of the upper plate 402. Portions of the upper surface 401 other than the pinhole 403 are coated with a light-shielding material such as chromium.

A spatial image-measuring sensor 500, which is disclosed, for example, in Japanese Patent Application Laid-open No. 2002-14005, is provided as an optical sensor at a predetermined position outside the plate member 56 on the Z tilt stage 52 (substrate stage PST). The spatial image-measuring sensor 500 is provided with an upper plate 502 which is rectangular as viewed in a plan view. The upper surface 501 of the upper plate 502 is a substantially flat surface, and may be used as a reference surface for the focus/leveling-detecting system as well. The upper surface 501 of the upper plate 502 is provided to have approximately the same height as those of (be flush with) the surface of the substrate P and the surface (flat surface) 57 of the plate member 56. A slit 503, through which the light is transmissive, is provided through the upper surface 501 of the upper plate 502. Portions of the upper surface 501 other than the slit 503 are coated with a light-shielding material such as chromium.

Although not shown, the Z tilt stage 52 (substrate stage PST) is also provided with a radiation amount sensor (illuminance sensor) which is disclosed, for example, in Japanese Patent Application Laid-open No. 11-16816. The upper surface of the upper plate of the radiation amount sensor is provided to have approximately the same height as those of (be flush with) the surface of the substrate P and the surface (flat surface) 57 of the plate member 56.

The exposure apparatus EX of the embodiment of the present invention performs the projection exposure for the substrate P with the image of the pattern of the mask M while moving the mask M and the substrate P in the X axis direction (scanning direction). During the scanning exposure, a part of the image of the pattern of the mask M is projected onto the portion included in the projection area AR1 via the projection optical system PL and the liquid LQ of the liquid immersion area AR2. The mask M is moved at the velocity V in the −X direction (or in the +X direction), in synchronization with which the substrate P is moved at the velocity β•V (β represents the projection magnification) in the +X direction (or in the −X direction) with respect to the projection area AR1. As shown in FIG. 2, a plurality of shot areas S1 to S12 are set on the substrate P. After the exposure is completed for one shot area, the next shot area is moved to the scanning start position in accordance with the stepping movement of the substrate P. The scanning exposure process is successively performed thereafter for the respective shot areas while moving the substrate P in the step-and-scan manner. In this embodiment, it is assumed that the control unit CONT moves the XY stage 51 while monitoring the output of the laser interferometer 34 so that the optical axis AX of the projection optical system PL is advanced along the broken lines indicated by the arrows 58 shown in FIG. 2.

As shown in FIG. 2, the projection area AR1 of the projection optical system PL is designed to be rectangular as viewed in a plan view, in which the Y axis direction is the longitudinal direction, and the X axis direction is the transverse direction. It is preferable that the flat surface 57 of the plate member 56, which is formed to have the annular shape, has the width which is formed to be larger than at least the projection area AR1. Accordingly, when the edge area E of the substrate P is subjected to the exposure, the exposure light beam EL is not radiated onto the outside of the plate member 56. Further, it is preferable that the width of the flat surface 57 is formed to be larger than the liquid immersion area AR2 which is formed on the image plane side of the projection optical system PL. Accordingly, when the edge area E of the substrate P is subjected to the liquid immersion exposure, then the liquid immersion area AR2 is formed on the flat surface 57 of the plate member 56, and the liquid immersion area AR2 is not formed outside the plate member 56. Therefore, it is possible to avoid the occurrence of the inconvenience which would be otherwise caused, for example, such that the liquid LQ of the liquid immersion area AR2 outflows to the outside of the plate member 56.

Figure 3:
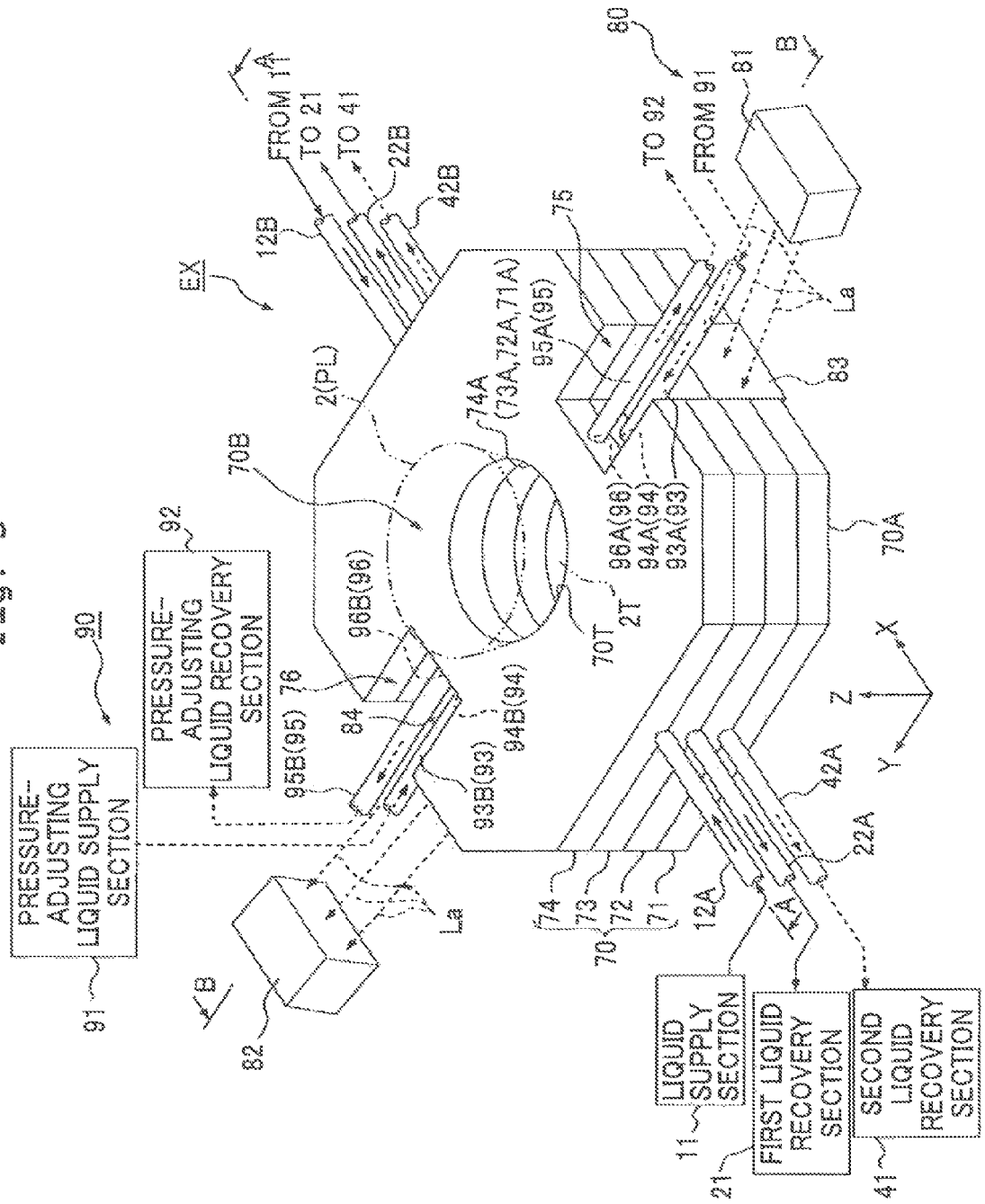
FIG. 3 shows a perspective view illustrating a flow passage-forming member.

FIG. 3 shows a schematic perspective view illustrating the flow passage-forming member 70. As shown in FIG. 3, the flow passage-forming member 70 is an annular member which is provided to surround the optical element 2 disposed at the terminal end of the projection optical system PL. The flow passage-forming member 70 includes a first member 71, a second member 72 which is arranged on the first member 71, a third member 73 which is arranged on the second member 72, and a fourth member 74 which is arranged on the third member 73. The first to fourth members 71 to 74, which construct the flow passage-forming member 70, are plate-shaped members respectively, and they have holes 71A to 74A which are disposed at central portions so that the projection optical system PL (optical element 2) may be arranged therein.

Grooves and through-holes are appropriately formed for the first to fourth members 71 to 74 respectively. When the grooves and the through-holes are connected to one another, the supply flow passages 14 and the recovery flow passages 24, 44 are formed in the flow passage-forming member 70 which is constructed of the first to fourth members 71 to 74.

The exposure apparatus EX is provided with the focus/leveling-detecting system 80 for detecting the surface position information about the surface of the substrate P held by the substrate stage PST. The focus/leveling-detecting system 80 is a focus/leveling-detecting system based on the so-called oblique incidence system. The focus/leveling-detecting system 80 includes a light-emitting section 81 which radiates the detecting light beam La in an oblique direction (from an obliquely upward position) onto the substrate P through the liquid LQ of the liquid immersion area AR2, and a light-receiving section 82 which receives the reflected light beam of the detecting light beam La reflected by the substrate P. An arrangement, which is disclosed, for example, in Japanese Patent Application Laid-open No. 8-37149, can be used for the focus/leveling-detecting system 80.

Recesses 75, 76, which are recessed toward the central portion (toward the projection optical system PL), are formed on the side surfaces on the −Y side and the +Y side, respectively, of the flow passage-forming member 70. A first optical member 83, through which the detecting light beam La radiated from the light-emitting section 81 of the focus/leveling-detecting system 80 is transmissive, is provided in the recess 75 formed on the one side surface. A second optical member 84, through which the detecting light beam La reflected on the substrate P is transmissive, is provided in the recess 76 formed on the other side surface. The first optical member 83 and the second optical member 84 construct parts of the optical system of the focus/leveling-detecting system 80, and they construct parts of the flow passage-forming member 70. In other words, in this embodiment, parts of the flow passage-forming member 70 also serve as parts of the focus/leveling-detecting system 80.

The flow passage-forming member 70, which includes the first optical member 83 and the second optical member 84, is supported in a state of being separated from the optical element 2 disposed at the end portion of the projection optical system PL.

The first optical member 83 and the second optical member 84 may be separated from the flow passage-forming member 70 which constructs parts of the flow passages of the liquid supply mechanism 10, the first liquid recovery mechanism 20, and the second liquid recovery mechanism 40. The flow passage-forming member 70 may be supported separately from the first and second optical members 83, 84.

The light-emitting section 81 and the light-receiving section 82 are provided on the both sides respectively with the projection area AR1 of the projection optical system PL intervening therebetween. In the example shown in FIG. 3, the light-emitting section 81 and the light-receiving section 82 are provided at the positions separated from the projection area AR1 on the ±Y sides respectively with the projection area AR1 intervening therebetween. The light-emitting section 81 of the focus/leveling-detecting system 80 radiates the detecting light beam La at a predetermined angle of incidence θ with respect to the optical axis AX of the projection optical system PL onto the surface of the substrate P. The detecting light beam La, which is emitted from the light-emitting section 81, passes through the first optical member 83, and the detecting light beam La is radiated at the angle of incidence θ in the oblique direction (from the obliquely upward position) onto the substrate P through the liquid LQ disposed on the substrate P. The reflected light beam of the detecting light beam La, which is reflected on the substrate P, passes through the second optical member 84, and then the reflected light beam is received by the light-receiving section 82. In this embodiment, the light-emitting section 81 of the focus/leveling-detecting system 80 radiates a plurality of detecting light beams La onto the substrate P. Accordingly, the focus/leveling-detecting system 80 can determine the respective focus positions at a plurality of respective points (respective positions) of, for example, a matrix form on the substrate P. It is possible to detect the position information in the Z axis direction about the surface of the substrate P and the information about the inclination of the substrate P in the θX and θY directions on the basis of the focus positions determined at the plurality of respective points.

The control unit CONT drives the Z tilt stage 52 of the substrate stage PST by the aid of the substrate stage-driving unit PSTD on the basis of the detection result obtained by the focus/leveling-detecting system 80 to thereby control the position (focus position) in the Z axis direction and the positions in the θX and θY directions of the substrate P held by the Z tilt stage 52 (see FIG. 1). That is, the Z tilt stage 52 is operated on the basis of the instruction from the control unit CONT based on the detection result obtained by the focus/leveling-detecting system 80. The focus position (Z position) and the angle of inclination of the substrate P are controlled so that the surface (exposure objective surface) of the substrate P is adjusted and matched to be in the optimum state with respect to the image plane formed by the aid of the projection optical system PL and the liquid LQ in the auto-focus manner and the auto-leveling manner.

As shown in FIG. 3, the exposure apparatus EX is provided with the pressure adjustment mechanism 90 which regulates or adjusts the pressure of the liquid LQ supplied from the liquid supply mechanism 10. The pressure adjustment mechanism 90 includes a pressure-adjusting liquid supply section 91 which is capable of further adding the liquid LQ to the liquid LQ supplied from the liquid supply mechanism 10, and a pressure-adjusting liquid recovery section 92 which is capable of recovering a part of the liquid LQ.

First ends of supply tubes 93 (93A, 93B) are connected to the pressure-adjusting liquid supply section 91. Second ends of the supply tubes 93 (93A, 93B) are connected to supply flow passages 94 (94A, 94B) formed in the flow passage-forming member 70. The pressure-adjusting liquid supply section 91 is provided with, for example, a pressurizing pump and a tank for accommodating the liquid LQ.

The second end of the supply tube 93A is arranged in the recess 75 of the flow passage-forming member 70. The first end of the supply flow passage 94A is formed on the side surface of the recess 75 of the flow passage-forming member 70. The second end of the supply tube 93A is connected to the first end of the supply flow passage 94A. The second end of the supply tube 93B is arranged in the recess 76 of the flow passage-forming member 70. The first end of the supply flow passage 94B is formed on the side surface of the recess 76 of the flow passage-forming member 70. The second end of the supply tube 93B is connected to the first end of the supply flow passage 94B.

First ends of recovery tubes 95 (95A, 95B) are connected to the pressure-adjusting liquid recovery section 92. Second ends of the recovery tubes 95 (95A, 95B) are connected to first ends of recovery flow passages 96 (96A, 96B) formed in the flow passage-forming member 70. The pressure-adjusting liquid recovery section 92 is provided with, for example, a vacuum system (suction unit) such as a vacuum pump, a gas/liquid separator for separating the recovered liquid LQ from the gas, and a tank for accommodating the recovered liquid LQ. As for the vacuum system, a vacuum system of a factory in which the exposure apparatus EX is installed may be used instead of providing the vacuum pump for the exposure apparatus EX.

The second end of the recovery tube 95A is arranged in the recess 75 of the flow passage-forming member 70. The first end of the recovery flow passage 96A is formed on the side surface of the recess 75 of the flow passage-forming member 70. The second end of the recovery tube 95A is connected to the first end of the recovery flow passage 96A.

The second end of the recovery tube 95B is arranged in the recess 76 of the flow passage-forming member 70. The first end of the recovery flow passage 96B is formed on the side surface of the recess 76 of the flow passage-forming member 70. The second end of the recovery tube 95B is connected to the first end of the recovery flow passage 96B.

Figure 4:
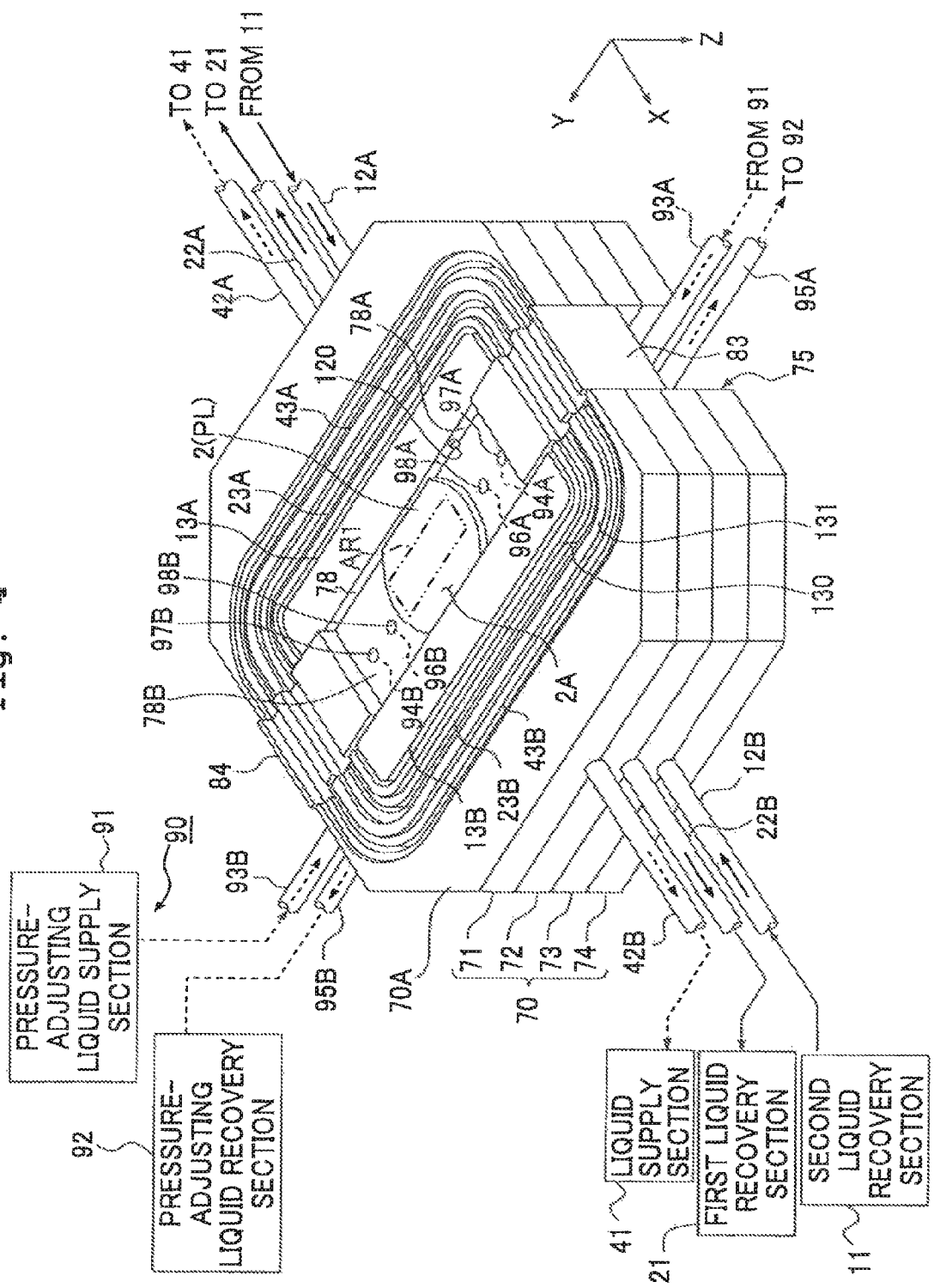
FIG. 4 shows a perspective view illustrating the flow passage-forming member as viewed from the a side of a lower surface.

FIG. 4 shows a perspective view illustrating the flow passage-forming member 70 as viewed from the side of the lower surface 70A. As shown in FIG. 4, the projection area AR1 of the projection optical system PL is designed to have the rectangular form in which the Y axis direction (non-scanning direction) is the longitudinal direction. The liquid immersion area AR2, which is filled with the liquid LQ (see FIG. 1), is locally formed on a part of the substrate P in the area substantially surrounded by the two liquid recovery ports 23A, 23B so that the projection area AR1 is included therein. It is enough that the liquid immersion area AR2 covers at least the projection area AR1. It is not necessarily indispensable that the entire area surrounded by the two liquid recovery ports 23A, 23B is the liquid immersion area.

The liquid supply ports 13A, 13B are provided on the both sides, respectively, in the scanning direction (X axis direction) with respect to the projection area AR1 on the lower surface 70A of the flow passage-forming member 70 opposed to the substrate P. Specifically, the liquid supply port 13A is provided on one side (−X side) in the scanning direction with respect to the projection area AR1 on the lower surface 70A of the flow passage-forming member 70. The liquid supply port 13B is provided on the other side (+X side). In other words, the liquid supply ports 13A, 13B are provided near to the projection area AR1, and they are provided on the both sides of the projection area AR1 so that the projection area AR1 is interposed in relation to the scanning direction (X axis direction). Each of the liquid supply ports 13A, 13B is formed to have a slit-shaped form which is substantially "]"-shaped (circular arc-shaped) as viewed in a plan view and which extends in the Y axis direction. The first and second optical members 83, 84 are arranged at the ends on the both sides in the Y axis direction respectively, of the lower surface 70A of the flow passage-forming member 70. The liquid supply ports 13A, 13B are formed over (across) the areas other than those in which the first and second optical members 83, 84 are arranged, of the lower surface 70A of the flow passage-forming member 70. The length of the liquid supply port 13A, 13B in the Y axis direction is longer than at least the length of the projection area AR1 in the Y axis direction. The liquid supply ports 13A, 13B are provided to surround at least the projection area AR1. The liquid supply mechanism 10 is capable of simultaneously supplying the liquid LQ on the both sides of the projection area AR1 by the aid of the liquid supply ports 13A, 13B (see FIG. 1).

The liquid recovery ports 23A, 23B are provided outside the liquid supply ports 13A, 13B of the liquid supply mechanism 10 with respect to the projection area AR1 on the lower surface 70A of the flow passage-forming member 70 opposed to the substrate P. The liquid recovery ports 23A, 23B are provided on the both sides in the scanning direction (X axis direction) respectively with respect to the projection area AR1. Specifically, the liquid recovery port 23A is provided on one side (−X side) in the scanning direction with respect to the projection area AR1 on the lower surface 70A of the flow passage-forming member 70. The liquid recovery port 23B is provided on the other side (+X side). Each of the liquid recovery ports 23A, 23B is formed to have a slit-shaped form which is substantially "]"-shaped (circular arc-shaped) as viewed in a plan view and which extends in the Y axis direction. The liquid recovery ports 23A, 23B are formed over (across) the areas other than those in which the first and second optical members 83, 84 are arranged, of the lower surface 70A of the flow passage-forming member 70. The liquid recovery ports 23A, 23B are provided to surround the liquid supply ports 13A, 13B.

The auxiliary liquid recovery ports 43A, 43B are provided outside the liquid recovery ports 23A, 23B of the first liquid recovery mechanism 20 (see FIG. 1) with respect to the projection area AR1 on the lower surface 70A of the flow passage-forming member 70 opposed to the substrate P. The auxiliary liquid recovery ports 43A, 43B are provided on the both sides in the scanning direction (X axis direction) respectively with respect to the projection area AR1. Specifically, the auxiliary liquid recovery port 43A is provided on one side (−X side) in the scanning direction with respect to the projection area AR1 on the lower surface 70A of the flow passage-forming member 70. The auxiliary liquid recovery port 43B is provided on the other side (+X side). Each of the auxiliary liquid recovery ports 43A, 43B is formed to have a slit-shaped form which is substantially "]"-shaped (circular arc-shaped) as viewed in a plan view and which extends in the Y axis direction. The auxiliary liquid recovery ports 43A, 43B are formed over (across) the areas other than those in which the first and second optical members 83, 84 are arranged, of the lower surface 70A of the flow passage-forming member 70. The auxiliary liquid recovery ports 43A, 43B are provided to surround the liquid supply ports 13A, 13B and the liquid recovery ports 23A, 23B.

In this arrangement, the liquid supply ports 13 are provided one by one on the both sides in the X axis direction of the projection area AR1 respectively. However, the liquid supply ports 13 may be divided into a plurality of portions, the number of which is arbitrary. Similarly, the liquid recovery ports 23 and the auxiliary liquid recovery ports 43 may be divided into a plurality of portions respectively.

The liquid supply ports 13, which are provided on the both sides in the X axis direction of the projection area AR1, are mutually formed to have approximately the same size (length) respectively. However, the liquid supply ports 13 may have mutually different sizes. Similarly, the liquid recovery ports 23, which are provided on the both sides in the X axis direction of the projection area AR1, may have mutually different sizes respectively. Further, the auxiliary liquid recovery ports 43, which are provided on the both sides in the X axis direction of the projection area AR1, may have mutually different sizes respectively.

The slit width of the supply port 13 may be the same as the slit width of the recovery port 23, 43. The slit width of the recovery port 23, 43 may be larger than the slit width of the supply port 13. On the contrary, the slit width of the recovery port 23, 43 may be smaller than the slit width of the supply port 13.

A recess 78, in which the Y axis direction is the longitudinal direction, is formed on the lower surface 70A of the flow passage-forming member 70 (first member 71). A pressure sensor 120, which detects the pressure of the liquid LQ, is provided on the inner wall surface 78A which is substantially parallel to the YZ plane and which is formed by the recess 78. The pressure sensor 120 is capable of detecting the pressure of the liquid LQ of the liquid immersion area AR2 formed between the substrate P and the lower surface 2A of the optical element 2 of the projection optical system PL and the lower surface 70A of the flow passage-forming member 70. The detection result obtained thereby is outputted to the control unit CONT. It is enough that the pressure sensor 120 is installed at such a position that the flow of the liquid LQ of the liquid immersion area AR2 is not affected, and the pressure sensor 120 is capable of making contact with the liquid LQ of the liquid immersion area AR2 at that position (position at which the pressure of the liquid LQ can be detected). The optical element 2, which is disposed at the end portion of the projection optical system PL, is exposed at the substantially central portion in the longitudinal direction of the recess 78 of the lower surface 70A of the flow passage-forming member 70.

Pressure-adjusting liquid recovery ports (pressure-adjusting recovery ports) 98A, 98B are provided on a flat portion 78B which is parallel to the XY plane and which is formed in the recess 78 on the lower surface 70A of the flow passage-forming member 70, the pressure-adjusting liquid recovery ports (pressure-adjusting recovery ports) 98A, 98B being disposed on the both sides in the non-scanning direction (Y axis direction) with respect to the projection area AR1 of the projection optical system PL respectively. The pressure-adjusting recovery ports 98A, 98B are connected to the second ends of the recovery flow passages 96A, 96B formed in the flow passage-forming member 70 respectively. The respective pressure-adjusting recovery ports 98A, 98B are connected to the pressure-adjusting liquid recovery section 92 via the recovery flow passages 96A, 96B and the recovery tubes 95A, 95B. The liquid LQ can be recovered via the pressure-adjusting recovery ports 98A, 98B by driving the pressure-adjusting liquid recovery section 92.

The pressure-adjusting recovery port 98A is provided on one side (−Y side) in the non-scanning direction with respect to the projection area AR1, in the recess 78 formed on the lower surface 70A of the flow passage-forming member 70. The pressure-adjusting recovery port 98B is provided on the other side (+Y side). The pressure-adjusting recovery ports 98A, 98B are provided in the vicinity of the projection area AR1 defined by the projection optical system PL, and they are arranged nearer to the projection area AR1 of the projection optical system PL than the liquid supply ports 13A, 13B of the liquid supply mechanism 10.

The pressure-adjusting liquid recovery section 92 has a vacuum system, which is capable of discharging (providing the negative pressure of) the gas disposed on the image plane side of the projection optical system PL by the aid of the pressure-adjusting recovery ports 98A, 98B arranged in the vicinity of the optical element 2 disposed on the image plane side of the projection optical system PL. That is, the pressure adjustment mechanism 90, which includes the pressure-adjusting liquid recovery section 92 and the pressure-adjusting recovery ports 98A, 98B, has the function to serve as the gas discharge mechanism for discharging the gas disposed on the image plane side of the projection optical system PL. Such a gas discharge mechanism may be provided distinctly (may be different) from the pressure adjustment mechanism 90.

Pressure-adjusting liquid supply ports (pressure-adjusting supply ports) 97A, 97B are provided on the flat portion 78B which is formed in the recess 78 on the lower surface 70A of the flow passage-forming member 70, the pressure-adjusting liquid supply ports (pressure-adjusting supply ports) 97A, 97B being disposed on the both sides in the non-scanning direction (Y axis direction) with respect to the projection area AR1 of the projection optical system PL respectively. The pressure-adjusting supply ports 97A, 97B are connected to the second ends of the supply flow passages 94A, 94B formed in the flow passage-forming member 70 respectively. The respective pressure-adjusting supply ports 97A, 97B are connected to the pressure-adjusting liquid supply section 91 via the supply flow passages 94A, 94B and the supply tubes 93A, 93B. The liquid LQ can be supplied via the pressure-adjusting supply ports 97A, 97B by driving the pressure-adjusting liquid supply section 91.

The pressure-adjusting supply port 97A is provided on one side (−Y side) in the non-scanning direction with respect to the projection area AR1, in the recess 78 formed on the lower surface 70A of the flow passage-forming member 70. The pressure-adjusting supply port 97B is provided on the other side (+Y side). The pressure-adjusting supply ports 97A, 97B are provided in the vicinity of the projection area AR1 defined by the projection optical system PL, and they are arranged nearer to the projection area AR1 of the projection optical system PL than the liquid supply ports 13A, 13B of the liquid supply mechanism 10.

The liquid supply ports 13A, 13B are provided to surround the projection area AR1, the pressure-adjusting supply ports 97 (97A, 97B), and the pressure-adjusting recovery ports 98 (98A, 98B).

In this embodiment, the pressure-adjusting supply ports 97A, 97B are provided outside the pressure-adjusting recovery ports 98A, 98B with respect to the projection area AR1 of the projection optical system PL. However, the pressure-adjusting supply ports 97A, 97B may be provided inside of the pressure-adjusting recovery ports 98A, 98B with respect to the projection area AR1. Alternatively, the pressure-adjusting supply ports 97A, 97B and the pressure-adjusting recovery ports 98A, 98B may be provided closely to one another. Further alternatively, for example, the pressure-adjusting supply ports 97A, 97B may be provided on the both sides of the projection area AR1 in relation to the X axis direction (or the Y axis direction) respectively, and the pressure-adjusting recovery ports 98A, 98B may be provided on the both sides of the projection area AR1 in relation to the Y axis direction (or the X axis direction) respectively. In this arrangement, the distance between the projection area AR1 and the pressure-adjusting supply port 97A, 97B and the distance between the projection area AR1 and the pressure-adjusting recovery port 98A, 98B may be different from each other or substantially equal to one another.

Figure 5:
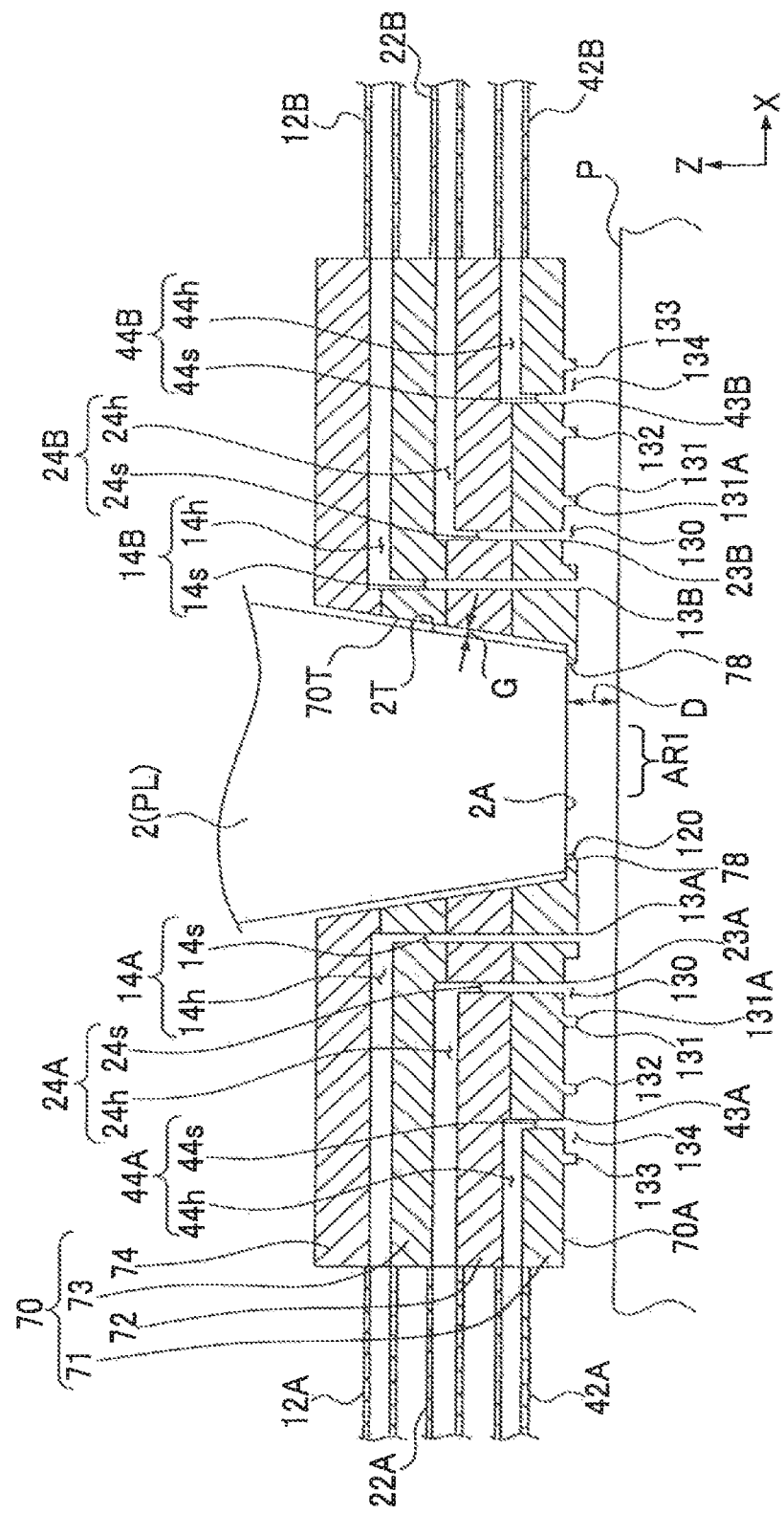
FIG. 5 shows a sectional view taken along A-A as indicated by arrows shown in FIG. 3.
Figure 6:
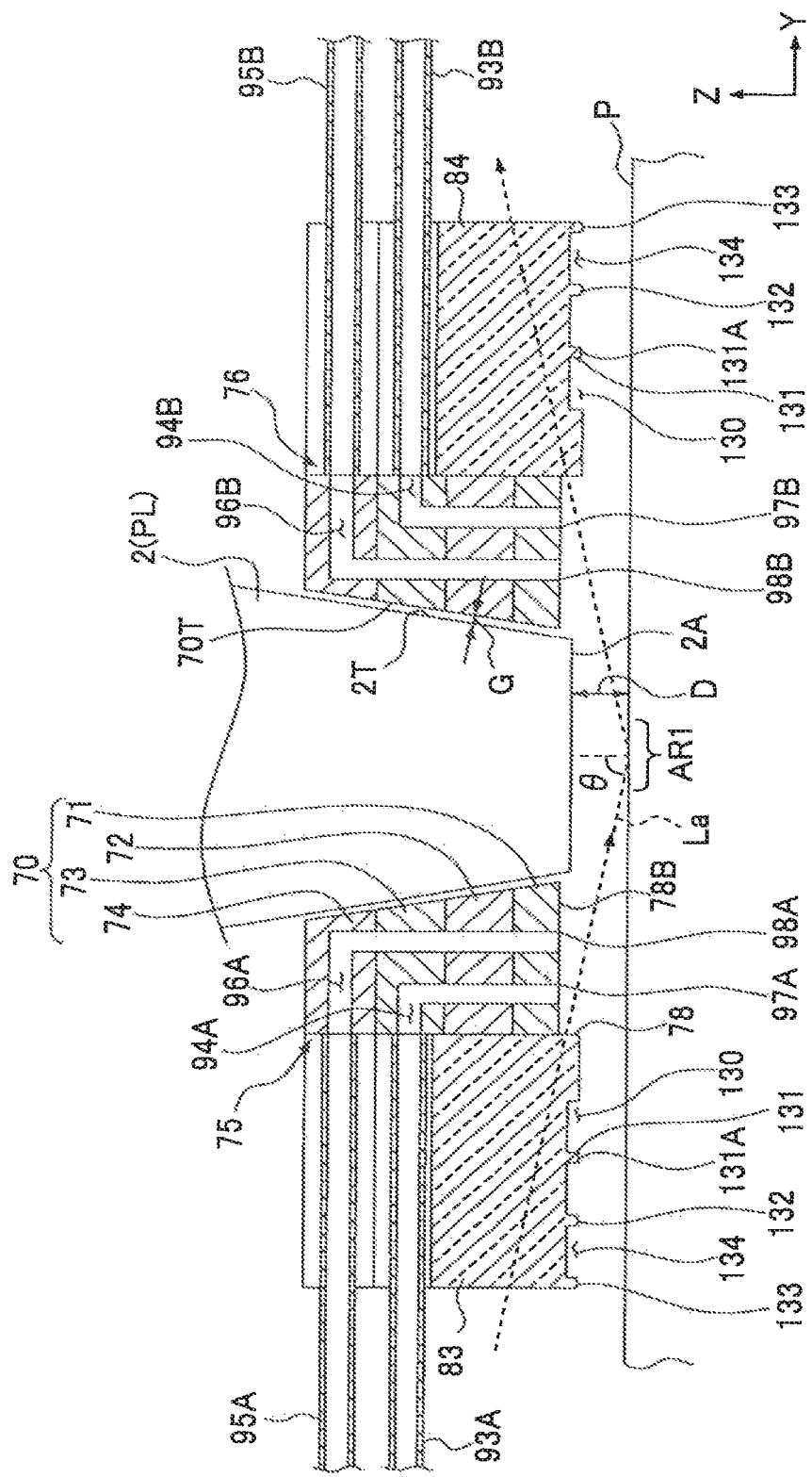
FIG. 6 shows a sectional view taken along B-B as indicated by arrows shown in FIG. 3.

FIG. 5 shows a sectional view taken along A-A as indicated by arrows shown in FIG. 3, and FIG. 6 shows a sectional view taken along B-B as indicated by arrows shown in FIG. 3. As shown in FIG. 5, the first ends of the supply flow passages 14A, 14B are connected to the supply tubes 12A, 12B respectively, and the second ends thereof are connected to the liquid supply ports 13A, 13B respectively. Each of the supply flow passages 14A, 14B has a horizontal flow passage portion 14$h$ and a vertical flow passage portion 14$s$. The liquid LQ, which is supplied from the liquid supply section 11 (see FIG. 1) via the supply tubes 12A, 12B, is allowed to flow into the supply flow passages 14A, 14B. The liquid LQ is allowed to flow substantially in the horizontal direction (direction of the XY plane) through the horizontal flow passage portions 14$h$. After that, the flow passages are bent substantially perpendicularly, and the liquid LQ is allowed to flow in the vertical direction (−Z direction) through the vertical flow passage portions 14$s$. The liquid LQ is supplied onto the substrate P from the positions over or above the substrate P from the liquid supply ports 13A, 13B.

The first ends of the recovery flow passages 24A, 24B are connected to the recovery tubes 22A, 22B respectively, and the second ends thereof are connected to the liquid recovery ports 23A, 23B respectively. Each of the recovery flow passages 24A, 24B has a horizontal flow passage portion 24$h$ and a vertical flow passage portion 24$s$. When the first liquid recovery section 21 (see FIG. 1), which has the vacuum system, is driven, the liquid LQ, which is disposed on the substrate P, is allowed to flow vertically upwardly (in the +Z direction) into the recovery flow passages 24A, 24B via the liquid recovery ports 23A, 23B which are provided over the substrate P. The liquid LQ is allowed to flow through the vertical flow passage portions 24$s$. In this situation, the gas (air), which is present in the surroundings, is also allowed to flow (recovered) together with the liquid LQ disposed on the substrate P from the liquid recovery ports 23A, 23B. The liquid LQ, which is allowed to flow in the +Z direction into the recovery flow passages 24A, 24B, is subjected to the change of the direction of the flow into the substantially horizontal direction. After that, the liquid LQ is allowed to flow substantially in the horizontal direction through the horizontal flow passage portions 24$h$. After that, the liquid LQ is sucked and recovered by the first liquid recovery section 21 via the recovery tubes 22A, 22B.

The first ends of the recovery flow passages 44A, 44B are connected to the recovery tubes 42A, 42B respectively, and the second ends thereof are connected to the auxiliary liquid recovery ports 43A, 43B. Each of the recovery flow passages 44A, 44B has a horizontal flow passage portion 44$h$ and a vertical flow passage portion 44$s$. When the second liquid recovery section 41 (see FIG. 1), which has the vacuum system, is driven, the liquid LQ, which is disposed on the substrate P, is allowed to flow vertically upwardly (in the +Z direction) into the recovery flow passages 44A, 44B via the auxiliary liquid recovery ports 43A, 43B. The liquid LQ is allowed to flow through the vertical flow passage portions 44$s$. In this situation, the gas (air), which is present in the surroundings, is also allowed to flow (recovered) together with the liquid LQ disposed on the substrate P from the auxiliary liquid recovery ports 43A, 43B. The liquid LQ, which is allowed to flow in the +Z direction into the recovery flow passages 44A, 44B, is subjected to the change of the direction of the flow into the substantially horizontal direction. After that, the liquid LQ is allowed to flow substantially in the horizontal direction through the horizontal flow passage portions 44$h$. After that, the liquid LQ is sucked and recovered by the second liquid recovery section 41 via the recovery tubes 42A, 42B.

A gap G is provided between the flow passage-forming member 70 and the optical element 2 of the projection optical system PL. The gap G is provided in order that the optical element 2 of the projection optical system PL is isolated from the flow passage-forming member 70 in terms of vibration. The liquid supply mechanism 10, the first liquid recovery mechanism 20, and the second liquid recovery mechanism 40, which include the flow passage-forming member 70, are supported by the support mechanism distinct from that for the projection optical system PL respectively, and these components are isolated from each other in terms of vibration. Accordingly, the vibration, which is generated in the liquid supply mechanism 10, the first liquid recovery mechanism 20, and the second liquid recovery mechanism 40 including the flow passage-forming member 70, is prevented from being transmitted toward the projection optical system PL.

The inner side surface 70T of the flow passage-forming member 70 and the side surface 2T of the optical element 2, which form the gap G, are liquid-repellent respectively. Specifically, the inner side surface 70T and the side surface 2T have the liquid repellence by performing the liquid-repelling treatment respectively. The following liquid-repelling treatment may be adopted. That is, a liquid-repellent material such as a fluorine-based resin material, an acrylic resin material, or a silicon-based resin material is coated. Alternatively, a thin film composed of the liquid-repellent material as described above is stuck. The film, which is provided for the surface treatment, may a single layer film or a film formed of a plurality of layers. On the other hand, as described above, the liquid contact surface 2A of the optical element 2 of the projection optical system PL and the lower surface (liquid contact surface) 70A of the flow passage-forming member 70 including the lower surfaces of the first and second optical members 83, 84 have the lyophilicity or liquid-attracting property (hydrophilicity).

A groove 130 is formed outside the liquid supply ports 13A, 13B with respect to the projection area AR1, on the lower surface 70A of the flow passage-forming member 70. The liquid recovery ports 23A, 23B are formed in the groove 130 on the lower surface 70A of the flow passage-forming member 70. The groove 130 is formed to extend along the liquid recovery ports 23 on the lower surface 70A of the flow passage-forming member 70. Further, as appreciated from FIGS. 4 and 6, the groove 130 is formed continuously on the lower surfaces of the first and second optical members 83, 84 as well. The groove 130 is formed in an annular form to surround the projection area AR1. An annular wall 131 is formed outside the groove 130 with respect to the projection area AR1. The wall 131 is a projection which protrudes toward the substrate P. In this embodiment, the distance between the substrate P and the lower surface 131A of the wall 131 is approximately the same as the distance D between the substrate P and the lower surface 2A of the optical element 2 of the projection optical system PL. The wall 131 is capable of retaining the liquid LQ in at least of a part of the area disposed inside the wall 131 including the groove 130.

Figure 7:
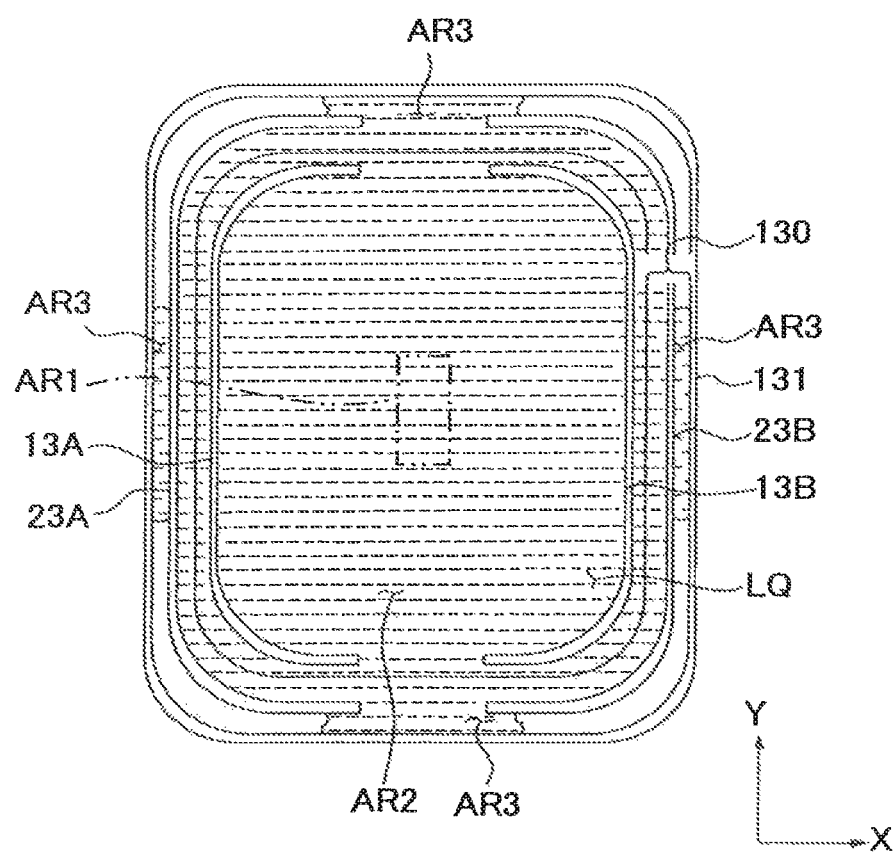
FIG. 7 schematically shows a liquid immersion area and a supplementary liquid immersion area.

FIG. 7 shows a plan view illustrating the positional relationship among the liquid supply ports 13A, 13B, the liquid recovery ports 23A, 23B, the groove 130, and the wall 131. The liquid LQ, which is supplied from the liquid supply ports 13A, 13B, forms the liquid immersion area AR2 between the substrate P and the optical element 2 of the projection optical system PL. Further, a part of the groove 130 as the area disposed inside the wall 131 is filled with the liquid LQ to form a supplementary liquid immersion area AR3. All of the groove 130 is not always filled with the liquid LQ. A part thereof is filled with the liquid LQ to form the supplementary liquid immersion area AR3. As described above, the wall 131 is provided outside the liquid recovery ports 23A, 23B, and the groove (buffer section) 130 is formed so that the liquid recovery ports 23A, 23B are included. Accordingly, the supplementary liquid immersion area AR3, which retains the liquid LQ, is formed outside the liquid immersion area AR2. In this arrangement, the liquid LQ of the liquid immersion area AR2 and the liquid LQ of the supplementary liquid immersion area AR3 are disposed closely to one another while making tight contact with each other. The liquid LQ can come and go (flow) between the liquid immersion area AR2 and the supplementary liquid immersion area AR3. The surfaces of the wall 131 and the groove 130 are liquid-attractive, for example, in the same manner as the optical element 2. Therefore, the liquid LQ of the liquid immersion area AR2 is continued to the liquid LQ of the supplementary liquid immersion area AR3 without making any separation.

The liquid LQ, which is supplied from the liquid supply mechanism 10 onto the substrate P, forms the liquid immersion area AR2 to cover the projection area AR1 by filling, with the liquid LQ, the space between the substrate P and the optical element 2 of the projection optical system PL. Further, the liquid LQ is continuously supplied after the liquid immersion area AR2 is formed as well. Accordingly, a part of the outer area of the liquid immersion area AR2 is also filled with the liquid LQ to form the supplementary liquid immersion area AR3. After the liquid immersion area AR2 and the supplementary liquid immersion area AR3 are formed, the first liquid recovery mechanism 20 is driven while making the setting such that the supply amount of the liquid LQ is substantially the same as the recovery amount or the supply amount slightly exceeds the recovery amount, and this state is maintained. Accordingly, the supplementary liquid immersion area AR3 is formed, for example, with the liquid LQ having the same amount as the amount which is equal to or greater than the amount of the liquid LQ for forming the liquid immersion area AR2 by not less than about 10 to 20% when the exposure is started.

Figure 8:
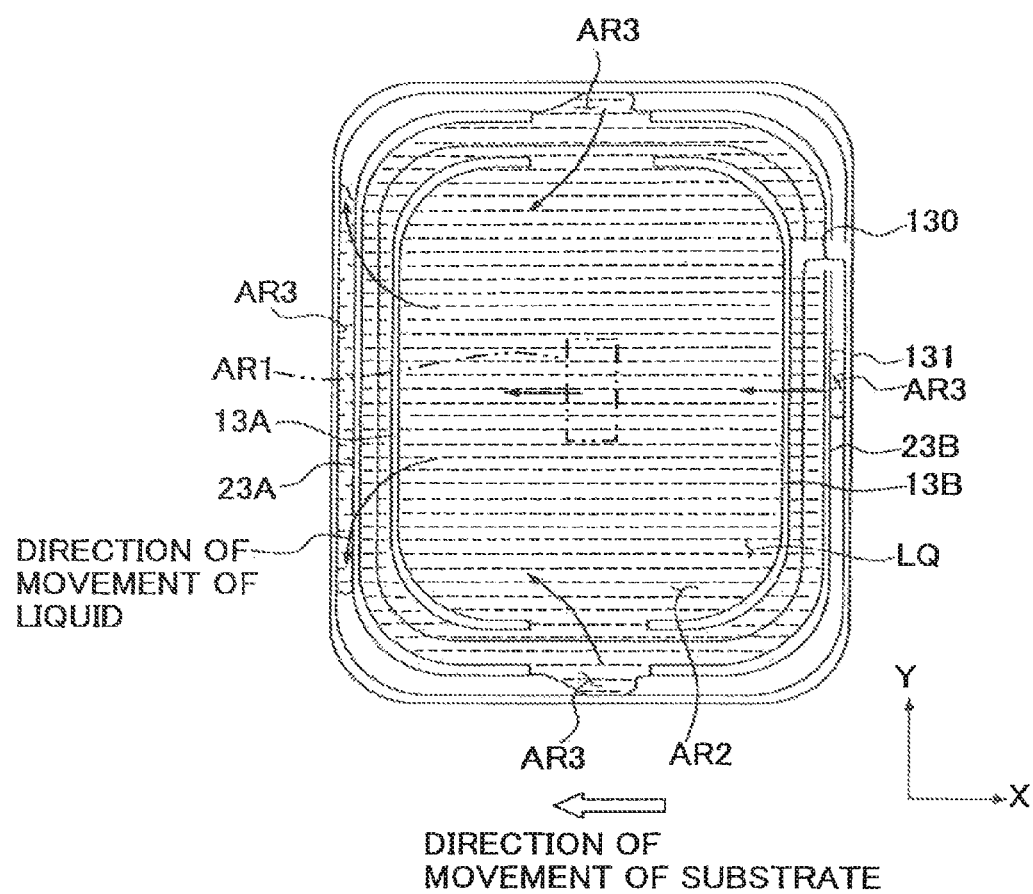
FIG. 8 schematically shows the liquid immersion area and the supplementary liquid immersion area.

FIG. 8 schematically shows the behavior of the supplementary liquid immersion area AR3 during the scanning exposure. As explained in relation to FIG. 2, the substrate P is moved in the XY directions with respect to the projection optical system PL during the scanning exposure (stepping movement and scanning movement) of the substrate P. The liquid LQ, which is disposed on the lower surface 2A of the optical element 2 of the projection optical system PL, i.e., which is disposed in the liquid immersion area AR2, is moved in the direction in conformity with the direction of the movement of the substrate P while being pulled by the movement of the substrate P. In particular, during the scanning exposure, the amount of movement of the liquid LQ is increased, because the substrate P is moved at the high velocity (for example, about 400 mm/second). In this situation, when the liquid LQ is moved together with the substrate P, the following possibility arises. That is, the exfoliation of the liquid LQ may be caused at a part (on the backward side in the direction of movement of the substrate P) of the lower surface 2A of the projection optical system PL, and the liquid immersion area AR2 may be formed unsatisfactorily. As a result, the exposure accuracy may be deteriorated. However, owing to the additional provision of the supplementary liquid immersion area AR3 outside the liquid immersion area AR2, the liquid LQ, which is disposed in the liquid immersion area AR2, is allowed to flow into the supplementary liquid immersion area AR3 on the front side of the direction of movement of the substrate P, when the substrate P is moved. Simultaneously, the liquid LQ, which is disposed in the supplementary liquid immersion area AR3 on the backward side in the direction of movement of the substrate P, is allowed to flow into the liquid immersion area AR2. That is, the supplementary liquid immersion area AR3 functions as a supplementary tank for the liquid immersion area AR2. As the substrate P is moved, the liquid LQ allowed to outflow from the liquid immersion area AR2 is recovered, while the liquid LQ is supplied to the liquid immersion area AR2. Accordingly, the outflow of the liquid LQ is avoided, and the shortage of the liquid LQ in the liquid immersion area AR2 is supplemented. It is possible to always fill the liquid immersion area AR2 with the liquid LQ. All of the area is not completely filled with the liquid LQ in relation to the area in which the supplementary liquid immersion area AR3 is formed, i.e., the area which is surrounded by the wall 131. Therefore, the liquid LQ, which is recovered from the liquid immersion area AR2 to the supplementary liquid immersion area AR3, can remain in the area surrounded by the wall 131 without causing any leakage to the outside of the wall 131.

Further, for example, when the direction of movement of the substrate P is reversed, then the liquid LQ, which has been recovered by the supplementary liquid immersion area AR3, is returned to the liquid immersion area AR2. On the other hand, the liquid LQ in the liquid immersion area AR2 is moved so that the liquid LQ is returned to the supplementary liquid immersion area AR3. Even when the substrate P makes the reciprocating movement in the non-scanning direction, or even when the substrate P repeats the movement in the scanning direction and the movement in the non-scanning direction, then the liquid LQ similarly comes and goes between the liquid immersion area AR2 and the supplementary liquid immersion area AR3. Thus, the liquid immersion area AR2 can be always filled with the liquid LQ.

In this arrangement, the distance between the substrate P and the lower surface 131A of the wall 131 is approximately the same as the distance D between the substrate P and the lower surface 2A of the optical element 2 of the projection optical system PL. However, the both may be different from each other. For example, it is allowable that the distance between the substrate P and the lower surface 131A of the wall 131 is smaller than the distance D between the substrate P and the lower surface 2A of the optical element 2. It is also allowable that the relationship, which is reverse to the above, is established. It is preferable that the distance between the substrate P and the lower surface 131A of the wall 131 is as small (narrow) as possible. The smaller distance makes it possible to retain the liquid LQ reliably by the surface tension of the liquid LQ, and thus it is possible to avoid the outflow of the liquid LQ to the outside. On the other hand, as the distance between the substrate P and the lower surface 131A of the wall 131 is smaller, the possibility is greater to cause the inconvenience of the interference with the substrate P or the like. Therefore, the occurrence of the inconvenience can be avoided as in this embodiment such that the lower surface 131A of the wall 131 is formed to be at approximately the same position (in the Z direction) as that of the lower surface 2A of the optical element 2 of the projection optical system PL.

Similarly, as shown in FIGS. 5 and 6, a second wall 132 and a third wall 133 are formed outside the wall 131 with respect to the projection area AR1, on the lower surface 70A of the flow passage-forming member 70. The auxiliary liquid recovery sections 43A, 43B are provided in a groove 134 which is formed between the second wall 132 and the third wall 133. It is possible to avoid the outflow of the liquid LQ to the outside of the substrate P more reliably by the second and third walls 132, 133.

As shown in FIG. 6, the recess 78 is formed on the lower surface 70A of the flow passage-forming member 70. The flat portion 78B, which is formed in the recess 78, is higher (farther from the substrate P) than the liquid contact surface 2A of the optical element 2 of the projection optical system PL and the lower surfaces of the first and second optical members 83, 84. In other words, stepped portions are formed between the flat portion 78B in the recess 78 of the flow passage-forming member 70 and the first and second optical members 83, 84, and a stepped portion is also formed between the lower surface of the recess 78 of the flow passage-forming member 70 and the liquid contact surface 2A of the optical element 2. That is, the flat portion 78B in the recess 78 of the lower surface 70A of the flow passage-forming member 70 is formed at the highest position in relation to the vertical direction (Z direction). Further, the flat portion 78B is formed at the position higher than the lower surface 2A of the optical element 2 of the projection optical system PL in relation to the vertical direction (Z direction).

In the case of an arrangement in which the recess 78 is not provided for the lower surface 70A of the flow passage-forming member 70, i.e., when the lower surface 70A of the flow passage-forming member 70, the lower surface (liquid contact surface) 2A of the optical element 2, and the lower surfaces of the first and second optical members 83, 84 are flush with each other, if it is intended to radiate the detecting light beam La of the focus/leveling-detecting system 80 (see FIG. 3) onto the desired area (onto the projection area AR1 in this case) of the substrate P at the predetermined angle of incidence θ, for example, the following inconvenience arises. That is, for example, the flow passage-forming member 70 is arranged on the optical path for the detecting light beam La, and the radiation of the detecting light beam La is inhibited in some cases. In other cases, it is necessary to change the angle of incidence θ and/or the distance (working distance) D between the surface of the substrate P and the lower surface (liquid contact surface) 2A of the optical element 2 of the projection optical system PL in order to secure the optical path for the detecting light beam La. However, the recess 78 is provided to make continuation to the first and second optical members 83, 84 for constructing the focus/leveling-detecting system 80, of the lower surface 70A of the flow passage-forming member 70. Accordingly, the detecting light beam La can be radiated onto the desired area on the substrate P by securing the optical path for the detecting light beam La of the focus/leveling-detecting system 80, while maintaining a desired value of the distance D between the surface of the substrate P and the lower surface (liquid contact surface) 2A of the optical element 2 of the projection optical system PL.

Figure 9:
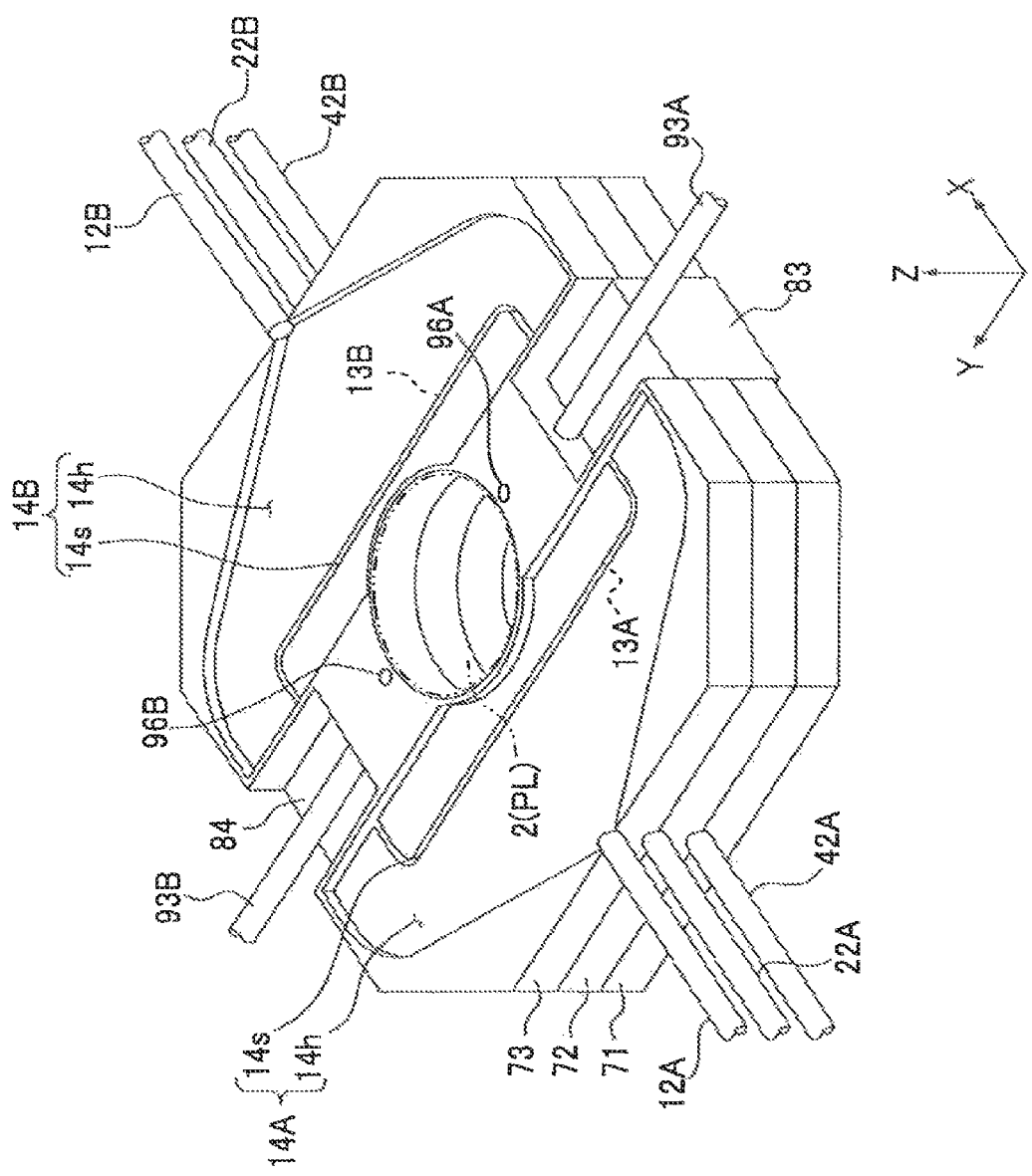
FIG. 9 shows a perspective view illustrating a state in which a fourth member of flow passage-forming member is removed.

FIG. 9 shows a perspective view illustrating a state in which the fourth member 74 is removed from the flow passage-forming member 70 to be formed by the first to fourth members 71 to 74. As shown in FIG. 9, slits as through-holes, which form the vertical flow passage portions 14s of the supply flow passages 14, are formed on the −X side and the +X side of the third member 73 with respect to the projection optical system PL respectively. Although not shown, slits, which are connected to the slits described above when the second member 72 makes contact with the third member 73, are formed for the second member 72. Similar slits are also formed for the first member 71. The vertical flow passage portions 14s are formed by connecting the first to third members 71 to 73 to connect the slits to one another. Tapered grooves, which form the horizontal flow passage portions 14h to connect the supply tubes 12A, 12B and the vertical flow passage portions 14s respectively, are formed on the upper surface of the third member 73. The tapered grooves, which form the horizontal flow passage portions 14h, are formed to progressively spread (widen) in the horizontal direction from the connecting portions with respect to the supply tubes 12A, 12B toward the vertical flow passage portions 14s. When the horizontal flow passage portions 14h are formed to have the tapered form as described above, then the liquid LQ, which is supplied from the liquid supply section 11 via the supply tubes 12A, 12B, is sufficiently spread in the Y axis direction in the horizontal flow passage portions 14h, and then the liquid LQ is supplied onto the substrate P via the vertical flow passage portions 14s. Therefore, the liquid LQ can be simultaneously supplied to the wide area on the substrate P.

Figure 10:
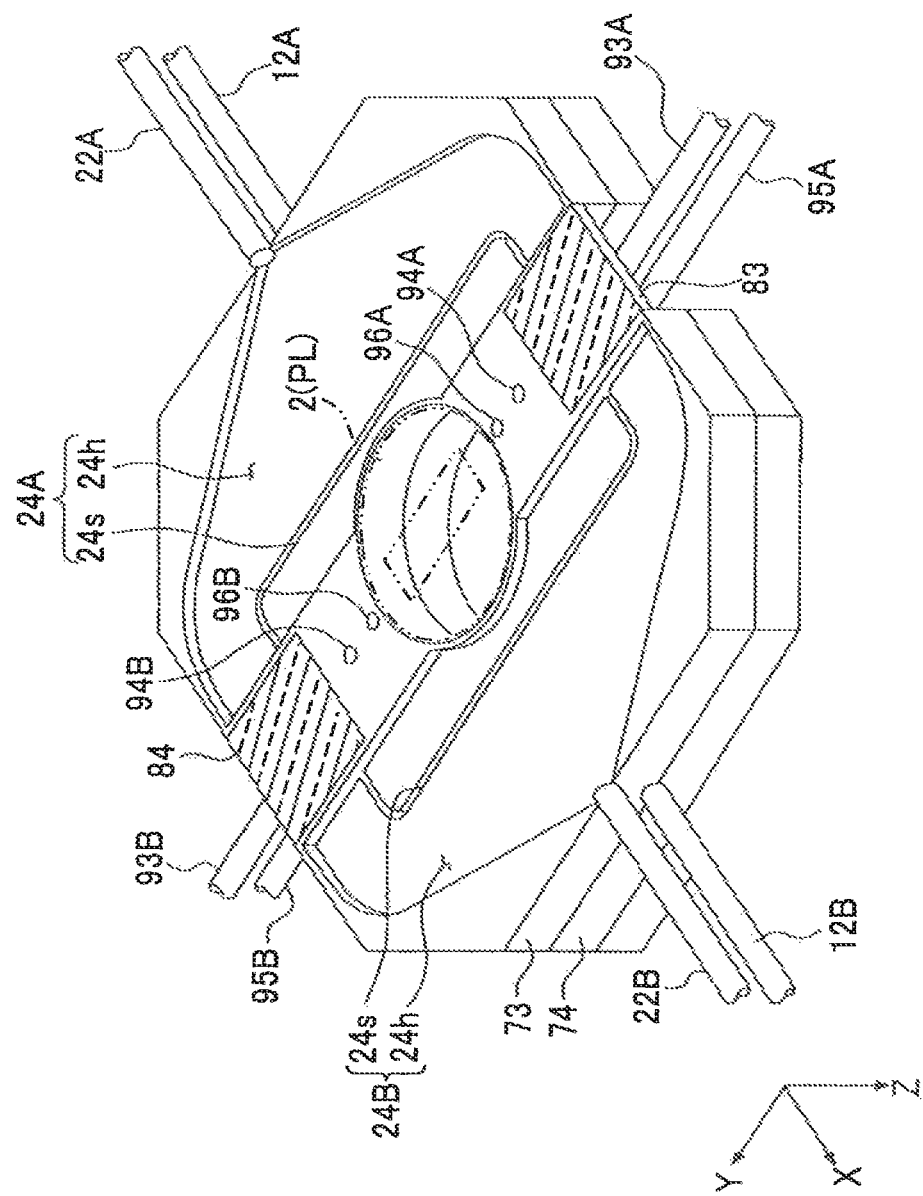
FIG. 10 shows a perspective view as viewed from the side of the lower surface, illustrating a state in which first and second members of the flow passage-forming member are removed.

FIG. 10 shows a perspective view as viewed from the side of the lower surface 70A, illustrating a state in which the first and second members 71, 72 are removed from the flow passage-forming member 70 to be formed by the first to fourth members 71 to 74. As shown in FIG. 10, slits as through-holes, which form the vertical flow passage portions 24s of the supply flow passages 24, are formed on the −X side and the +X side of the third member 73 with respect to the projection optical system PL respectively. Although not shown, slits, which are connected to the slits described above when the second member 72 makes contact with the third member 73, are formed for the second member 72. Similar slits are also formed for the first member 71. The vertical flow passage portions 24s are formed by connecting the first to third members 71 to 73 to connect the slits to one another. Tapered grooves, which form the horizontal flow passage portions 24h to connect the recovery tubes 22A, 22B and the vertical flow passage portions 24s respectively, are formed on the lower surface of the third member 73. The tapered grooves, which form the horizontal flow passage portions 24h, are formed to be progressively narrower (tapered off) in the horizontal direction from the vertical flow passage portions 24s toward the connecting portions with respect to the recovery tubes 22A, 22B. When the horizontal flow passage portions 24h are formed to have the tapered form as described above, then the distribution of the liquid recovery force is uniformized at the liquid recovery ports 23A, 23B in which the Y axis direction is the longitudinal direction. The liquid LQ can be simultaneously recovered from the wide area on the substrate P by the aid of the liquid recovery ports 23A, 23B.

Next, an explanation will be made with reference to schematic illustrations shown in FIGS. 11(a)-11(d) about a method for exposing the substrate P with the image of the pattern on the mask M by using the exposure apparatus EX constructed as described above.

Figure 11A:
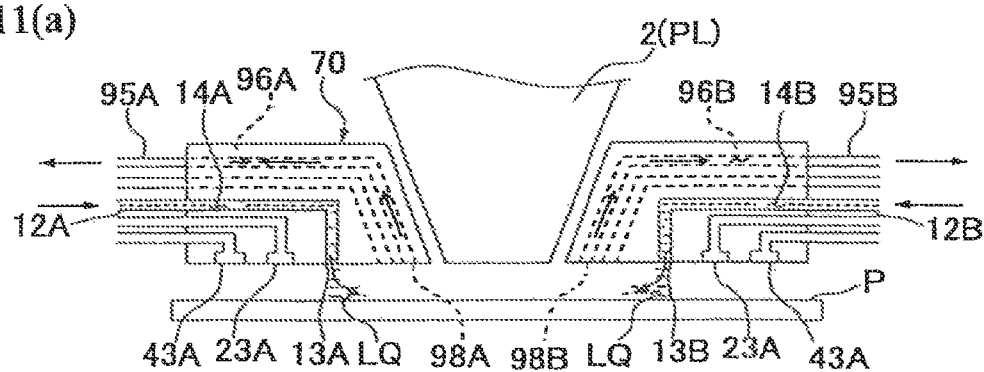
FIGS. 11(a) to 11(d) schematically show an example of the operation of the exposure apparatus of the present invention.
Figure 11B:
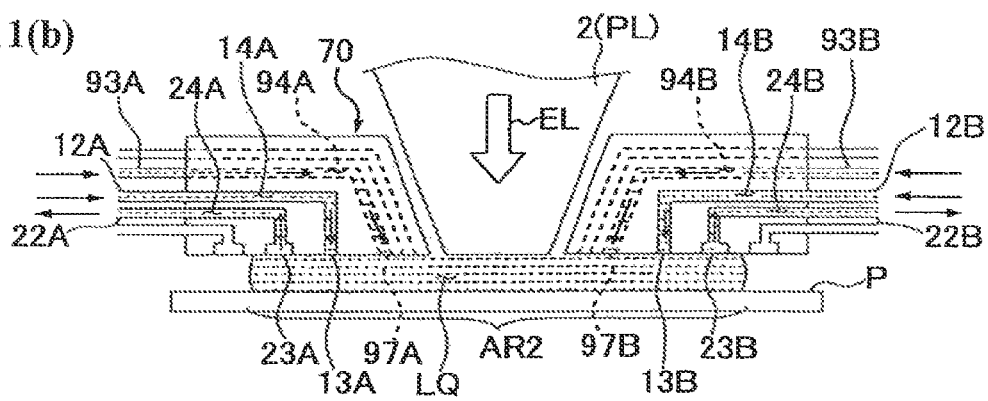
Figure 11C:
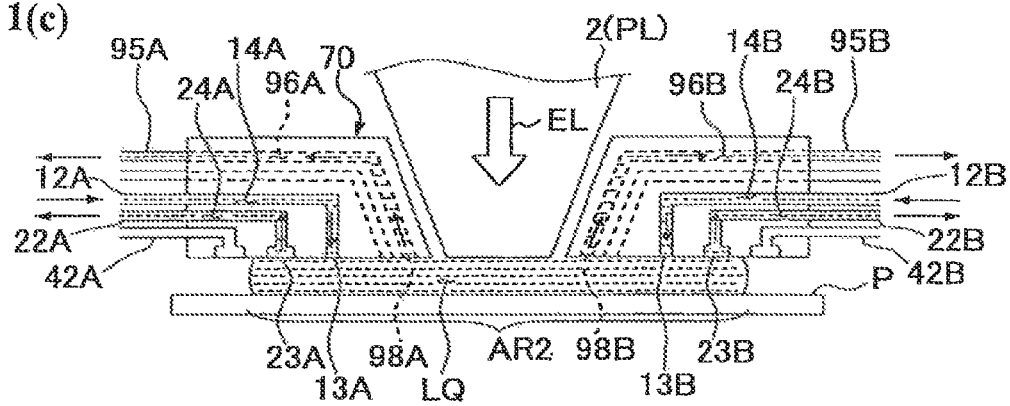

When the scanning exposure process is performed for the substrate P after the mask M is loaded on the mask stage MST and the substrate P is loaded on the substrate stage PST, the control unit CONT drives the liquid supply mechanism 10 to start the operation for supplying the liquid onto the substrate P (see FIG. 1). The liquid LQ, which is supplied from the liquid supply section 11 of the liquid supply mechanism 10 in order to form the liquid immersion area AR2, flows through the supply tubes 12A, 12B as shown in FIG. 11(a), and then the liquid LQ is supplied onto the substrate P from the liquid supply ports 13A, 13B via the supply flow passages 14A, 14B.

The control unit CONT drives the pressure-adjusting liquid recovery section 92 which is included in the pressure adjustment mechanism 90 and which has the vacuum system (see FIG. 1), when the supply of the liquid LQ onto the substrate P is started by using the liquid supply mechanism 10. When the pressure-adjusting liquid recovery section 92, which has the vacuum system, is driven, then the gas is discharged from the space in the vicinity of the image plane side of the projection optical system PL, and the space is allowed to have the negative pressure by the aid of the pressure-adjusting recovery ports 98A, 98B provided in the vicinity of the optical element 2 disposed on the image plane side of the projection optical system PL. The control unit CONT starts the liquid supply by the liquid supply mechanism 10 in order to form the liquid immersion area AR2, while discharging the gas on the image plane side of the projection optical system PL by the aid of the pressure-adjusting recovery ports 98A, 98B arranged nearer to the projection area AR1 of the projection optical system PL than the liquid supply ports 13A, 13B of the liquid supply mechanism 10 by driving the pressure-adjusting liquid recovery section 92 of the pressure adjustment mechanism 90 as described above.

When the liquid LQ is supplied by the liquid supply mechanism 10 while discharging the gas on the image plane side of the projection optical system PL by the aid of the pressure-adjusting recovery ports 98A, 98B arranged in the vicinity of the projection area AR1 of the projection optical system PL, the negative pressure is provided in the vicinity of the pressure-adjusting recovery ports 98A, 98B. Therefore, the supplied liquid LQ is smoothly arranged in the negative pressure area (space) allowed to have the negative pressure. The pressure-adjusting recovery ports 98A, 98B are provided nearer to the projection area AR1 than the liquid supply ports 13A, 13B. Therefore, the projection area AR1 can be satisfactorily covered with the liquid LQ.

In particular, in this embodiment, the recess 78 of the flow passage-forming member 70 is formed on the image plane side of the projection optical system PL. Therefore, when the liquid LQ is supplied in order to form the liquid immersion area AR2, there is such a high possibility that the supplied liquid LQ does not enter the recess 78, and any gas portion such as the bubble or the like may be formed in the liquid LQ of the liquid immersion area AR2. If the gas portion is formed, for example, the following phenomena arise due to the gas portion. That is, the exposure light beam EL for forming the image of the pattern on the substrate P does not arrive at the surface of the substrate P. In another situation, the exposure light beam EL for forming the image of the pattern on the substrate P does not arrive at any desired position on the substrate P. In still another situation, for example, the detecting light beam La of the focus/leveling-detecting system 80 does not arrive at the surface of the substrate P and/or the light-receiving section 82. In still another situation, the detecting light beam La does not arrive at any desired position on the substrate P. As a result, the exposure accuracy and the measurement accuracy are deteriorated. On the other hand, when the liquid supply by the liquid supply mechanism 10 is started while discharging the gas on the image plane side of the projection optical system PL, the liquid LQ can be smoothly arranged in the recess 78. Therefore, it is possible to avoid the inconvenience which would be otherwise caused such that the gas portion is formed in the liquid immersion area AR2 formed on the image plane side of the projection optical system PL, and it is possible to obtain the high exposure accuracy and the high measurement accuracy. In particular, in this embodiment, the pressure-adjusting recovery ports 98A, 98B, which construct the gas discharge ports of the gas discharge mechanism, are provided at the highest positions of the lower surface 70A of the flow passage-forming member 70 at the inside of the recess 78. Therefore, the liquid LQ can be arranged in the recess 78 more smoothly. Further, it is also possible to avoid the inconvenience which would be otherwise caused such that the gas remains on the lower surface 2A of the optical element 2, because the pressure-adjusting recovery ports 98A, 98B, which construct the gas discharge ports of the gas discharge mechanism, are provided at the positions higher than the lower surface 2A of the optical element 2 of the projection optical system PL.

The liquid immersion area AR2 is formed between the projection optical system PL and the substrate P by the liquid LQ supplied onto the substrate P. In this arrangement, the liquid LQ, which is allowed to flow through the supply tubes 12A, 12B, is spread in the widthwise directions of the liquid supply ports 13A, 13B and the supply flow passages 14A, 14B formed to be slit-shaped. The liquid LQ is supplied to the wide range on the substrate P. The liquid LQ, which is supplied from the liquid supply ports 13A, 13B onto the substrate P, is supplied while causing the wetting between the substrate P and the lower end surface of the end portion (optical element 2) of the projection optical system PL. The liquid immersion area AR2, which is smaller than the substrate P and which is larger than the projection area AR1, is locally formed on a part of the substrate P including the projection area AR1. In this situation, the control unit CONT simultaneously supplies the liquid LQ onto the substrate P from the both sides of the projection area AR1 from the liquid supply ports 13A, 13B of the liquid supply mechanism 10 respectively disposed on the both sides in the X axis direction (scanning direction) of the projection area AR1.

The control unit CONT drives the first liquid recovery section 21 of the first liquid recovery mechanism 20 concurrently with the driving of the liquid supply mechanism 10 to recover the liquid LQ disposed on the substrate P as shown in FIG. 11(*b*). As described above, the control unit CONT controls the driving of the liquid supply mechanism 10 and the first liquid recovery mechanism 20 to form the supplementary liquid immersion area AR3 as well together with the liquid immersion area AR2.

After the liquid immersion area AR2 is formed, the control unit CONT stops the gas discharge operation on the image plane side of the projection optical system PL, having been performed by the pressure-adjusting liquid recovery section 92 of the pressure adjustment mechanism 90.

The control unit CONT performs the recovery of the liquid LQ from the surface of the substrate P by the first liquid recovery mechanism 20 concurrently with the supply of the liquid LQ onto the substrate P by the liquid supply mechanism 10, while the image of the pattern of the mask M is subjected to the projection exposure onto the substrate P via the projection optical system PL and the liquid LQ disposed between the projection optical system PL and the substrate P, while moving the substrate stage PST for supporting the substrate P in the X axis direction (scanning direction). In this situation, the liquid supply mechanism 10 simultaneously supplies the liquid LQ by the aid of the liquid supply ports 13A, 13B from the both sides of the projection area AR1 in relation to the scanning direction. Therefore, the liquid immersion area AR2 is formed uniformly and satisfactorily.

In this embodiment, when the liquid LQ is supplied to the substrate P from the both sides in the scanning direction of the projection area AR1, the control unit CONT adjusts the liquid supply amount per unit time by using the flow rate controllers 16A, 16B of the liquid supply mechanism 10 so that the liquid supply amount (liquid supply amount per unit time), which is supplied in front of the projection area AR1 in relation to the scanning direction, is different from the liquid amount which is supplied from the other side during the scanning exposure for one shot area on the substrate P. Specifically, the control unit CONT makes the setting such that the liquid supply amount per unit time, which is supplied from the front side of the projection area AR1 in relation to the scanning direction, is larger than the liquid supply amount which is supplied from the side opposite to the above.

For example, the control unit CONT makes the setting as follows. That is, when the exposure process is performed while moving the substrate P in the +X direction, the liquid amount, which is supplied from the −X side (i.e., from the liquid supply port 13A) with respect to the projection area AR1, is larger than the liquid amount which is supplied from the +X side (i.e., from the liquid supply port 13B). On the other hand, when the exposure process is performed while moving the substrate P in the −X direction, the liquid amount, which is supplied from the +X side with respect to the projection area AR1, is larger than the liquid amount which is supplied from the −X side. As described above, the control unit CONT changes the liquid supply amount per unit time from the liquid supply ports 13A, 13B respectively depending on the direction of movement of the substrate P.

During the liquid immersion exposure for the substrate P, the pressure of the liquid LQ of the liquid immersion area AR2 is always monitored by the pressure sensor 120 (see FIG. 5). The detection result obtained by the pressure sensor 120 is outputted to the control unit CONT. The control unit CONT adjusts the pressure of the liquid LQ supplied onto the substrate P from the liquid supply mechanism 10 by using the pressure adjustment mechanism 90 on the basis of the detection result of the pressure sensor 120 during the liquid immersion exposure for the substrate P.

The control unit CONT adjusts the pressure of the liquid LQ so that the force, which is exerted by the liquid LQ on the substrate P, is reduced by adding the liquid LQ onto the substrate P or recovering a part of the liquid LQ disposed on the substrate P by using the pressure-adjusting liquid supply section 91 and the pressure-adjusting liquid recovery section 92 of the pressure adjustment mechanism 90.

For example, when it is judged that the pressure of the liquid LQ of the liquid immersion area AR2 is lower than a preset predetermined value or when it is judged that the pressure of the liquid immersion area AR2 is lower than the pressure (atmospheric pressure) outside the liquid immersion area AR2 (pressure is the negative pressure) on the basis of the detection result of the pressure sensor 120, then the control unit CONT drives the pressure-adjusting liquid supply section 91 to further add the liquid LQ to the liquid LQ of the liquid immersion area AR2 by the aid of the pressure-adjusting supply ports 97A, 97B as shown in FIG. 11(*b*) so that the force, which is exerted by the liquid LQ on the substrate P, is reduced, i.e., the pressure of the liquid LQ has the predetermined value. When the liquid LQ is added, the pressure of the liquid LQ of the liquid immersion area AR2 is increased to arrive at the predetermined value. Accordingly, the force, which is exerted by the liquid LQ on the substrate P, is reduced.

On the contrary, when it is judged that the pressure of the liquid LQ of the liquid immersion area AR2 is higher than a preset predetermined value or when it is judged that the pressure of the liquid immersion area AR2 is higher than the pressure (atmospheric pressure) outside the liquid immersion area AR2 (pressure is the positive pressure) on the basis of the detection result of the pressure sensor 120, then the control unit CONT drives the pressure-adjusting liquid recovery section 92 to recover a part of the liquid LQ of the liquid immersion area AR2 by the aid of the pressure-adjusting recovery ports 98A, 98B as shown in FIG. 11(*c*) so that the force, which is exerted by the liquid LQ on the substrate P, is reduced, i.e., the pressure of the liquid LQ has the predetermined value. When the part of the liquid LQ is recovered, the pressure of the liquid LQ of the liquid immersion area AR2 is decreased to arrive at the predetermined value. Accordingly, the force, which is exerted by the liquid LQ on the substrate P, is reduced.

When the pressure of the liquid LQ supplied from the liquid supply mechanism 10 is adjusted by the pressure adjustment mechanism 90 as described above, it is possible to avoid, for example, the deformation of the substrate P and/or the substrate stage PST which would be otherwise caused by the pressure fluctuation of the liquid LQ, and the generation of the vibration and the displacement of the optical element 2 of the projection optical system PL. Therefore, it is possible to obtain the high exposure accuracy and the high measurement accuracy.

In particular, in this embodiment, the recess 78 is provided for the flow passage-forming member 70 which makes contact with the liquid LQ of the liquid immersion area AR2 disposed on the image plane side of the projection optical system PL. The pressure fluctuation of the liquid LQ tends to occur in the recess 78. Further, the pressure fluctuation is conspicuous, because the liquid LQ is moved in accordance with the scanning movement of the substrate P. Accordingly, the pressure-adjusting supply ports 97A, 97b are provided at the inside of the recess 78 to add the liquid LQ in order to adjust the pressure of the liquid LQ of the liquid immersion area AR2. Further, the pressure-adjusting recovery ports 98A, 98B are provided at the inside of the recess 78 to recover a part of the liquid LQ. Therefore, it is possible to effectively reduce the pressure fluctuation which would be otherwise caused in the recess 78, and it is possible to satisfactorily perform the pressure regulation.

Figure 11D:
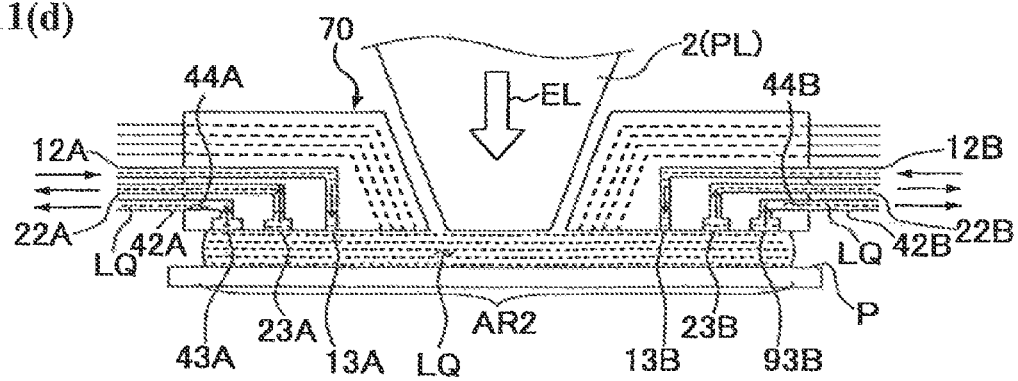

When the liquid LQ of the liquid immersion area AR2 on the substrate P is unsuccessfully recovered by the aid of the liquid recovery ports 23A, 23B of the first liquid recovery mechanism 20, the unsuccessfully recovered liquid LQ is allowed to outflow to the outside of the liquid recovery ports 23A, 23B. However, as shown in FIG. 11(d), the liquid LQ is recovered by the aid of the auxiliary liquid recovery ports 43A, 43B of the second liquid recovery mechanism 40. Therefore, it is possible to avoid the outflow of the liquid LQ. Even when any abnormality arises in the first liquid recovery mechanism 20 to be incapable of performing the liquid recovery operation, or even when any abnormality arises in the liquid supply mechanism 10, a large amount of the liquid LQ is consequently supplied, and the liquid LQ cannot be recovered with only the first liquid recovery mechanism 20, then the liquid LQ can be recovered with the second liquid recovery mechanism 40, and it is possible to avoid the outflow of the liquid LQ. Therefore, it is possible to avoid the occurrence of the electric leakage in the driving system and the rust on any mechanical part or the like which would be otherwise caused by the outflow liquid LQ. Further, it is possible to avoid the variation of the environment in which the substrate P is placed, which would be otherwise caused by the vaporization of the outflow liquid LQ. It is possible to avoid the deterioration of the exposure accuracy and the measurement accuracy. In this arrangement, for example, a mass flow controller may be provided for the second liquid recovery mechanism 40. The supply of the liquid from the liquid supply mechanism 10 may be stopped when the liquid LQ is recovered by the second liquid recovery mechanism 40.

As shown in FIG. 1, the second liquid recovery mechanism 40 has the uninterruptible power source 100B. Even when the commercial power source 100A, which is the driving source for the entire exposure apparatus EX including the first liquid recovery mechanism 20, suffers any abnormality such as the power failure, the supply of the electric power to the second liquid recovery mechanism 40 is switched to the uninterruptible power source 100B. Accordingly, the liquid LQ can be satisfactorily recovered by the second liquid recovery mechanism 40. Therefore, it is possible to avoid the outflow of the liquid LQ. Further, the liquid LQ, which remains on the substrate P, can be recovered by the second liquid recovery mechanism 40 without being left to stand. Therefore, it is possible to avoid the occurrence of any inconvenience which would be otherwise caused, for example, such that any mechanical part, which is disposed around the substrate stage PST for supporting the substrate P, is rusted and troubled, and/or the environment, in which the substrate P is placed, is varied.

For example, when the commercial power source 100A suffers the power failure, the uninterruptible power source 100B supplies the electric power, for example, to the electric power driving section of the gas/liquid separator and the electric power driving section of the vacuum system constructing the second liquid recovery mechanism 40 respectively. Specifically, when the commercial power source 100A suffers the power failure, the uninterruptible power source 100B switches the electric power supply to the second liquid recovery mechanism 40, for example, to a built-in battery to feed the electric power with no intermittent discontinuity. After that, the uninterruptible power source 100B starts up a built-in power generator in preparation for the power failure for a long period of time. The electric power supply to the second liquid recovery mechanism 40 is switched from the battery to the power generator. Accordingly, even when the commercial power source 100A suffers the power failure, then the electric power supply to the second liquid recovery mechanism 40 is continued, and it is possible to maintain the liquid recovery operation by the second liquid recovery mechanism 40. The uninterruptible power source 100B is not limited to the form described above, for which any known uninterruptible power source can be adopted. In this embodiment, the explanation has been made as exemplified by the case of the uninterruptible power source unit as the backup power source to be used when the commercial power source 100A suffers the power failure. However, the following arrangement may be of course adopted. That is, a backup battery may be used as the backup power source, and the electric power supply may be switched to the battery when the commercial power source 100A suffers the power failure.

When the commercial power source 100A suffers the power failure, the uninterruptible power source 100B may supply the electric power also to the third liquid recovery mechanism 60 as well. Accordingly, for example, even when the commercial power source 100A suffers the power failure in a state in which a part of the liquid immersion area AR2 of the liquid LQ is arranged on the plate member 56, and the liquid LQ outflows to the outside of the substrate P, then the third liquid recovery mechanism 60 can recover the outflow liquid LQ. When the commercial power source 100A suffers the power failure, the uninterruptible power source 100B may supply the electric power to the suction or attraction mechanism of the substrate stage PST for holding the substrate P. Accordingly, even when the commercial power source 100A suffers the power failure, it is possible to maintain the state of the substrate P of being attracted and held by the substrate stage PST (Z tilt stage 52). Therefore, no positional deviation of the substrate P is caused with respect to the Z tilt stage 52 by the power failure. Therefore, it is possible to smoothly perform the operation for restarting the exposure process when the exposure operation is restarted after the restoration from the power failure.

When the commercial power source 100A suffers the power failure, the uninterruptible power source 100B may supply the electric power (driving force) to the mechanisms other than the second liquid recovery mechanism 40, of the respective mechanisms (units) for constructing the exposure apparatus EX. For example, it is possible to avoid the outflow of the liquid LQ more reliably by supplying the electric power to the first liquid recovery mechanism 10 as well, in addition to the second liquid recovery mechanism 40 when the commercial power source 100A suffers the power failure.

A valve of the normally closed system may be provided for the supply tube 12 of the liquid supply mechanism 10. When the commercial power source 100A suffers the power failure, the valve of the normally closed system may mechanically shut off the flow passage of the supply tube 12. Accordingly, it is possible to eliminate the inconvenience which would be otherwise caused such that the liquid LQ leaks from the liquid supply mechanism 10 onto the substrate P after the power failure of the commercial power source 100A.

The force, which is exerted by the liquid LQ on the substrate P, changes depending on the material characteristic of the surface (liquid contact surface) of the substrate P. Specifically, the force, which is exerted by the liquid LQ on the substrate P, changes depending on the affinity between the liquid LQ and the surface of the substrate P, more specifically depending on the contact angle of the substrate P with respect to the liquid LQ. The material characteristic of the surface of the substrate P changes depending on the photosensitive material with which the surface of the substrate P is coated and the predetermined film such as a protective film with which the surface of the photosensitive material is coated to protect the photosensitive material. The pressure adjustment mechanism 90 can adjust the pressure of the liquid LQ based on the affinity between the liquid LQ and the surface of the substrate P. For example, when the surface of the substrate P is lyophilic or liquid-attractive, the liquid LQ intends to spread while causing the wetting on the substrate P. Therefore, the pressure of the liquid LQ on the substrate P is lowered (negative pressure is provided). Therefore, when the surface of the substrate P is liquid-attractive, the pressure adjustment mechanism 90 adds the liquid LQ by the aid of the pressure-adjusting supply ports 97A, 97B to raise the pressure of the liquid LQ of the liquid immersion area AR2 on the substrate P so that the force, which is exerted by the liquid LQ on the substrate P, is reduced. On the other hand, when the surface of the substrate P is lyophobic or liquid-repellent, the pressure of the liquid LQ on the substrate P is raised (positive pressure is provided). Therefore, when the surface of the substrate P is liquid-repellent, the pressure adjustment mechanism 90 recovers a part of the liquid LQ by the aid of the pressure-adjusting recovery ports 98A, 98B to lower the pressure of the liquid LQ of the liquid immersion area AR2 on the substrate P so that the force, which is exerted by the liquid LQ on the substrate P, is reduced.

The pressure of the liquid LQ on the substrate P has the value which corresponds to the affinity (contact angle) of the substrate P with respect to the liquid LQ. Therefore, the affinity (contact angle) of the substrate P with respect to the liquid LQ is previously determined. The pressure of the liquid LQ on the substrate P is previously determined by means of an experiment or simulation on the basis of the determined result. The information about the determined pressure is stored beforehand in the control unit CONT (or any storage unit connected thereto). Accordingly, even when the pressure sensor 120 is not used, the control unit CONT can determine the adjustment amount (liquid supply amount per unit time to be supplied from the pressure-adjusting supply ports 97 or liquid recovery amount per unit time to be recovered by the pressure-adjusting recovery ports 98) in order to adjust the pressure of the liquid LQ on the basis of the information about the pressure. The liquid LQ can be added, or a part of the liquid LQ can be recovered, on the basis of the determined adjustment amount.

The explanation has been made herein such that the pressure of the liquid LQ is adjusted based on the affinity (contact angle) of the surface (liquid contact surface) of the substrate P with respect to the liquid LQ. However, the pressure of the liquid LQ of the liquid immersion area AR2 on the substrate P may be adjusted based on the affinity (contact angle) of the lower surface (liquid contact surface) 70A of the flow passage-forming member 70 and/or the lower surface (liquid contact surface) 2A of the optical element 2 of the projection optical system PL with respect to the liquid LQ. The affinities of the optical element 2 and the flow passage-forming member 70 with respect to the liquid LQ are not changed greatly. On the other hand, the affinity of the substrate P with respect to the liquid LQ is changed, for example, by every lot depending on, for example, the photosensitive material to be used. Therefore, in practice, even when the affinities of the optical element 2 and the flow passage-forming member 70 with respect to the liquid LQ are not taken into consideration, the pressure of the liquid LQ can be satisfactorily adjusted by taking the affinity of the surface of the substrate P with respect to the liquid LQ into consideration.

In the embodiment described above, the explanation has been made about the case in which the liquid immersion area AR2 of the liquid LQ is formed on the substrate P. However, the liquid immersion area AR2 of the liquid LQ is sometimes formed on the upper surface 301 of the reference member 300 as explained with reference to FIG. 2. In some situations, various types of the measurement processes are performed through the liquid LQ of the liquid immersion area AR2 on the upper surface 301. In such a situation, the pressure adjustment mechanism 90 can adjust the pressure of the liquid LQ to reduce the force exerted on the reference member 300 by the liquid LQ of the liquid immersion area AR2 formed on the reference member 300. In this situation, the pressure adjustment mechanism 90 can adjust the pressure of the liquid LQ based on the affinity between the liquid LQ and the upper surface 301 of the reference member 300. Similarly, the pressure adjustment mechanism 90 can adjust the pressure of the liquid LQ to reduce the force exerted by the liquid LQ on the upper plate 402 or the upper plate 502 as well, when the liquid immersion area AR2 of the liquid LQ is formed, for example, on the upper surface 401 of the upper plate 402 of the uneven illuminance sensor 400 or on the upper surface 501 of the upper plate 502 of the spatial image-measuring sensor 500. Further, the following arrangement is also assumed. That is, the liquid immersion area AR2 is formed on the upper surface of the Z tilt stage 52 (substrate stage PST). In this case, the pressure adjustment mechanism 90 can adjust the pressure to reduce the force exerted by the liquid LQ on the substrate stage PST.

In the embodiment described above, the pressure adjustment mechanism 90 performs the operation for adjusting the pressure of the liquid LQ of the liquid immersion area AR2 formed on the substrate P during the liquid immersion exposure for the substrate P. However, the operation for adjusting the pressure of the liquid LQ may be performed before or after the liquid immersion exposure for the substrate P.

In the embodiment described above, the pressure-adjusting supply ports 97 and the pressure-adjusting recovery ports 98 are the ports which are independent from each other. However, one port may be used for both of the liquid supply section 91 and the liquid recovery section 92, and the liquid may be supplied and recovered by using one port.

In the embodiment described above, the liquid supply amounts per unit time, which are supplied from the plurality of (two) aligned pressure-adjusting supply ports 97A, 97B respectively, may have mutually different values depending on, for example, the scanning velocity and the direction of movement of the substrate P so that the force, which is exerted by the liquid LQ onto the substrate P, is reduced. Similarly, the liquid recovery amounts per unit time, which are based on the plurality of aligned pressure-adjusting recovery ports 98A, 98B respectively, may have mutually different values.

In the embodiment described above, the two pressure-adjusting supply ports 97 and the two pressure-adjusting supply ports 98 are provided and aligned respectively in the non-scanning direction (Y axis direction). However, a plurality of them may be provided and aligned in the scanning direction (X axis direction). When the plurality of them are provided and aligned in the X axis direction, they can be provided on the both sides respectively with the projection area AR1 intervening therebetween. Also in this arrangement, when the pressure of the liquid LQ is adjusted, the liquid supply amounts, which are supplied from the plurality of pressure-adjusting supply ports 97 aligned in the X axis direction respectively, may have mutually different values depending on, for example, the scanning velocity and the scanning direction of the substrate P so that the force, which is exerted by the liquid LQ onto the substrate P, is reduced. Similarly, the liquid recovery amounts per unit time, which are recovered by the plurality of pressure-adjusting recovery ports 98 aligned in the X axis direction respectively, may have mutually different values.

In the embodiment described above, the two pressure-adjusting supply ports 97 and the two pressure-adjusting recovery ports 98 are provided respectively. However, the pressure-adjusting supply port 97 and the pressure-adjusting recovery port 98 may be provided one by one. Alternatively, they may be provided at two or more arbitrary plural positions. The shapes of the pressure-adjusting supply port 97 and the pressure-adjusting recovery port 98 are not limited to the circular shapes. The shapes may be, for example, rectangular, polygonal, circular arc-shaped, or slit-shaped in which a predetermined direction is the longitudinal direction.

In the embodiment described above, the arrangement is adopted, in which one pressure sensor 120 is provided. However, a plurality of pressure sensors 120 may be provided at a plurality of arbitrary positions making contact with the liquid LQ of the liquid immersion area AR2. In this arrangement, the liquid supply amounts, which are supplied from the plurality of pressure-adjusting supply ports 97 (97A, 97B) respectively, may have mutually different values on the basis of the respective outputs of the plurality of pressure sensors 120. Similarly, the liquid recovery amounts, which are based on the plurality of pressure-adjusting recovery ports 98 (98A, 98B) respectively, may have mutually different values on the basis of the respective outputs of the plurality of pressure sensors 120.

In the embodiment described above, the pressure of the liquid LQ is adjusted by supplying or recovering the liquid LQ. However, it is also appropriate to adjust or regulate the contact angle of the liquid LQ.

In the embodiment described above, a porous member, which is composed of, for example, a sponge-like member or a porous ceramics, may be arranged, for example, in the liquid supply port 13, the liquid recovery port 23, and the auxiliary liquid recovery port 43, as well as the supply flow passage 14, the recovery flow passage 24, and the recovery flow passage 44 connected thereto.

In the embodiment described above, the liquid LQ is supplied from both of the liquid supply ports 13A, 13B during the exposure for the substrate P. However, the liquid LQ may be supplied from any one of them. Further, the liquid supply mechanism 10 (liquid supply ports 13A, 13B) may be omitted, and the liquid immersion area AR2 may be formed by only the supply of the liquid LQ from the pressure-adjusting supply ports 97.

Another embodiment of the present invention will be explained below. In the following description, constructing components, which are the same as or equivalent to those of the embodiment described above, are designated by the same reference numerals, any explanation of which will be simplified or omitted.

Figure 12:
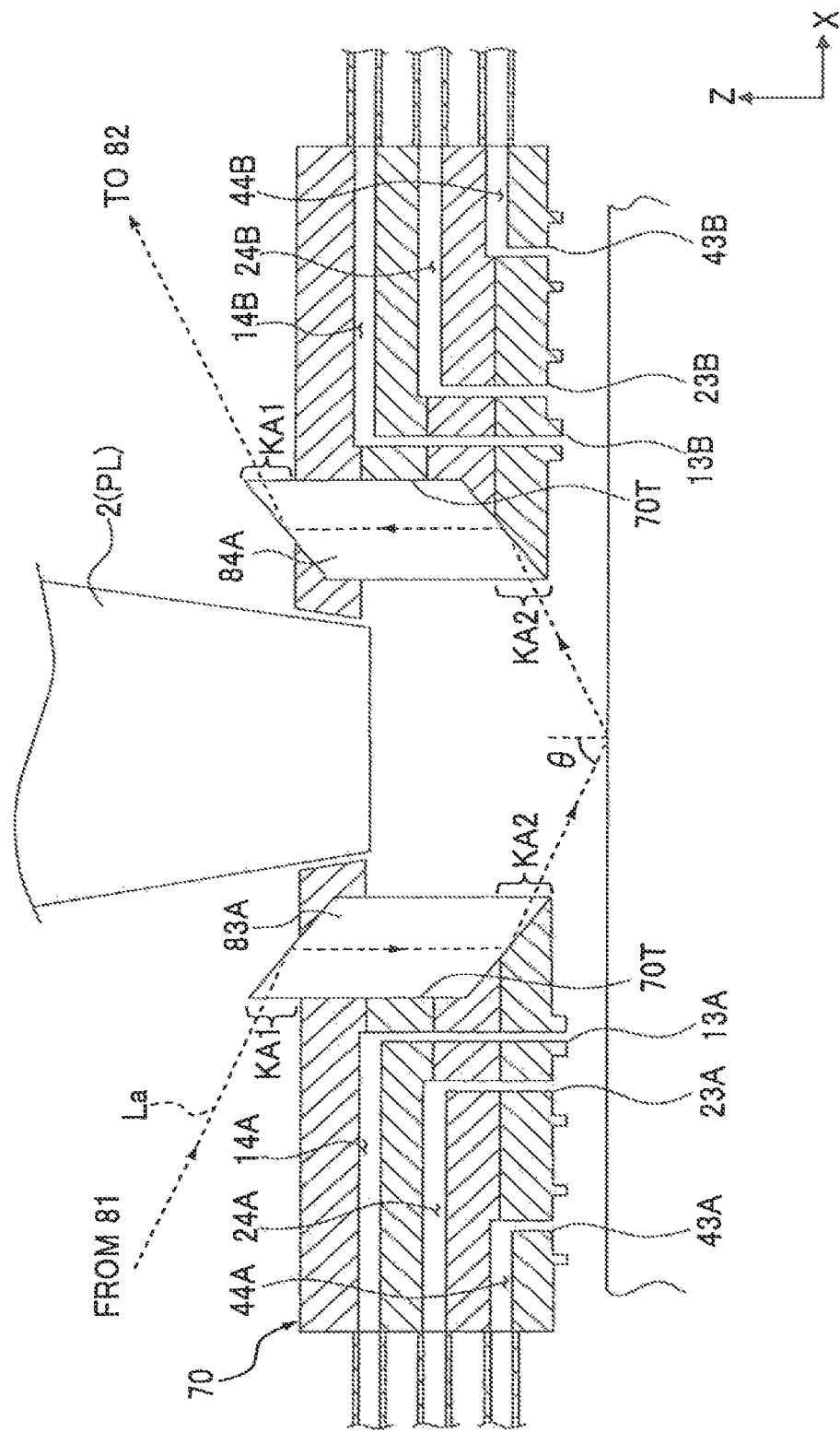
FIG. 12 shows a sectional view illustrating another embodiment of an exposure apparatus of the present invention.

FIG. 12 shows another embodiment of a flow passage-forming member 70 and first and second optical members for constructing an optical system of a focus/leveling-detecting system 80 attached to the flow passage-forming member 70. With reference to FIG. 12, the first and second optical members 83A, 84A are constructed of prisms respectively. The direction in the traveling direction of the detecting light beam La of the focus/leveling-detecting system 80 (see FIG. 3) is changed by the first and second optical members 83A, 83B constructed of the prisms. In this embodiment, each of the first and second optical members 83A, 83B is constructed of a parallel shifting prism, specifically a rhombic prism, which causes the parallel displacement of the incoming detecting light beam La.

The first and second optical members 83A, 84A are attached to the inner side surface 70T of the flow passage-forming member 70 respectively. At least an upper end region KA1 and a lower end region KA2 of each of the first and second optical members 83A, 84A, through which the detecting light beam La passes, are exposed from the flow passage-forming member 70. The upper end regions KA1 of the first and second optical members 83A, 84A are allowed to protrude (exposed) from the upper surface of the flow passage-forming member 70, and the lower end regions KA2 are exposed to the space between the projection optical system PL and the substrate P. In the exemplary embodiment shown in FIG. 12, the first optical member 83A is provided on the −X side of the projection optical system PL (optical element 2), and the second optical member 84A is provided on the +X side. When the first and second optical members 83A, 84A are provided on the −X side and the +X side of the projection optical system PL respectively, any interference is avoided between the first and second optical members 83A, 84A and the supply flow passages 94 and the supply tubes 93 to be connected to the pressure-adjusting supply ports 97 and the recovery flow passages 96 and the recovery tubes 95 (see FIG. 6) to be connected to the pressure-adjusting recovery ports 98.

The detecting light beam La, which is radiated from the light-emitting section 81 of the focus/leveling-detecting system 80, travels along the plane substantially parallel to the XZ plane, and the detecting light beam La comes from the upper end region KA1 of the first optical member 83A. After that, the detecting light beam La is shifted in the −Z direction as the detecting light beam La passes through the first optical member 83A. The detecting light beam La is allowed to outgo from the lower end region KA2. The detecting light beam La, which has passed through the first optical member 83A, is radiated onto the substrate P to cause the reflection, and then the detecting light beam La comes into the second optical member 84A from the lower end region KA2. The detecting light beam La, which comes into the second optical member 84A from the lower end region KA2, is shifted in the +Z direction, and then the detecting light beam La is allowed to outgo from the upper end region KA1. The detecting light beam La is received by the light-receiving section 82.

As described above, the flow passage-forming member 70 is provided with the first and second optical members 83A, 84A which are constructed of the prisms for constructing the optical system of the focus/leveling-detecting system 80. Accordingly, it is possible to increase the angle of incidence θ of the detecting light beam La with respect to the substrate P. It is possible to improve the degree of freedom of the design of the apparatus arrangement including the flow passage-forming member 70. Further, it is also possible to decrease the size of the flow passage-forming member 70.

Figure 13:
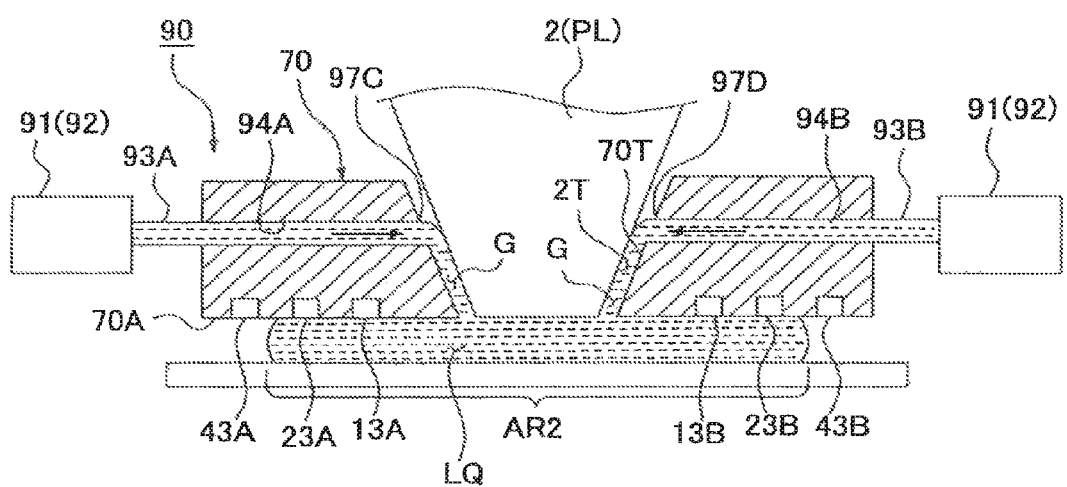
FIG. 13 schematically shows another embodiment of an exposure apparatus of the present invention.

FIG. 13 schematically shows another embodiment of the pressure adjustment mechanism 90. With reference to FIG. 13, the pressure adjustment mechanism 90 is provided with a liquid supply section 91 which is capable of feeding the liquid LQ. It is assumed that the liquid supply section 91 shown in FIG. 13 is also provided with the function of the liquid recovery section (92). Supply ports 97C, 97D are formed on the inner side surface 70T of the flow passage-forming member 70. Supply flow passages 94A, 94B, which have first ends connected to the liquid supply section 91 via supply tubes 93A, 93B and which have second ends connected to supply ports 97C, 97D, are formed in the flow passage-forming member 70. The liquid supply ports 13A, 13B, the liquid recovery ports 23A, 23B, and the auxiliary liquid recovery ports 43A, 43B are formed on the lower surface 70A of the flow passage-forming member 70 in the same manner as in the embodiment described above.

The liquid LQ, which is fed from the liquid supply section 91, is supplied to the gap G disposed between the inner side surface 70T of the flow passage-forming member 70 and the side surface 2T of the optical element 2 of the projection optical system PL, from the supply ports 97C, 97D via the supply tubes 93A, 93B and the supply flow passages 94A, 94B. As described above, the liquid supply section 91 of this embodiment has the function of the liquid recovery section. When the liquid supply section 91 is driven as the liquid recovery section, the liquid LQ or the gas, which is disposed in the gap G, is sucked and recovered by the liquid supply section (liquid recovery section) 91 via the supply ports (recovery ports) 97C, 97D, the supply flow passages (recovery flow passages) 94A, 94B, and the supply tube (recovery tubes) 93A, 93B.

When the liquid immersion area AR2 of the liquid LQ is formed on the substrate P, there is such a possibility that the liquid LQ disposed on the substrate P may flow into the gap G, for example, due to the capillary phenomenon, and the liquid LQ may stay therein. If the liquid LQ stays in the gap G for a long period of time, the liquid LQ is highly possibly polluted. If the polluted liquid LQ contained in the gap G flows into the space between the projection optical system PL and the substrate P, for example, during the liquid immersion exposure for the substrate P, there is such a possibility that the exposure accuracy may be consequently deteriorated. Accordingly, when the control unit CONT appropriately drives the pressure adjustment mechanism 90, it is possible to remove the liquid LQ staying in the space between the inner side surface 70T of the flow passage-forming member 70 and the side surface 2T of the optical element 2. That is, the pressure adjustment mechanism 90 of this embodiment has the function to serve as the liquid-removing mechanism for removing the liquid LQ from the space between the inner side surface 70T of the flow passage-forming member 70 and the side surface 2T of the optical element 2.

Figure 14A:
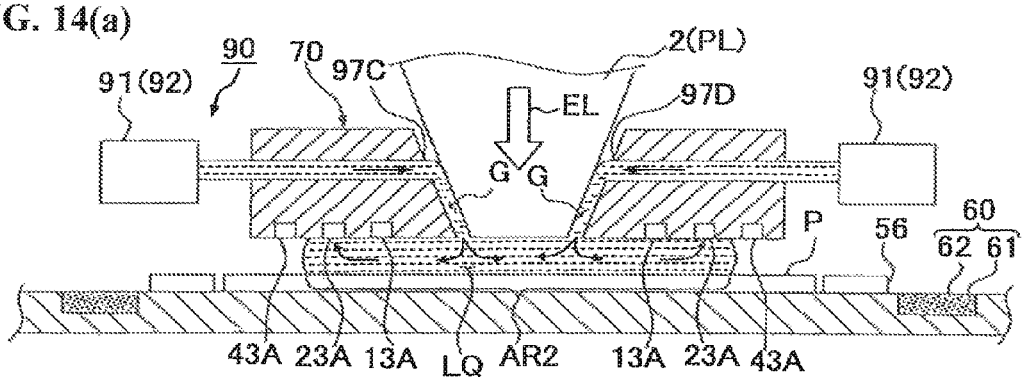
FIGS. 14(a) to 14(d) schematically show examples of the operation of the exposure apparatus shown in FIG. 13.

FIGS. 14(a)-14(d) show examples of the operation of the pressure adjustment mechanism (liquid-removing mechanism) 90 shown in FIG. 13. As shown in FIG. 14(a), the liquid LQ, which stays in the gap G disposed between the inner side surface 70T of the flow passage-forming member 70 and the side surface 2T of the optical element 2, can be removed by driving the pressure adjustment mechanism 90 during the radiation of the exposure light beam EL onto the substrate P via the projection optical system PL and the liquid LQ of the liquid immersion area AR2. In the example shown in FIG. 14(a), the liquid LQ, which is fed from the liquid supply section 91, is supplied to the gap G from the supply ports 97C, 97D. The liquid LQ, which has been arranged (allowed to stay) in the gap G, is discharged downwardly to outflow onto the substrate P by the liquid LQ supplied from the supply ports 97C, 97D. The liquid LQ is recovered from the liquid recovery ports 23A, 23B of the first liquid recovery mechanism 20 together with the liquid LQ disposed on the substrate P. In the example shown in FIG. 14(a), the liquid LQ is always supplied to the gap G from the supply ports 97C, 97D even during the exposure for the substrate P. Accordingly, the liquid LQ, which is arranged in the gap G, is allowed to outflow onto the substrate P before being polluted. Therefore, no influence is exerted on the exposure accuracy. In the example shown in FIG. 14(a), the liquid LQ is supplied to the gap G while radiating the exposure light beam EL onto the substrate P. However, it is a matter of course that the liquid LQ may be supplied to the gap G before or after the radiation of the exposure light beam EL onto the substrate P.

Figure 14B:
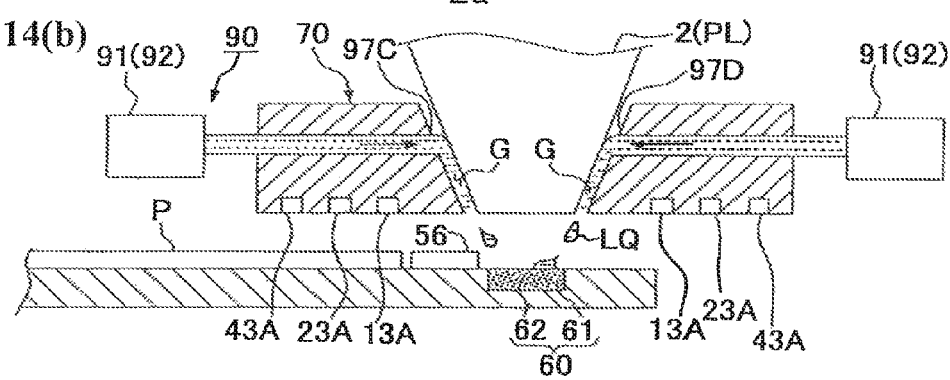

As shown in FIG. 14(b), the liquid LQ discharged from the gap G by supplying the liquid LQ to the gap G via the supply ports 97A, 97B, may be recovered by using the third liquid recovery mechanism 60. Accordingly, the liquid LQ, polluted in the gap G, can be discharged and recovered from the gap G without allowing the polluted liquid LQ to adhere, for example, to the substrate P.

Figure 14C:
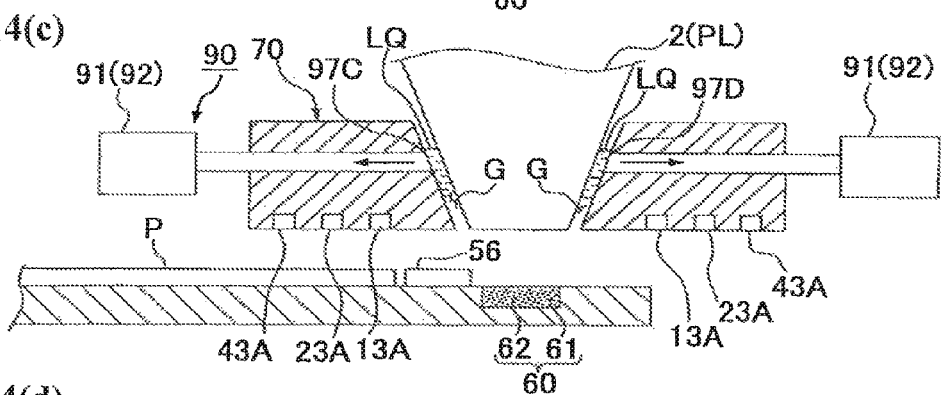

As shown in FIG. 14(c), the liquid LQ disposed in the gap G may be sucked and recovered via the recovery ports 97C, 97D. Accordingly, it is also possible to remove the liquid LQ from the gap G.

The process for removing the liquid LQ from the gap G as described above can be performed periodically at a predetermined timing, for example, for every lot of the substrate P or when the substrate P is exchanged (loaded or unloaded) with respect to the substrate stage PST. As explained with reference to FIG. 14(a), the liquid-removing operation may be performed during the exposure of the substrate P, or the liquid-removing operation may be performed at any timing other than during the exposure.

Figure 14D:
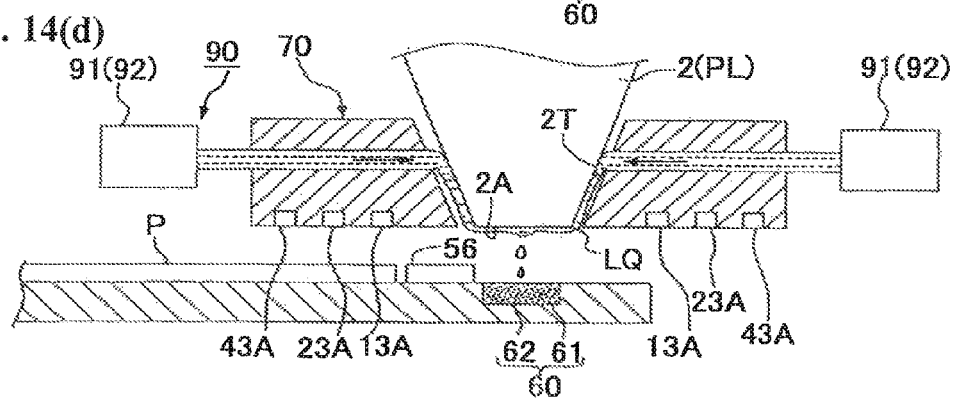

As shown in FIG. 14(d), the liquid supply section 91 may be driven to always supply the liquid LQ to the gap G during the period in which the substrate P is not subjected to the exposure process. In this procedure, when the liquid supply amount is adjusted or regulated, then the liquid LQ, which is supplied from the supply ports 97C, 97D, is moved along the side surface 2T of the projection optical system PL (optical element 2), and the liquid LQ is spread while causing the wetting on the lower surface (liquid contact surface) 2A. The liquid LQ, which drips from the optical element 2, can be recovered by the third liquid recovery mechanism 60. When the surface, which includes the lower surface 2A of the optical element 2, is always wetted with the liquid LQ supplied from the supply ports 97C, 97D, then the optical element 2 (projection optical system PL) can be prevented from being dried, and it is possible to avoid the inconvenience of the formation of the adhesion trace of the liquid LQ (so-called water mark).

In the respective embodiments described above, the exposure process and the measurement process are performed while moving the substrate stage in the state in which the liquid LQ is supplied and recovered by using the liquid supply mechanism 10 and the liquid recovery mechanism 20 (40, 60), and the liquid immersion area AR2 is locally formed on the substrate stage PST including the substrate P. However, the following situation may possibly occur depending on the condition of movement of the substrate stage PST. That is, for example, the liquid LQ may outflow to the outside of the substrate P, and/or any gas portion may be formed in the liquid immersion area AR2. It is impossible to satisfactorily retain the liquid LQ on the image plane side of the projection optical system PL, and the liquid immersion area AR2 is not formed satisfactorily.

Accordingly, it is appropriate that the velocity of movement of the substrate stage PST differs depending on the distance between the first position and the second position when the substrate stage PST is moved substantially linearly from the first position to the second position in the state in which the liquid immersion area AR2 is locally formed on the substrate stage PST including the substrate P held on the substrate stage PST by the liquid supply mechanism 10 and the liquid recovery mechanism 20.

The phrase "liquid immersion area AR2 on the substrate stage PST" referred to herein also includes the "liquid immersion area AR2 on the substrate P held on the substrate stage PST".

The embodiment of the present invention is constructed such that the scanning exposure process is successively performed for the respective shot areas while moving the substrate P in the step-and-scan manner. However, for example, when the reset operation or the calibration operation for the exposure apparatus EX (hereinafter generally referred to as "calibration operation") is performed, the control unit CONT moves the substrate stage PST over a long distance from the position (first position) of the substrate stage PST at which the start of the calibration operation is instructed to the position (second position) at which the calibration operation is intended to be performed. The distance (distance between the first position and the second position) is larger than the distances of the stepping movement and the scanning movement described above. It is difficult to retain the liquid LQ on the image plane side of the projection optical system PL.

Accordingly, when the distance between the first position and the second position is not less than a preset predetermined amount, the control unit CONT decreases the velocity of movement of the substrate stage PST as compared with the case in which the distance between the first position and the second position is shorter than the predetermined amount. For example, when the distance of movement of the substrate stage PST, which is brought about when the long distance movement is performed in order to effect the calibration operation as described above, is longer than (for example, not less than twice) the distance of movement of the substrate stage PST which is brought about when the step-and-scan operation is performed during the exposure process, the velocity of movement, which is adopted when the long distance movement is performed, is made slower than the velocity of movement of the substrate stage PST which is adopted when the step-and-scan operation is performed during the exposure process. Accordingly, it is possible to satisfactorily form the liquid immersion area AR2 of the liquid LQ on the image plane side of the projection optical system PL.

As explained above, when the distance between the first position and the second position is long, and the substrate stage PST is moved over the long distance, then there is such a possibility that the liquid LQ is hardly retained satisfactorily on the image plane side of the projection optical system PL. However, in such a situation, the liquid LQ can be satisfactorily retained on the image plane side of the projection optical system PL by slowing the velocity of movement of the substrate stage PST. Therefore, it is possible to avoid, for example, the outflow of the liquid LQ and the formation of the gas portion, and it is possible to avoid the deterioration of the exposure accuracy and the measurement accuracy which would be otherwise caused by the outflow of the liquid LQ and the formation of the gas portion. On the other hand, when the distance between the first position and the second position is short, and the substrate stage PST is not moved over any long distance, then it is possible to improve the throughput by quickening the velocity of movement of the substrate stage PST.

The velocities of movement of the substrate stage PST, which are adopted when the substrate stage PST is moved over the distance of the predetermined amount and the distance of not less than the predetermined amount, can be previously determined by performing an experiment or simulation in consideration of, for example, the affinities of the substrate P, the optical element 2, and the flow passage-forming member 70 for the liquid LQ (contact angles of the liquid LQ).

In this procedure, when the improvement in the throughput has priority over the decrease in the velocity of movement of the substrate stage PST, it is also appropriate that the substrate stage PST is allowed to arrive at the second position while changing the direction of movement of the substrate stage PST by linear distances shorter than the predetermined amount without performing the linear movement from the first position to the second position and without decreasing the velocity of movement.

It is also possible that the velocity of movement of the substrate stage PST is allowed to differ depending on the direction of movement of the substrate stage PST from the first position to the second position in order to satisfactorily retain the liquid LQ on the image plane side of the projection optical system PL when the substrate stage PST is moved substantially linearly from the first position to the second position in the state in which the liquid immersion area AR2 is locally formed on the substrate stage PST by the liquid supply mechanism 10 and the liquid recovery mechanism 20.

Figure 15:
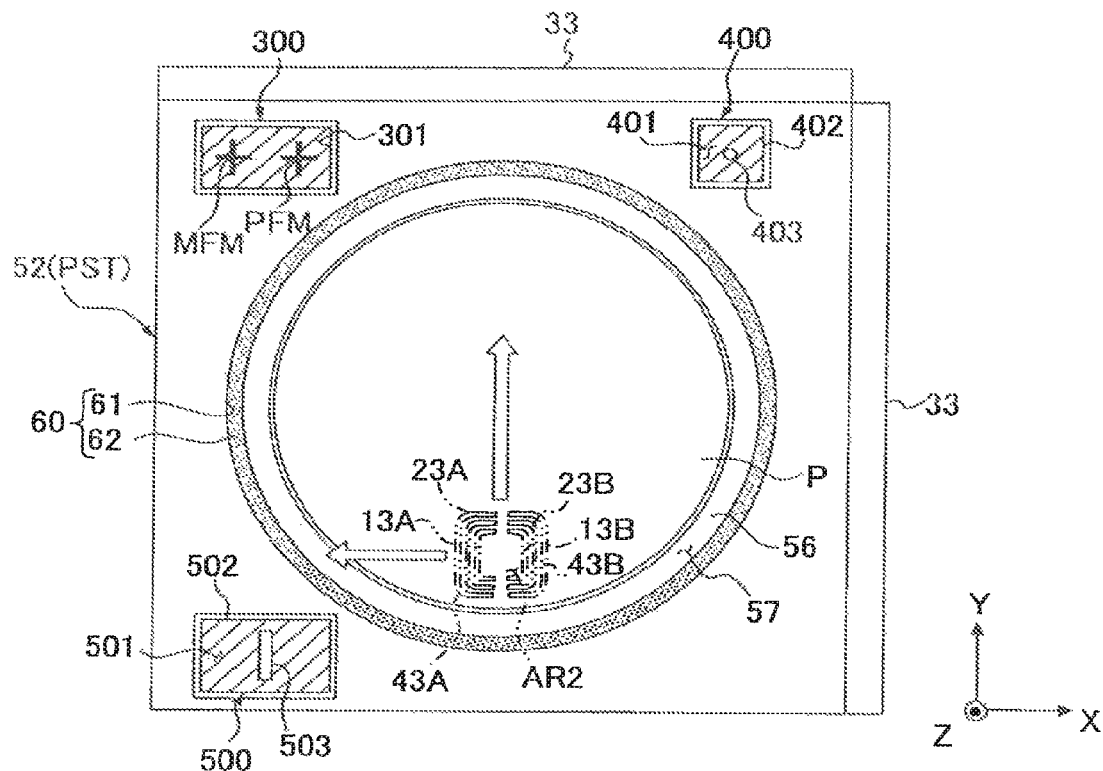
FIG. 15 shows a plan view illustrating an example of the operation of the exposure apparatus of the present invention.

For example, the velocity of movement of the substrate stage PST is allowed to differ between the movement of the substrate stage PST in the X axis direction and the movement in the Y axis direction when the substrate stage PST is moved with respect to the liquid supply ports 13A, 13B of the liquid supply mechanism 10 and the liquid recovery ports 23A, 23B of the liquid recovery mechanism 20 for forming the liquid immersion area AR2 as schematically shown in FIG. 15.

As explained, for example, with reference to FIG. 4, the liquid recovery ports 23 of the liquid recovery mechanism 20 of the embodiment of the present invention are not provided in the areas or regions disposed on the +Y side and the −Y side with respect to the projection area AR1, of the lower surface 70A of the flow passage-forming member 70. That is, any liquid recovery port 23 is not arranged on the side in the Y axis direction with respect to the projection area AR1 (liquid immersion area AR2). The liquid recovery force, which is brought about by the liquid recovery mechanism 20, is weak on the side in the Y axis direction. That is, the direction, which is defined in the Y axis direction, is the direction in which the liquid recovery force by the liquid recovery mechanism 20 is weak.

Accordingly, when the substrate stage PST is moved in the direction in which the liquid recovery force by the liquid recovery mechanism 20 is weak, i.e., in the Y axis direction, the control unit CONT decreases the velocity of movement of the substrate stage PST as compared with the case in which the substrate stage PST is moved in any direction (for example, the direction defined in the X axis direction) different from the Y axis direction.

For example, the velocity of movement of the substrate stage PST is slowed to be, for example, about 200 mm/second when the substrate stage PST is subjected to the stepping movement in the Y axis direction or when the substrate stage PST is moved in the oblique direction in relation to the Y axis direction and the X axis direction in order to perform the calibration operation as described above, as compared with the velocity of movement of the substrate stage PST (for example, about 400 mm/second) which is adopted when the substrate stage PST is subjected to the scanning movement in the X axis direction during the exposure process. Accordingly, the liquid LQ can be retained on the image plane side of the projection optical system PL. It is possible to avoid the outflow of the liquid LQ and the formation of the gas portion in the liquid immersion area AR2.

Also in this procedure, when the improvement in the throughput has priority over the decrease in the velocity of movement of the substrate stage PST, it is also appropriate that the substrate stage PST is allowed to arrive at the second position while changing the direction of movement of the substrate stage PST by linear distances shorter than the predetermined amount without performing the linear movement from the first position to the second position and without decreasing the velocity of movement. Further, a direction in which the recovery force is weak and the velocity of movement of the substrate stage PST, which is adopted when the substrate stage PST is moved in the direction in which the recovery force is weak, can be previously determined by performing an experiment or simulation in consideration of, for example, the affinities of the substrate P, the optical element 2, and the flow passage-forming member 70 for the liquid LQ (contact angles of the liquid LQ).

As explained above, the following inconvenience may possibly arise depending on the arrangement and the sizes of the supply ports 13 and the recovery ports 23 for the liquid LQ. That is, for example, the liquid LQ cannot be retained satisfactorily on the image plane side of the projection optical system PL depending on the direction of movement of the substrate P, the liquid LQ may outflow, the liquid LQ of the liquid immersion area AR2 may be depleted or exfoliated, and the gas portion may be formed in the liquid immersion area disposed on the image plane side of the projection optical system PL. However, when the velocity of movement of the substrate stage PST is allowed to differ depending on the direction of movement of the substrate stage PST, it is possible to avoid the occurrence of the inconvenience which would be otherwise caused, for example, such that the liquid LQ outflows and/or the gas portion is formed. It is possible to avoid the deterioration of the exposure accuracy and the measurement accuracy which would be otherwise caused by the outflow of the liquid LQ. When the substrate stage PST is moved in the direction in which the liquid recovery force is weak, the liquid immersion area AR2 can be satisfactorily formed on the image plane side of the projection optical system PL by slowing the velocity of movement of the substrate stage PST. On the other hand, for example, when the substrate stage PST is moved in the direction in which the liquid recovery force and/or the liquid supply force is strong, it is possible to improve the throughput by quickening the velocity of movement of the substrate stage PST.

Figure 16:
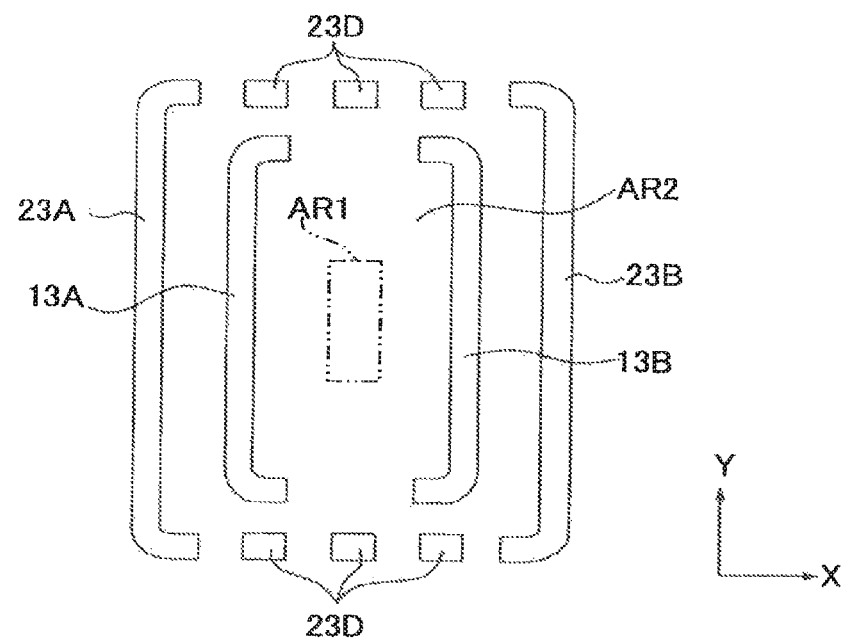
FIG. 16 shows a plan view illustrating another embodiment of liquid supply ports and liquid recovery ports.

The embodiment of the present invention has been explained such that no liquid recovery port 23 is arranged on the side in the Y axis direction of the liquid immersion area AR2, and the liquid recovery force, which is brought about by the liquid recovery mechanism 20, is weak in the Y axis direction. However, this situation is not limited to only the arrangement in which no liquid recovery port 23 is arranged. For example, as shown in FIG. 16, even when liquid recovery ports 23 (23D) are arranged on the sides in the Y axis direction of the liquid immersion area AR2, the liquid recovery force is weak in the Y axis direction, when the liquid recovery ports 23D, which are arranged on the sides in the Y axis direction, are divided into a plurality of components (disposed sparsely). Also in the case of the liquid recovery ports 23 constructed as described above, it is preferable that the velocity of movement of the substrate stage PST is decreased when the substrate stage PST is moved in the Y axis direction as compared with when the substrate stage PST is moved in any direction different from the Y axis direction.

Alternatively, it is assumed that liquid recovery ports 23, which are divided into a plurality of components, are arranged to surround the projection area AR1 (liquid immersion area AR2). In this arrangement, for example, when the liquid recovery force, which is brought about by the liquid recovery port 23 provided at the position on the side in the Y axis direction with respect to the liquid immersion area AR2, of the plurality of liquid recovery ports 23, is weak, then it is preferable that the velocity of movement of the substrate stage PST is decreased when the substrate stage PST is moved in the Y axis direction as compared with when the substrate stage PST is moved in any direction different from the Y axis direction.

When the flat surface 57 on the substrate stage PST formed around the substrate P has a sufficient size to form the liquid immersion area AR2, the following procedure may also be adopted without decreasing the velocity of movement the substrate stage PST to perform the movement from the first position to the second position. That is, the substrate stage PST is moved from the first position to a first intermediate position at which the liquid immersion area AR2 is formed on the flat surface 57 in the vicinity of the first position. Further, the substrate stage PST is moved from the first intermediate position to a second intermediate position at which the liquid immersion area AR2 is formed on the flat surface 57 in the vicinity of the second position, while maintaining the formation of the liquid immersion area AR2 on the flat surface 57. The substrate stage PST is moved from the second intermediate position to the second position. In this procedure, the substrate stage PST can be moved at a high velocity in a state in which the liquid immersion area AR2 is retained on the image plane side of the projection optical system PL, because the surface of the flat surface 57 on the substrate stage PST is liquid-repellent with respect to the liquid LQ. The substrate stage can be moved from the first position to the second position in a shorter period of time in some situations as compared with when the substrate stage PST is moved linearly while decreasing the velocity of movement of the substrate stage PST.

The explanation has been made above by way of example in relation to the case in which the velocity and/or the movement route of the substrate stage PST are adjusted or regulated in consideration of the direction of movement and the distance of movement when the substrate stage PST is moved from the first position to the second position in the calibration operation. However, the adjustment of the velocity and/or the movement route is not limited to the calibration operation. It is possible to adjust or regulate the velocity and the route of movement of the substrate stage PST in various types of operations to be executed in the exposure apparatus EX, including, for example, the stepping movement to start the exposure for the next shot area after the completion of the exposure for a certain shot area on the substrate P.

Further, the adjustment of the velocity and the movement route is not limited to the substrate stage PST. When an object is moved in a state in which the liquid immersion area AR2 is formed on the object opposed to the projection optical system PL, the velocity of movement and/or the route of movement of the object may be adjusted or regulated.

As described above, in the embodiments of the present invention, pure or purified water is used as the liquid LQ. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the end surface of the projection optical system PL. When the purity of pure water supplied from the factory or the like is low, it is also appropriate that the exposure apparatus is provided with an ultrapure water-producing unit.

It is approved that the refractive index n of pure water (water) with respect to the exposure light beam EL having a wavelength of about 193 nm is approximately in an extent of 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

When the liquid immersion method is used as described above, the numerical aperture NA of the projection optical system is 0.9 to 1.3 in some cases. When the numerical aperture NA of the projection optical system is increased as described above, the image formation performance is sometimes deteriorated by the polarization effect with the random polarized light beam having been hitherto used as the exposure light beam. Therefore, it is desirable to use the polarized illumination. In this case, the following procedure is preferred. That is, the linear polarized illumination is effected, which is adjusted to the longitudinal direction of the line pattern of the line-and-space pattern of the mask (reticle) so that a large amount of diffracted light of the S-polarized component (TE-polarized component), i.e., the component in the polarization direction along the longitudinal direction of the line pattern is allowed to outgo from the pattern of the mask (reticle). When the space between the projection optical system PL and the resist coated on the surface of the substrate P is filled with the liquid, the diffracted light of the S-polarized component (TE-polarized component), which contributes to the improvement in the contrast, has the transmittance through the resist surface that is raised to be high as compared with a case in which the space between the projection optical system PL and the resist coated on the surface of the substrate P is filled with the air (gas). Therefore, even when the numerical aperture NA of the projection optical system exceeds 1.0, it is possible to obtain the high image formation performance. It is more effective to make appropriate combination, for example, with the phase shift mask and/or the oblique incidence illumination method (especially the dipole illumination method) adjusted to the longitudinal direction of the line pattern as disclosed in Japanese Patent Application Laid-open No. 6-188169.

Further, for example, when the ArF excimer laser beam is used as the exposure light beam, and the substrate P is exposed with a fine line-and-space pattern (for example, line-and-space of about 25 to 50 nm) by using the projection optical system PL having a reduction magnification of about ¼, then the mask M functions as a polarizing plate on account of the Wave Guide effect depending on the structure of the mask M (for example, the pattern fineness and the chromium thickness), and a large amount of the diffracted light beam of the S-polarized component (TE-polarized component) is radiated from the mask M as compared with the diffracted light beam of the P-polarized component (TM-component) which lowers the contrast. In such a situation, it is desirable that the linear polarized illumination is used as described above. However, the high resolution performance can be obtained even when the numerical aperture NA of the projection optical system PL is large, for example, 0.9 to 1.3 even when the mask M is illuminated with the random polarized light beam. When the substrate P is exposed with an extremely fine line-and-space pattern on the mask M, there is also such a possibility that the P-polarized component (TM-polarized component) may be larger than the S-polarized component (TE-polarized component) on account of the Wire Grid effect. However, for example, when the ArF excimer laser beam is used as the exposure light beam, and the substrate P is exposed with a line-and-space pattern larger than 25 nm by using the projection optical system PL having a reduction magnification of about ¼, then a large amount of the diffracted light beam of the S-polarized component (TE-polarized component) is radiated from the mask M as compared with the P-polarized component (TM-polarized component). Therefore, the high resolution performance can be obtained even when the numerical aperture NA of the projection optical system PL is large, for example, 0.9 to 1.3.

Further, it is also effective to use a combination of the oblique incidence illumination method and the polarized illumination method in which the linear polarization is effected in a tangential (circumferential) direction of a circle having a center of the optical axis as disclosed in Japanese Patent Application Laid-open No. 6-53120 as well as the linear polarized illumination (S-polarized illumination) adjusted to the longitudinal direction of the line pattern of the mask (reticle). In particular, when the pattern of the mask (reticle) includes not only the line pattern which extends in a predetermined one direction but the pattern also includes line patterns which extend in a plurality of different directions in a mixed manner, then the high image formation performance can be obtained even when the numerical aperture NA of the projection optical system is large, by using, in combination, the zonal illumination method and the polarized illumination method in which the linear polarization is effected in a tangential direction of a circle having a center of the optical axis as disclosed in Japanese Patent Application Laid-open No. 6-53120 as well.

In the embodiments of the present invention, the optical element 2 is attached to the end portion of the projection optical system PL. The lens can be used to adjust the optical characteristics of the projection optical system PL, including, for example, the aberration (for example, spherical aberration and comatic aberration). The optical element, which is attached to the end portion of the projection optical system PL, may be an optical plate to be used to adjust the optical characteristic of the projection optical system PL. Alternatively, the optical element may be a plane parallel plate through which the exposure light beam EL is transmissive. When the optical element to make contact with the liquid LQ is the plane parallel plate which is cheaper than the lens, it is enough that the plane parallel plate is merely exchanged immediately before supplying the liquid LQ even when any substance (for example, any silicon-based organic matter), which deteriorates the transmittance of the projection optical system PL, the illuminance of the exposure light beam EL on the substrate P, and the uniformity of the illuminance distribution, is adhered to the plane parallel plate, for example, during the transport, the assembling, and/or the adjustment of the exposure apparatus EX. An advantage is obtained such that the exchange cost is lowered as compared with the case in which the optical element to make contact with the liquid LQ is the lens. That is, the surface of the optical element to make contact with the liquid LQ is dirtied, for example, due to the adhesion of scattered particles generated from the resist by being irradiated with the exposure light beam EL or any impurity contained in the liquid LQ. Therefore, it is necessary to periodically exchange the optical element. However, when the optical element is the cheap plane parallel plate, then the cost of the exchange part is low as compared with the lens, and it is possible to shorten the time required for the exchange. Thus, it is possible to suppress the increase in the maintenance cost (running cost) and the decrease in the throughput.

When the pressure, which is generated by the flow of the liquid LQ, is large between the substrate P and the optical element disposed at the end portion of the projection optical system PL, it is also allowable that the optical element is tightly fixed so that the optical element is not moved by the pressure, rather than allowing the optical element to be exchangeable.

Each of the embodiments of the present invention is constructed such that the space between the projection optical system PL and the surface of the substrate P is filled with the liquid LQ. However, for example, another arrangement may be adopted such that the space is filled with the liquid LQ in a state in which a cover glass constructed of a plane parallel plate is attached to the surface of the substrate P.

The exposure apparatus, to which the liquid immersion method is applied as described above, is constructed such that the optical path space, which is disposed on the light-outgoing side of the terminal end optical element 2 of the projection optical system PL, is filled with the liquid (pure water) to expose the substrate P. However, as disclosed in International Publication No. 2004/019128, it is also allowable that the optical path space, which is disposed on the light-incoming side of the terminal end optical element 2 of the projection optical system PL, is filled with the liquid (pure water). In this arrangement, it is also allowable that the pressure of the liquid, which is provided in the optical path space disposed on the light-incoming side of the terminal end optical element 2 of the projection optical system PL, is adjusted in the same manner as in the embodiment described above. Further, the optical path space can be filled with the liquid quickly and satisfactorily by starting the supply of the liquid while discharging the gas from the optical path space disposed on the light-incoming side of the terminal end optical element 2 of the projection optical system PL.

The liquid LQ is water in the embodiments of the present invention. However, the liquid LQ may be any liquid other than water. For example, when the light source of the exposure light beam EL is the $F_2$ laser, the $F_2$ laser beam is not transmitted through water. Therefore, in this case, liquids preferably usable as the liquid LQ may include, for example, a fluorine-based fluid such as fluorine-based oil and perfluoropolyether (PFPE) through which the $F_2$ laser beam is transmissive. In this case, the portion to make contact with the liquid LQ is subjected to the liquid-attracting treatment by forming a thin film, for example, with a substance having a molecular structure of small polarity including fluorine. Alternatively, other than the above, it is also possible to use, as the liquid LQ, those (for example, cedar oil) which have the transmittance with respect to the exposure light beam EL, which have the refractive index as high as possible, and which are stable against the photoresist coated on the surface of the substrate P and the projection optical system PL. Also in this case, the surface treatment is performed depending on the polarity of the liquid LQ to be used. In place of pure water as the liquid LQ, it is also possible to use various fluids having desired refractive indexes, including, for example, a supercritical fluid and a gas having a high refractive index.

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic quartz, silicon wafer) for the mask or the reticle to be used for the exposure apparatus.

As for the exposure apparatus EX, the present invention is also applicable to the scanning type exposure apparatus (scanning stepper) based on the step-and-scan system for performing the scanning exposure with the pattern of the mask M by synchronously moving the mask M and the substrate P as well as the projection exposure apparatus (stepper) based on the step-and-repeat system for performing the full field exposure with the pattern of the mask M in a state in which the mask M and the substrate P are allowed to stand still, while successively step-moving the substrate P. The present invention is also applicable to the exposure apparatus based on the step-and-stitch system in which at least two patterns are partially overlaid and transferred on the substrate P.

The present invention is also applicable to a twin-stage type exposure apparatus which is provided with two stages capable of moving independently in the XY direction while separately placing processing objective substrates such as wafers. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference within a range of permission of the domestic laws and ordinances of the state designated or selected in this international application.

The embodiments described above adopt the exposure apparatus in which the space between the projection optical system PL and the substrate P is locally filled with the liquid. However, the present invention is also applicable to a liquid immersion exposure apparatus in which the entire surface of the substrate as the exposure objective is covered with the liquid. The structure and the exposure operation of the liquid immersion exposure apparatus in which the entire surface of the substrate as the exposure objective is covered with the liquid are described in detail, for example, in Japanese Patent Application Laid-open Nos. 6-124873 and 10-303114 and U.S. Pat. No. 5,825,043, contents of which are incorporated herein by reference within a range of permission of the domestic laws and ordinances of the state designated or selected in this international application.

Various types of projection optical systems can be used as the projection optical system provided to the exposure apparatus. For example, it is also allowable to use the projection optical system of the catadioptric type including the catoptric element and the dioptric element. Alternatively, it is also allowable to use the projection optical system of the catoptric type including only the catoptric element. The present invention is also applicable to the exposure apparatus of the type having no projection optical system, for example, the proximity type exposure apparatus.

In the embodiments described above, the focus/leveling-detecting system is adopted, which detects the surface position information about the surface of the substrate P through the liquid LQ. However, it is also allowable to adopt another focus/leveling-detecting system which detects the surface position information about the surface of the substrate P before the exposure or during the exposure not through the liquid.

In the specified embodiments described above, the optical element 2, which is disposed at the end portion of the projection optical system PL, is arranged in the opening 70B (light-transmitting section) of the flow passage-forming member 70 while allowing the predetermined distance intervening therebetween. However, it is also allowable to install an arbitrary optical element to the opening 70B of the flow passage-forming member 70. That is, the optical element 2 and the optical plate as described above may be held by the flow passage-forming member 70. Also in this arrangement, it is desirable that the projection optical system PL and the flow passage-forming member 70 are supported by distinct support structures in view of the prevention from the transmission of the vibration.

The present invention is also applicable to an exposure apparatus provided with an exposure stage which is movable while holding a processing objective substrate such as a wafer, and a measuring stage which is provided with various reference members and measuring members such as measuring sensors. In this arrangement, at least a part or parts of the reference members and/or the various measuring sensors arranged on the substrate stage PST in the embodiment described above can be arranged on the measuring stage. The exposure apparatus, which is provided with the exposure stage and the measuring stage, is described, for example, in Japanese Patent Application Laid-open No. 11-135400, contents of which are incorporated herein by reference within a range of permission of the domestic laws and ordinances of the state designated or selected in this international application.

As for the type of the exposure apparatus EX, the present invention is not limited to the exposure apparatus for the semiconductor device production for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118, contents of which are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by the electromagnetic force. In this arrangement, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475), contents of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224), contents of which are incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 17:
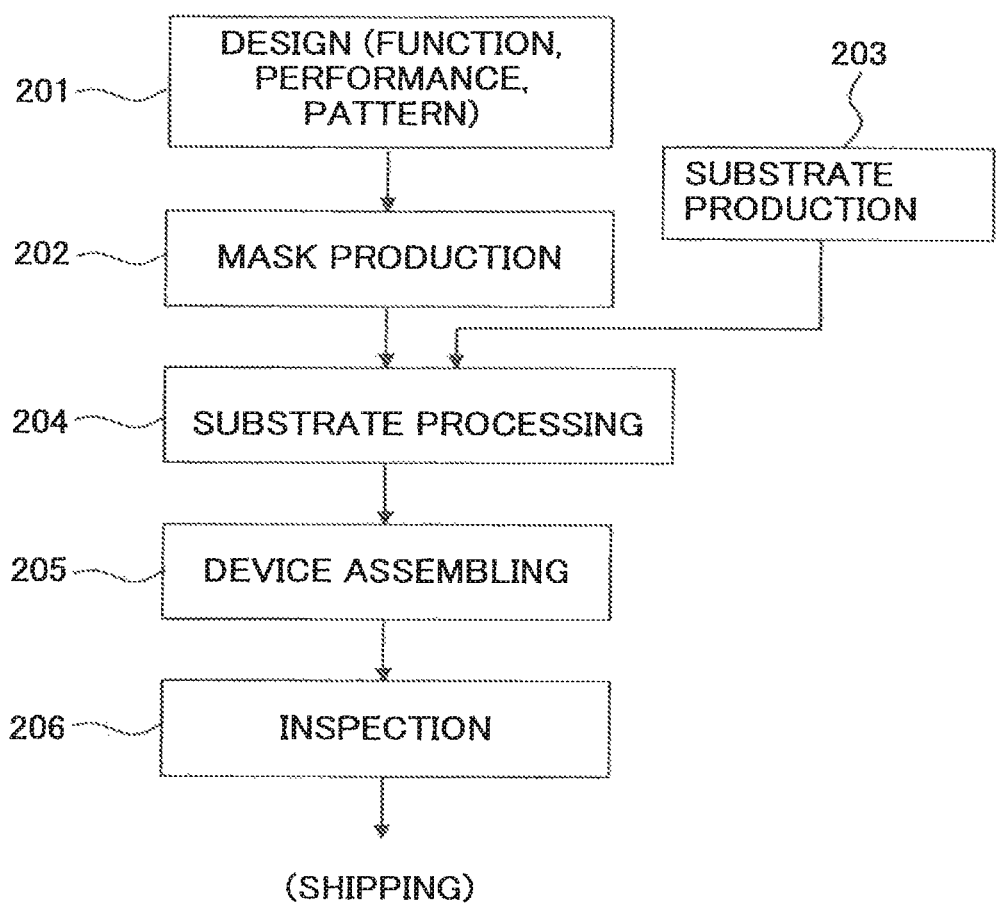
FIG. 17 shows a flow chart illustrating exemplary steps of producing a semiconductor device.

As shown in FIG. 17, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EX of the embodiment described above, a step 205 of assembling the device (including a dicing step, a bonding step, and a packaging step), and an inspection step 206.

INDUSTRIAL APPLICABILITY

According to the present invention, it is possible to suppress any harmful influence which would be otherwise exerted by the pressure of the liquid supplied onto the substrate. The present invention avoids the appearance of any gas region in the liquid supplied onto the substrate. Further, no liquid leakage occurs even in the case of the interruption of the electric power supply such as the power failure, owing to the provision of the first and second liquid recovery mechanisms. Further, the velocity of movement is adjusted so that the liquid does not leak from the liquid immersion area during the movement of the substrate and the substrate stage. Therefore, it is possible to satisfactorily form the liquid immersion area, and it is possible to obtain the high exposure accuracy and the high measurement accuracy. Accordingly, it is possible to produce the device having the desired performance.

The invention claimed is:

1. A liquid immersion exposure apparatus comprising:
a projection system having a final optical element; and
a liquid-immersion-area-forming-member having an opening through which an exposure light is projected, the-liquid-immersion-area-forming-member having a first liquid supply inlet facing downward, a second liquid supply inlet provided opposite to an outer surface of the final optical element, and a first removal outlet facing downward,
wherein:
a liquid immersion area is formed on a portion of an upper surface of a substrate while performing a liquid supply via the first liquid supply inlet to a gap between the liquid-immersion-area-forming-member and the upper surface of the substrate, a liquid supply via the second liquid supply inlet to a gap between the liquid-immersion-area-forming-member and the final optical element and a liquid removal via the first removal outlet from the gap between the liquid-immersion-area-forming-member and the upper surface of the substrate,
the opening of the liquid-immersion-area-forming-member is configured to allow liquid to move through the opening, and
the substrate is exposed with the exposure light through liquid in the liquid immersion area formed on the upper surface of the substrate.

2. The apparatus according to claim 1, wherein the liquid-immersion-area-forming-member has a second removal outlet arranged farther away from the first removal outlet with respect to the opening.

3. The apparatus according to claim 1, wherein the liquid-immersion-area-forming-member has a second removal outlet, the first removal outlet being provided between the first liquid supply inlet and the second removal outlet.

4. The apparatus according to claim 1, further comprising a movable apparatus on which the substrate is held, wherein the movable apparatus is provided with an upper surface arranged such that the upper surface of the substrate and the upper surface of the movable apparatus are substantially flush with each other.

5. The apparatus according to claim 4, wherein the movable apparatus is provided with a reference member having an upper surface which is substantially flush with the upper surface of the movable apparatus.

6. The apparatus according to claim 1, further comprising a movable apparatus on which the substrate is held, wherein the movable apparatus is provided with an upper surface having a liquid repellent property.

7. The apparatus according to claim 6, wherein the upper surface of the movable apparatus is arranged such that the upper surface of the substrate and the upper surface of the movable apparatus are substantially flush with each other.

8. The apparatus according to claim 7, wherein the movable apparatus is provided with a reference member having an upper surface which is substantially flush with the upper surface of the movable apparatus.

9. The apparatus according to claim 6, wherein the liquid repellent property is provided by a treatment which includes a coating of a liquid repellent material or a sticking of a thin film of the liquid repellent material.

10. The apparatus according to claim 1, wherein the first liquid supply inlet is provided between the opening and the first removal outlet.

11. The apparatus according to claim 1, wherein the first liquid supply inlet is provided closer to the opening than the first removal outlet.

12. The apparatus according to claim 1, wherein the liquid removal includes suctioning the liquid via the first removal outlet.

13. The apparatus according to claim 1, wherein the outer surface of the final optical element includes a liquid repellent surface.

14. The apparatus according to claim 1, wherein the liquid supply via the first liquid supply inlet and the liquid supply via the second liquid supply inlet are performed during exposure in which the exposure light is projected onto the upper surface of the substrate.

15. The apparatus according to claim 1, wherein the liquid-immersion-area-forming-member has a lower surface in which a recess is formed, and the first removal outlet is provided around the recess.

16. The apparatus according to claim 1, further comprising a separator provided downstream of the first removal outlet, which separates one of the liquid and gas removed via the first removal outlet from the other.

17. The apparatus according to claim 1, further comprising:
a movable apparatus on which the substrate is held; and
an optical sensor which receives light from the projection system via liquid under the projection system,
wherein the optical sensor has an optical member provided at the movable apparatus.

18. The apparatus according to claim 17, wherein the optical member has a transmissive portion which allows the light from the projection system to pass.

19. A device manufacturing method comprising:
exposing a substrate using the exposure apparatus defined in claim 1, and
processing the exposed substrate.

20. A liquid immersion exposure method comprising:
performing a liquid supply via a first liquid supply inlet of a liquid-immersion-area-forming-member to a gap between the liquid-immersion-area-forming-member and an upper surface of a substrate to form a liquid immersion area on a portion of the upper surface of the substrate;
performing a liquid supply via a second liquid supply inlet of the liquid-immersion-area-forming-member to a gap between the liquid-immersion-area-forming-member and a final optical element of a projection system;
performing a liquid removal via a first removal outlet of the liquid-immersion-area-forming-member from the gap between the liquid-immersion-area-forming-member and the upper surface of the substrate to form the liquid immersion area on a portion of the upper surface of the substrate; and
exposing the substrate with an exposure light from the projection system via an opening of the-liquid-immersion-area-forming-member through the liquid in the liquid immersion area, wherein
the first liquid supply inlet faces downward,
the second liquid supply inlet is provided opposite to an outer surface of the final optical element, and
the opening is configured to allow liquid to move through the opening.

21. The method according to claim 20, further comprising performing suction via a second removal outlet of the liquid-immersion-area-forming-member, the second removal outlet being arranged farther away from the first removal outlet with respect to the opening.

22. The method according to claim 20, further comprising performing suction via a second removal outlet of the liquid-immersion-area-forming-member, the first removal outlet being provided between the first liquid supply inlet and the second removal outlet.

23. The method according to claim 20, wherein the substrate is held on a movable apparatus, and wherein the movable apparatus is provided with an upper surface arranged such that the upper surface of the substrate and the upper surface of the movable apparatus are substantially flush with each other.

24. The method according to claim 23, wherein the movable apparatus is provided with a reference member having an upper surface which is substantially flush with the upper surface of the movable apparatus.

25. The method according to claim 20, wherein the substrate is held on a movable apparatus, and wherein the movable apparatus is provided with an upper surface having a liquid repellent property.

26. The method according to claim 25, wherein the upper surface of the movable apparatus is arranged such that the upper surface of the substrate and the upper surface of the movable apparatus are substantially flush with each other.

27. The method according to claim 26, wherein the movable apparatus is provided with a reference member having an upper surface which is substantially flush with the upper surface of the movable apparatus.

28. The method according to claim 25, wherein the liquid repellent property is provided by a treatment which includes a coating of a liquid repellent material or a sticking of a thin film of the liquid repellent material.

29. The method according to claim 20, wherein the first liquid supply inlet is provided between the opening and the first removal outlet.

30. The method according to claim 20, wherein the first liquid supply inlet is provided closer to the opening than the first removal outlet.

31. The method according to claim 20, wherein the liquid removal includes suctioning the liquid via the first removal outlet.

32. The method according to claim 20, wherein the outer surface of the final optical element includes a liquid repellent surface.

33. The method according to claim 20, wherein the liquid supply via the first liquid supply inlet and the liquid supply via the second liquid supply inlet are performed during exposure in which the exposure light is projected onto the upper surface of the substrate.

34. The method according to claim 20, wherein the liquid-immersion-area- forming-member has a lower surface in which a recess is formed, and the first removal outlet is provided around the recess.

35. The method according to claim 20, further comprising separating one of the liquid and gas removed via the first removal outlet from the other.

36. The method according to claim 20, further comprising receiving light from the projection system via liquid under the projection system by an optical sensor,
wherein the substrate is held on a movable apparatus, and
wherein the optical sensor has an optical member provided at the movable apparatus.

37. The method according to claim 36, wherein the optical member has a transmissive portion which allows the light from the projection system to pass.

38. A device manufacturing method comprising:
exposing a substrate using the exposure method defined in claim 20, and
processing the exposed substrate.

* * * * *